(12) United States Patent
Nagao et al.

(10) Patent No.: US 12,107,129 B2
(45) Date of Patent: *Oct. 1, 2024

(54) SELF-STANDING GaN SUBSTRATE, GaN CRYSTAL, METHOD FOR PRODUCING GaN SINGLE CRYSTAL, AND METHOD FOR PRODUCING SEMICONDUCTOR DEVICE

(71) Applicant: Mitsubishi Chemical Corporation, Tokyo (JP)

(72) Inventors: Satoru Nagao, Ushiku (JP); Yusuke Tsukada, Ushiku (JP); Kazunori Kamada, Ushiku (JP); Shuichi Kubo, Ushiku (JP); Hirotaka Ikeda, Ushiku (JP); Kenji Fujito, Ushiku (JP); Hideo Fujisawa, Ushiku (JP); Yutaka Mikawa, Ushiku (JP); Tae Mochizuki, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/302,378

(22) Filed: Apr. 18, 2023

(65) Prior Publication Data

US 2023/0253461 A1 Aug. 10, 2023

Related U.S. Application Data

(60) Continuation of application No. 17/238,468, filed on Apr. 23, 2021, now Pat. No. 11,664,428, which is a
(Continued)

(30) Foreign Application Priority Data

Aug. 8, 2013 (JP) .................................. 2013-165293
Jan. 17, 2014 (JP) .................................. 2014-006907
(Continued)

(51) Int. Cl.
*C30B 25/20* (2006.01)
*C30B 7/10* (2006.01)
(Continued)

(52) U.S. Cl.
CPC .......... *H01L 29/2003* (2013.01); *C30B 7/105* (2013.01); *C30B 25/186* (2013.01);
(Continued)

(58) Field of Classification Search
CPC ....... C30B 7/105; C30B 25/186; C30B 25/20; C30B 23/025; H01L 29/2003; H01L 21/02389; H01L 21/0254
See application file for complete search history.

(56) References Cited

U.S. PATENT DOCUMENTS 7,033,436 B2 4/2006 Biwa et al.
9,829,778 B2 11/2017 Raring et al.
(Continued)

FOREIGN PATENT DOCUMENTS

CN 101522962 A 9/2009
CN 102011191 A 4/2011
(Continued)

OTHER PUBLICATIONS

English Translation of International Search Raport issued Oct. 28, 2014 in PCT/JP2014/070919, filed Aug. 7, 2014.
(Continued)

*Primary Examiner* — Robert M Kunemund
(74) *Attorney, Agent, or Firm* — Oblon, McClelland, Maier & Neustadt, L.L.P.

(57) ABSTRACT

An object is to provide a nonpolar or semipolar GaN substrate having improved size and crystal quality. A self-standing GaN substrate has an angle between the normal of the principal surface and an m-axis of 0 degrees or more and 20 degrees or less, wherein: the size of the projected image
(Continued)

in a c-axis direction when the principal surface is vertically projected on an M-plane is 10 mm or more; and when an a-axis length is measured on an intersection line between the principal surface and an A-plane, a low distortion section with a section length of 6 mm or more and with an a-axis length variation within the section of $10.0 \times 10^{-5}$ Å or less is observed.

21 Claims, 41 Drawing Sheets

Related U.S. Application Data division of application No. 16/574,224, filed on Sep. 18, 2019, now Pat. No. 11,031,475, which is a continuation of application No. 15/016,409, filed on Feb. 5, 2016, now Pat. No. 10,475,887, which is a continuation of application No. PCT/JP2014/070919, filed on Aug. 7, 2014.

(30) Foreign Application Priority Data

| Feb. 28, 2014 | (JP) | ................................ | 2014-038722 |
| Apr. 24, 2014 | (JP) | ................................ | 2014-090535 |
| May 20, 2014 | (JP) | ................................ | 2014-104383 |
| Jun. 13, 2014 | (JP) | ................................ | 2014-122520 |

(51) Int. Cl.

| C30B 25/18 | (2006.01) |
| C30B 29/40 | (2006.01) |
| H01L 21/02 | (2006.01) |
| H01L 29/20 | (2006.01) |
| C30B 23/02 | (2006.01) |

(52) U.S. Cl.
CPC ............ *C30B 25/20* (2013.01); *C30B 29/406* (2013.01); *H01L 21/02389* (2013.01); *H01L 21/0254* (2013.01); *C30B 23/025* (2013.01)

(56) References Cited

U.S. PATENT DOCUMENTS

| 10,066,319 | B2 | 9/2018 | Tsukada et al. | |
| 10,475,887 | B2 * | 11/2019 | Nagao | ...................... C30B 7/105 |
| 11,031,475 | B2 * | 6/2021 | Nagao | ...................... C30B 25/20 |
| 11,038,024 | B2 | 6/2021 | Nagao | |
| 11,664,428 | B2 * | 5/2023 | Nagao | ................. H01L 29/2003 |
| | | | | 117/88 |
| 2004/0187766 | A1 | 9/2004 | Letertre | |
| 2004/0244680 | A1 | 12/2004 | Dwilinski et al. | |
| 2004/0245535 | A1 | 12/2004 | D'Evelyn et al. | |
| 2005/0087124 | A1 | 4/2005 | Dwilinski et al. | |
| 2005/0214992 | A1 | 9/2005 | Chakraborty et al. | |
| 2007/0261633 | A1 | 11/2007 | Tanaka | |
| 2007/0290228 | A1 | 12/2007 | Yoshida | |
| 2008/0081015 | A1 | 4/2008 | Sarayama et al. | |
| 2009/0236694 | A1 | 9/2009 | Mizuhara et al. | |
| 2010/0104495 | A1 | 4/2010 | Kawabata et al. | |
| 2010/0233866 | A1 | 9/2010 | Akiyama et al. | |
| 2011/0057197 | A1 | 3/2011 | Fujiwara et al. | |
| 2011/0248281 | A1 | 10/2011 | Oshima et al. | |
| 2012/0034763 | A1 | 2/2012 | Osada et al. | |
| 2012/0074403 | A1 | 3/2012 | Fujiwara et al. | |
| 2012/0112320 | A1 | 5/2012 | Kubo et al. | |
| 2012/0237431 | A1 | 9/2012 | Mikawa et al. | |
| 2012/0282443 | A1 | 11/2012 | Fujito et al. | |
| 2012/0315445 | A1 | 12/2012 | Mizuhara et al. | |
| 2012/0329245 | A1 | 12/2012 | Uematsu et al. | |
| 2013/0313567 | A1 | 1/2013 | Furuya et al. | |
| 2013/0065036 | A1 | 3/2013 | Hayashi et al. | |
| 2013/0069078 | A1 | 3/2013 | Sarayama et al. | |
| 2013/0108537 | A1 | 5/2013 | Mikawa et al. | |
| 2013/0160699 | A1 | 6/2013 | Mizuhara et al. | |
| 2013/0284160 | A1 | 10/2013 | Uchida et al. | |
| 2013/0337632 | A1 | 12/2013 | Uematsu et al. | |
| 2014/0035103 | A1 | 2/2014 | Matsumoto et al. | |
| 2014/0175616 | A1 | 6/2014 | Mizuhara et al. | |
| 2014/0369920 | A1 | 12/2014 | Uematsu et al. | |

FOREIGN PATENT DOCUMENTS

| CN | 102666945 A | 9/2012 |
| CN | 103348044 A | 10/2013 |
| CN | 103456593 A | 12/2013 |
| DE | 10 2007 021 944 A1 | 12/2007 |
| EP | 2 439 316 A1 | 5/2010 |
| EP | 2 514 858 A1 | 10/2012 |
| EP | 2 832 901 A1 | 2/2015 |
| JP | 2004-530306 A | 9/2004 |
| JP | 2006-315947 | 11/2006 |
| JP | 2007-217216 A | 8/2007 |
| JP | 2007-220899 A | 8/2007 |
| JP | 2007-534159 A | 11/2007 |
| JP | 2007-331973 | 12/2007 |
| JP | 2008-91837 | 4/2008 |
| JP | 2008-110910 | 5/2008 |
| JP | 2008-143772 | 6/2008 |
| JP | 2009-18971 | 1/2009 |
| JP | 2010-275171 | 12/2010 |
| JP | 2011-16676 | 1/2011 |
| JP | 2011-26181 | 2/2011 |
| JP | 2011-63504 | 3/2011 |
| JP | 2011-129752 | 6/2011 |
| JP | 2011-176322 A | 9/2011 |
| JP | 2012-51746 | 3/2012 |
| JP | 2012-66983 A | 4/2012 |
| JP | 2012-138543 A | 7/2012 |
| JP | 2012-197218 | 10/2012 |
| JP | 2012-231103 | 11/2012 |
| JP | 2013-35711 | 2/2013 |
| JP | 2013-40059 A | 2/2013 |
| JP | 2013-56820 A | 3/2013 |
| JP | 2013-75791 | 4/2013 |
| JP | 2013-75791 A | 4/2013 |
| JP | 2013-82611 A | 5/2013 |
| JP | 2013-209274 | 10/2013 |
| JP | 2016-44094 A | 4/2016 |
| TW | 200815630 A | 4/2008 |
| TW | 201125163 A | 7/2011 |
| WO | WO 02/101121 A1 | 12/2002 |
| WO | WO 02/101125 A1 | 12/2002 |
| WO | WO 2005/050707 A3 | 6/2005 |
| WO | WO 2011/065436 A1 | 6/2011 |
| WO | WO 2011/087061 A1 | 7/2011 |

OTHER PUBLICATIONS

English Translation of International Search Report issued Mar. 3, 2015 in PCT/JP2014/082859, filed Dec. 11, 2014.

Hyun-Jae lee et al. "Self-Separated Freestanding GaN Using a N H 4 Cl Interlayer", Applied Physics Letters, vol. 91, 192108, 2007, 4 pages.

Po Shan Hsu et al. "Stress Relaxation and Critical Thickness for Misfit Dislocation Formation in (100) and (30) InGaN/GaN Heteroepitaxy", Applied Physics Letters, vol. 100, 171917, 2012, 5 pages.

English translation of International Preliminary Report on Patentability and Written Opinion issued Feb. 18, 2016 in PCT/JP2014/070919.

Notification of Transmittal of Translation of the International Preliminary Report on Patentability filed in PCT/JP2014/082859, dated Jul. 28, 2016, and Written Opinion of the International Searching Authority.

Ofice Action mailed Dec. 12, 2017 in related U.S. Appl. No. 15/210,150.

Extended European Search Report issued Jun. 14, 2016 in Patent Application No. 14834101.9.

(56) References Cited

OTHER PUBLICATIONS

Chinese Office Action issued on Aug. 1, 2018 in Patent Application No. 201480073300.0 (with English translation), 25 pages.
Office Action issued Jul. 4, 2017 in Japanese Patent Application No. 2014-168566 (with unedited computer generated English translation).
Combined Chinese Office Action and Search Report issued Dec. 4, 2017 in Chinese Patent Application No. 201480073300.0 (with unedited computer generated English translation), 29 pages.
Combined Office Action and Search Report issued Dec. 14, 2017 in Taiwanese Patent Application No. 103127186 (with English language translation) , 7 pages.
Extended European Search Report issued Mar. 29, 2018 in Patent Application No. 17194202.2, 8 pages.
Combined Office Action and Search Report issued Apr. 12, 2018 in Taiwanese Patent Application No. 103143621 (with English language translation of Office Action and English translation of categories of cited documents), 10 pages.
Sumiya, et al., "Review of Polarity Determination and Control of GaN", MRS Internet J. Nitride Semicond. Res. 9, 1 (2004) The Material sResearch Society (Year, 2004).
Office Action issued Oct. 16, 2018 in Japanese Patent Application No. 2015-557739, 6 pages (with unedited computer generated English translation).
Japanese Office Action issued Dec. 18, 2018 in Japanese Patent Application No. 2018-056344 (with unedited computer generated English translation), 8 pages.
Office Action Issued Mar. 5, 2019, in Taiwanese Patent Application No. 107130360 filed Aug. 7, 2014 (with English translation).
Pimputkar, et al., Surface Morphology study of basic ammonothermal GaN grown on non-polar GaN seed crystals of varying surface orientations from m-plane to a-plane, Journal of Crystal Growth, 368, pp. 67-71 (2013); Jan. 23, 2013 (year:2013).
Bliss, et al., Ammonothermal GaN: Morphology and properties, Journal of Crystal Growth 312, pp. 1069-1073 (2010); Dec. 11, 2009 (Year: 2009).
Office Action mailed Oct. 2, 2019 in U.S. Appl. No. 16/034,953, 16 pages.
European Office Action Issued on Jun. 26, 2020 in Patent Application No. 17 194 202.2, 8 pages.
Combined Taiwanese Office Action and Search Report issued Sep. 1, 2020 in Patent Application No. 108140117 (with English language translation), 14 pages.
Taiwanese Office Action issued Jun. 22, 2021 in Taiwanese Patent Application No. 108140117 (with unedited computer generated English translation), 6 pages.
European Search Report issued Sep. 6, 2021 in European Patent Application No. 17 194 202.2, 5 pages.

\* cited by examiner

SELF-STANDING GaN SUBSTRATE, GaN CRYSTAL, METHOD FOR PRODUCING GaN SINGLE CRYSTAL, AND METHOD FOR PRODUCING SEMICONDUCTOR DEVICE

CROSS-REFERENCE TO RELATED APPLICATION

This is a continuation application of U.S. Application Ser. No. 17/238,468, filed on April 23, 2021, now U.S. Pat. No. 11,664,428, U.S. Application Ser. No. 17/238,468 is a divisional application of U.S. Application Ser. No. 16/574,224, now U.S. Patent 11.031.475, filed on September 18, 2019. U.S. application Ser. No. 16/574,224 is a continuation application of U.S. Application Ser. No. 15/016,409, now U.S. Patent 10.475.887, filed on Feb. 5, 2016. U.S. Application Ser. No. 15/016,409 is a continuation of International Application PCT/JP2014/070919, filed on Aug. 7, 2014, and designated the U.S., (and claims priority from Japanese Patent Application 2013-165293 which was filed on Aug. 8, 2013, Japanese Patent Application 2014-006907 which was filed on Jan. 17, 2014, Japanese Patent Application 2014-038722 which was filed on Feb. 28, 2014, Japanese Patent Application 2014-090535 which was filed on Apr. 24, 2014, Japanese Patent Application 2014-104383 which was filed on May 20, 2014, and Japanese Patent Application 2014-122520 which was filed on Jun. 13, 2014). The entire contents of all of the above applications are incorporated herein by reference.

TECHNICAL FIELD

The present invention mainly relates to a nonpolar or semipolar self-standing GaN (gallium nitride) substrate.

A bar-shaped nonpolar or semipolar GaN substrate can be obtained by growing a GaN crystal along a c-axis on a 2 inch-diameter C-plane GaN template using an HVPE (Hydride Vapor Phase Epitaxy) method and slicing the GaN crystal so that a nonpolar or semipolar face becomes a principal surface (Patent Document 1). Furthermore, a plate-like nonpolar or semipolar GaN substrate can be fabricated from a GaN crystal vapor phase grown using a plurality of the bar-shaped GaN substrate arranged side by side as a seed (Patent Documents 1 to 3).

A method of fabricating an M-plane GaN substrate by slicing a hexagonal prism shape GaN crystal grown by a flux method and a method of using the M-plane GaN substrate as a seed to grow a bulk GaN crystal by an HVPE method and fabricating an M-plane GaN substrate by slicing the bulk GaN crystal are proposed (Patent Document 4). According to an HVPE method, a GaN crystal can be grown at a rate 100 times faster than a flux method.

A self-standing GaN substrate obtained by separating a GaN crystal grown by an HVPE method on a C-plane sapphire substrate on which a "void buffer layer" is formed from the sapphire substrate has been reported to have an a-axis length (also referred to as an a-axis lattice constant, an a-plane spacing, and the like) and a c-axis length (also referred to as a c-axis lattice constant, a c-plane spacing, and the like) of 3.189 Å and 5.185 Å, respectively (Non-patent Document 1).

It has been reported that, after subjecting a GaN crystal grown by an HVPE method on a C-plane GaN/sapphire template and having a c-axis direction size of 3.5 mm to heat treatment at 1300° C. for 6 hours, an a-axis length (an A-plane spacing) thereof was measured to be within a range of 3.18915 to 3.18920 Å over 3 mm in a c-axis direction (Patent Document 5).

[Patent Document 1] Japanese Patent Application Laid-open No. 2006-315947
[Patent Document 2] Japanese Patent Application Laid-open No. 2008-143772
[Patent Document 3] Japanese Patent Application Laid-open No. 2011-26181
[Patent Document 4] Japanese Patent Application Laid-open No. 2008-110910
[Patent Document 5] Japanese Patent Application Laid-open No. 2012-231103
[Non-patent Document 1] Hyun-Jae Lee, S. W. Lee, H. Goto, Sang-Hyun Lee, Hyo-Jong Lee, J. S. Ha, Takenari Goto, M. W. Cho, and T. Yao, Applied Physics Letters 91, 192108 (2007)
[Non-patent Document 2] Po Shan Hsu, Matthew T. Hardy, Erin C. Young, Alexey E. Romanov, Steven P. DenBaars, Shuji Nakamura, and James S. Speck, Applied Physics Letters 100, 171917 (2012)

DISCLOSURE OF THE INVENTION

Improvements to nitride semiconductor devices made by using a self-standing nonpolar or semipolar GaN substrate are anticipated (Non-patent Document 2). A nitride semiconductor is also referred to as a GaN-based semiconductor, a group III nitride-based compound semiconductor, a nitride-based group III-V compound semiconductor, and the like and, in addition to including GaN (gallium nitride), includes a compound in which a part of or all of Ga in GaN is replaced with another element belonging to the thirteenth group in the periodic table (B, Al, or In). Examples include AlN, InN, AlGaN, AlInN, GaInN, and AlGaInN.

Among nonpolar or semipolar GaN substrates, a (10-10) substrate, a (20-21) substrate, a (20-2-1) substrate, a (30-31) substrate, and a (30-3-1) substrate are particularly useful. The (10-10) substrate (M-plane substrate) is a nonpolar substrate, while the (20-21) substrate, the (20-2-1) substrate, the (30-31) substrate, and the (30-3-1) substrate are semipolar substrates.

A main object of the present invention is to provide a self-standing nonpolar or semipolar GaN substrate having improved size and crystal quality.

The following inventions related to a self-standing GaN substrate, a crystal, a manufacturing method of a GaN single crystal, a manufacturing method of a semiconductor device, and the like are provided.

(1) A self-standing GaN substrate with an angle between the normal of the principal surface and an m-axis of 0 degrees or more and 20 degrees or less, wherein: the size of the projected image in a c-axis direction when the principal surface is vertically projected on an M-plane is 10 mm or more; and a low distortion section with a section length of 6 mm or more and with an a-axis length variation within the section of $10.0 \times 10^{-5}$ Å or less is observed when an a-axis length is measured on a line of intersection between the principal surface and an A-plane.

(2) The self-standing GaN substrate according to (1) above, wherein the size of the projected image in a c-axis direction is 15 mm or more, and the low distortion section has a section length of 8 mm or more and an a-axis length variation within the section of $10.0 \times 10^{-5}$ Å or less.

(3) The self-standing GaN substrate according to (2) above, wherein the low distortion section has a section length of 10 mm or more and an a-axis length variation within the section of $10.0 \times 10^{-5}$ Å or less.

(4) The self-standing GaN substrate according to (2) above, wherein the low distortion section has a section length of 10 mm or more and an a-axis length variation within the section of $8.0 \times 10^{-5}$ Å or less.

(5) The self-standing GaN substrate according to any one of (1) to (4) above, wherein a c-axis length variation in the low distortion section is $3.0 \times 10^{-4}$ Å or less.

(6) The self-standing GaN substrate according to any one of (1) to (5) above, wherein an X-ray rocking curve full-width at half-maximum of a (300) plane in the low distortion section is less than 100 arcsec.

(7) The self-standing GaN substrate according to any one of (1) to (6) above, wherein a variation width of an X-ray rocking curve full-width at half-maximum of the (300) plane in the low distortion section is less than 20 arcsec.

(8) A self-standing GaN substrate with an angle between the normal of the principal surface and an m-axis of 0 degrees or more and 20 degrees or less, having an defect increasing zone extending in a direction intersecting an A-plane on the principal surface, wherein: the size of the projected image in a c-axis direction when the principal surface is vertically projected on an M-plane is 10 mm or more; and when a region excluding a portion at a distance of 2 mm or less from a substrate end surface, of the principal surface, is assumed to be an effective region, an a-axis length on a longest intersection line formable by the principal surface and the A-plane in the effective region is within a range expressed as $L_a \pm 5.0 \times 10^{-5}$ Å (where $L_a$ is a value equal to or larger than 3.1885 and smaller than 3.1895) in a portion excluding the defect increasing zone.

(9) The self-standing GaN substrate according to (8) above, wherein a section with a width of less than 2 mm, where an a-axis length is outside the said range, exists in a portion where the longest intersection line traverses the defect increasing zone.

(10) The self-standing GaN substrate according to (8) or (9) above, wherein a c-axis length on the longest intersection line is within a range expressed as $L_c \pm 1.5 \times 10^{-4}$ Å (where $L_c$ is a value equal to or larger than 5.1845 and smaller than 5.1865) in a portion excluding the defect increasing zone.

(11) The self-standing GaN substrate according to any one of (8) to (10) above, wherein an X-ray rocking curve full-width at half-maximum of a (300) plane on the longest intersection line is less than 100 arcsec in a portion excluding the defect increasing zone.

(12) The self-standing GaN substrate according to any one of (8) to (11) above, wherein a variation width of an X-ray rocking curve full-width at half-maximum of a (300) plane on the longest intersection line is less than 20 arcsec in a portion excluding the defect increasing zone.

(13) A self-standing GaN substrate with an angle between the normal of the principal surface and an m-axis of 0 degrees or more and 20 degrees or less, wherein: the size of the projected image in a c-axis direction when the principal surface is vertically projected on an M-plane is 10 mm or more; and when a region excluding a portion at a distance of 2 mm or less from a substrate end surface, of the principal surface, is assumed to be an effective region, an a-axis length on a longest intersection line formable by the principal surface and an A-plane in the effective region is within a range expressed as $L_a \pm 5.0 \times 10^{-5}$ Å (where $L_a$ is a value equal to or larger than 3.1885 and smaller than 3.1895).

(14) The self-standing GaN substrate according to (13) above, wherein a c-axis length on the longest intersection line is within a range expressed as $L_c \pm 1.5 \times 10^{-4}$ Å (where Le is a value equal to or larger than 5.1845 and smaller than 5.1865).

(15) The self-standing GaN substrate according to (13) or (14) above, wherein an X-ray rocking curve full-width at half-maximum of a (300) plane on the longest intersection line is less than 100 arcsec.

(16) The self-standing GaN substrate according to any one of (13) to (15) above, wherein a variation width of an X-ray rocking curve full-width at half-maximum of a (300) plane on the longest intersection line is less than 20 arcsec.

(17) A self-standing GaN substrate with an angle between the normal of the principal surface and an m-axis of 0 degrees or more and 20 degrees or less, having an defect increasing zone extending in a direction intersecting an A-plane on the principal surface, wherein: the size of the projected image in a c-axis direction when the principal surface is vertically projected on an M-plane is 10 mm or more; when a region excluding a portion at a distance of 2 mm or less from a substrate end surface, of the principal surface, is assumed to be an effective region, an X-ray rocking curve full-width at half-maximum of a (300) plane on a longest intersection line formable by the principal surface and the A-plane in the effective region is less than 100 arcsec in a portion excluding the defect increasing zone; and a variation width of the X-ray rocking curve full-width at half-maximum of a (300) plane on the longest intersection line is less than 20 arcsec in a portion excluding the defect increasing zone.

(18) The self-standing GaN substrate according to (17) above, wherein a spot where the X-ray rocking curve full-width at half-maximum of the (300) plane exhibits a prominently high value is comprised in a portion where the longest intersection line traverses the defect increasing zone.

(19) A self-standing GaN substrate with an angle between the normal of the principal surface and an m-axis of 0 degrees or more and 20 degrees or less, wherein: the size of the projected image in a c-axis direction when the principal surface is vertically projected on an M-plane is 10 mm or more; when a region excluding a portion at a distance of 2 mm or less from a substrate end surface, of the principal surface, is assumed to be an effective region, an X-ray rocking curve full-width at half-maximum of a (300) plane on a longest intersection line formable by the principal surface and an A-plane in the effective region is less than 100 arcsec; and a variation width of the X-ray rocking curve full-width at half-maximum of a (300) plane on the longest intersection line is less than 20 arcsec.

(20) The self-standing GaN substrate according to any one of (1) to (19) above, wherein the size of the projected image in an a-axis direction when the principal surface is vertically projected on an M-plane is 30 mm or more.

(21) The self-standing GaN substrate according to (20) above, wherein the size of the projected image in an a-axis direction is 40 mm or more.

(22) The self-standing GaN substrate according to any one of (1) to (21) above, wherein the self-standing GaN substrate comprises a GaN crystal grown by an HVPE method.

(23) The self-standing GaN substrate according to any one of (1) to (22) above, wherein an absorption coefficient at a wavelength of 450 nm is 2 cm$^{-1}$ or less.

(24) The self-standing GaN substrate according to any one of (1) to (7), (13) to (16), and (19) to (21) above, wherein the self-standing GaN substrate contains fluorine.

(25) The self-standing GaN substrate according to any one of (1) to (24) above, wherein alkali metal concentration is lower than $1\times10^{15}$ cm$^{-3}$.

(26) The self-standing GaN substrate according to any one of (1) to (25) above, wherein the self-standing GaN substrate contains a stacking fault.

(27) A crystal comprising GaN, processing of which enables fabrication of the free-standing GaN substrate according to any one of (1) to (26) above.

(28) A manufacturing method of a GaN single crystal, including preparing the self-standing GaN substrate according to any one of (1) to (26) above and epitaxially growing GaN on the self-standing GaN substrate.

(29) A manufacturing method of a GaN single crystal, including growing a first GaN crystal using the self-standing GaN substrate according to any one of (1) to (26) above as a seed, and subsequently growing a second GaN crystal using a part of or all of the first GaN crystal as a seed.

(30) The manufacturing method according to (28) or (29), wherein the manufacturing method is a manufacturing method of a bulk GaN single crystal.

(31) A manufacturing method of a semiconductor device, including preparing the self-standing GaN substrate according to any one of (1) to (26) above and forming a device structure by epitaxially growing one or more types of nitride semiconductors on the self-standing GaN substrate.

(32) A manufacturing method of a GaN layer-bonded substrate, including the steps of: implanting ions in a vicinity of the principal surface of the self-standing GaN substrate according to any one of (1) to (26) above; bonding the principal surface side of the self-standing GaN substrate to a hetero-composition substrate; and forming a GaN layer bonded to the hetero-composition substrate by separating the self-standing GaN substrate at the ion-implanted region as a boundary.

(33) A GaN layer-bonded substrate with a structure in which a GaN layer separated from the self-standing GaN substrate according to any one of (1) to (26) above is bonded to a hetero-composition substrate.

In addition, the following inventions related to a self-standing GaN substrate, a crystal, a method of producing a self-standing GaN substrate, a manufacturing method of a GaN single crystal, a manufacturing method of a semiconductor device, and the like are provided.

(1a) A self-standing GaN substrate with an angle between the normal of the principal surface and an m-axis of 0 degrees or more and 20 degrees or less, wherein the size of the projected image in a c-axis direction when the principal surface is vertically projected on an M-plane is 10 mm or more, and an anomalous transmission image is obtained by transmission X-ray topography.

(2a) The self-standing GaN substrate according to (1a) above, wherein the size of the projected image is a 10 mm square or more.

(3a) The self-standing GaN substrate according to (1a) or (2a) above, wherein the size of the projected image in a c-axis direction is 15 mm or more.

(4a) The self-standing GaN substrate according to any one of (1a) to (3a) above, wherein the size of the projected image in an a-axis direction is 30 mm or more.

(5a) The self-standing GaN substrate according to any one of (1a) to (4a) above, wherein the self-standing GaN substrate comprises a GaN crystal grown by an HVPE method.

(6a) The self-standing GaN substrate according to any one of (1a) to (5a) above, wherein an absorption coefficient at a wavelength of 450 nm is 2 cm$^{-1}$ or less.

(7a) The self-standing GaN substrate according to any one of (1a) to (4a) above, wherein the self-standing GaN substrate contains fluorine.

(8a) The self-standing GaN substrate according to any one of (1a) to (7a) above, wherein alkali metal concentration is lower than $1\times10^{15}$ cm$^{-3}$.

(9a) The self-standing GaN substrate according to any one of (1a) to (8a) above, wherein the self-standing GaN substrate contains a stacking fault.

(10a) A crystal which comprises GaN and which is processed in order to fabricate the self-standing GaN substrate according to any one of (1a) to (9a) above.

(11a) A method of producing the self-standing GaN substrate according to any one of (1a) to (9a) above, the method having an inspection step including transmission X-ray topography using anomalous transmission as a test item, wherein a product in which an unacceptable defect is found in the inspection step is deemed a defective product.

(12a) A manufacturing method of a GaN single crystal, including preparing the self-standing GaN substrate according to any one of (1a) to (9a) above and epitaxially growing GaN on the self-standing GaN substrate.

(13a) A manufacturing method of a GaN single crystal, including growing a first GaN crystal using the self-standing GaN substrate according to any one of (1a) to (9a) above as a seed, and subsequently growing a second GaN crystal using a part of or all of the first GaN crystal as a seed.

(14a) The manufacturing method according to (12a) or (13a), wherein the manufacturing method is a manufacturing method of a bulk GaN single crystal.

(15a) A manufacturing method of a semiconductor device, including preparing the self-standing GaN substrate according to any one of (1a) to (9a) above and forming a device structure by epitaxially growing one or more types of nitride semiconductors on the self-standing GaN substrate.

(16a) A manufacturing method of a GaN layer-bonded substrate, including the steps of: implanting ions in a vicinity of the principal surface of the self-standing GaN substrate according to any one of (1a) to (9a) above; bonding the principal surface side of the self-standing GaN substrate to a hetero-composition substrate; and forming a GaN layer bonded to the hetero-composition substrate by separating the self-standing GaN substrate at the ion-implanted region as a boundary.

(17a) A GaN layer-bonded substrate with a structure in which a GaN layer separated from the self-standing GaN substrate according to any one of (1a) to (9a) above is bonded to a hetero-composition substrate.

Furthermore, the following inventions related to a self-standing GaN substrate, a manufacturing method of a GaN single crystal, a manufacturing method of a semiconductor device, and the like are provided.

(1b) A self-standing GaN substrate with an angle between the normal of the principal surface and an m-axis of 0 degrees or more and 20 degrees or less, wherein: the size of the projected image in a c-axis direction when the principal surface is vertically projected on an M-plane is 10 mm or more; and when a region excluding a portion at a distance of 2 mm or less from a substrate end surface, of the principal surface, is assumed to be an effective region, a dislocation density obtained by dividing a total number of dislocations existing in the effective region by an area of the effective region is less than $4\times10^{5}$ cm$^{-2}$.

(2b) The self-standing GaN substrate according to (1b) above, wherein the size of the projected image is a 10 mm square or more.

(3b) The self-standing GaN substrate according to (1b) or (2b) above, wherein the size of the projected image in a c-axis direction is 15 mm or more.

(4b) The self-standing GaN substrate according to any one of (1b) to (3b) above, wherein the size of the projected image in an a-axis direction is 30 mm or more.

(5b) The self-standing GaN substrate according to any one of (1b) to (4b) above, wherein the self-standing GaN substrate contains fluorine.

(6b) The self-standing GaN substrate according to any one of (1b) to (5b) above, wherein alkali metal concentration is lower than $1 \times 10^5$ cm$^{-3}$.

(7b) The self-standing GaN substrate according to any one of (1b) to (6b) above, wherein the self-standing GaN substrate contains a stacking fault.

(8b) A manufacturing method of a GaN single crystal, including preparing the self-standing GaN substrate according to any one of (1b) to (7b) above and epitaxially growing GaN on the self-standing GaN substrate.

(9b) A manufacturing method of a GaN single crystal, including growing a first GaN crystal using the self-standing GaN substrate according to any one of (1b) to (7b) above as a seed, and subsequently growing a second GaN crystal using a part of or all of the first GaN crystal as a seed.

(10b) The manufacturing method according to (8b) or (9b), wherein the manufacturing method is a manufacturing method of a bulk GaN single crystal.

(11b) A manufacturing method of a semiconductor device, including preparing the self-standing GaN substrate according to any one of (1b) to (7b) above and forming a device structure by epitaxially growing one or more types of nitride semiconductors on the self-standing GaN substrate.

(12b) A manufacturing method of a GaN layer-bonded substrate, including the steps of: implanting ions in a vicinity of the principal surface of the self-standing GaN substrate according to any one of (1b) to (7b) above; bonding the principal surface side of the self-standing GaN substrate to a hetero-composition substrate; and forming a GaN layer bonded to the hetero-composition substrate by separating the self-standing GaN substrate at the ion-implanted region as a boundary.

(13b) A GaN layer-bonded substrate with a structure in which a GaN layer separated from the self-standing GaN substrate according to any one of (1b) to (7b) above is bonded to a hetero-composition substrate.

Moreover, the following inventions related to a self-standing GaN substrate, a manufacturing method of a GaN single crystal, a manufacturing method of a semiconductor device, and the like are provided.

(1c) A self-standing GaN substrate with an angle between the normal of the principal surface and an m-axis of 0 degrees or more and 20 degrees or less, wherein: the size of the projected image in a c-axis direction when the principal surface is vertically projected on an M-plane is 10 mm or more; and when a region excluding a portion at a distance of 2 mm or less from a substrate end surface, of the principal surface, is assumed to be an effective region, a stacking fault density obtained by dividing a total length of stacking faults existing in the effective region by an area of the effective region is less than 15 cm$^{-1}$.

(2c) The self-standing GaN substrate according to (1c) above, wherein the size of the projected image is a 10 mm square or more.

(3c) The self-standing GaN substrate according to (1c) or (2c) above, wherein the size of the projected image in a c-axis direction is 15 mm or more.

(4c) The self-standing GaN substrate according to any one of (1c) to (3c) above, wherein the size of the projected image in an a-axis direction is 30 mm or more.

(5c) The self-standing GaN substrate according to any one of (1c) to (4c) above, wherein the self-standing GaN substrate contains fluorine.

(6c) The self-standing GaN substrate according to any one of (1c) to (5c) above, wherein alkali metal concentration is lower than $1 \times 10^{15}$ cm$^{-3}$.

(7c) The self-standing GaN substrate according to any one of (1c) to (6c) above, wherein the self-standing GaN substrate contains a stacking fault.

(8c) A manufacturing method of a GaN single crystal, including preparing the self-standing GaN substrate according to any one of (1c) to (7c) above and epitaxially growing GaN on the self-standing GaN substrate.

(9c) A manufacturing method of a GaN single crystal, including growing a first GaN crystal using the self-standing GaN substrate according to any one of (1c) to (7c) above as a seed, and subsequently growing a second GaN crystal using a part of or all of the first GaN crystal as a seed.

(10c) The manufacturing method according to (8c) or (9c), wherein the manufacturing method is a manufacturing method of a bulk GaN single crystal.

(11c) A manufacturing method of a semiconductor device, including preparing the self-standing GaN substrate according to any one of (1c) to (7c) above and forming a device structure by epitaxially growing one or more types of nitride semiconductors on the self-standing GaN substrate.

(12c) A manufacturing method of a GaN layer-bonded substrate, including the steps of: implanting ions in a vicinity of the principal surface of the self-standing GaN substrate according to any one of (1c) to (7c) above; bonding the principal surface side of the self-standing GaN substrate to a hetero-composition substrate; and forming a GaN layer bonded to the hetero-composition substrate by separating the self-standing GaN substrate at the ion-implanted region as a boundary.

(13c) A GaN layer-bonded substrate with a structure in which a GaN layer separated from the self-standing GaN substrate according to any one of (1c) to (7c) above is bonded to a hetero-composition substrate.

The following inventions related to a GaN crystal and a manufacturing method of a self-standing GaN substrate are provided.

(1d) A manufacturing method of a GaN crystal, including: a seed preparation step of preparing a seed including a first GaN crystal grown using an ammonothermal method; and a crystal growth step of growing a second GaN crystal having better heat resistance than the first GaN crystal on the seed using an ammonothermal method.

(2d) The manufacturing method according to (1d) above, wherein in the crystal growth step, a stacking fault is formed in the second GaN crystal.

(3d) The manufacturing method according to (1d) or (2d) above, wherein in the crystal growth step, an acidic mineralizer containing fluorine is used.

(4d) A manufacturing method of a GaN crystal, including: a first step of growing a first GaN crystal using an ammonothermal method; a second step of fabricating a seed comprising the first GaN crystal; and a third step of growing a second GaN crystal having better heat resistance than the first GaN crystal on the seed using an ammonothermal method.

(5d) The manufacturing method according to (4d) above, wherein in the first step, the first GaN crystal is grown on a nitrogen polarity surface of GaN.

(6d) The manufacturing method according to (5d) above, wherein regrowth is performed in the first step.

(7d) The manufacturing method according to any one of (4d) to (6d) above, wherein in the third step, a stacking fault is formed in the second GaN crystal.

(8d) The manufacturing method according to any one of (4d) to (7d) above, wherein in the third step, an acidic mineralizer containing fluorine is used.

(9d) The manufacturing method according to any one of (4d) to (8d) above, wherein the size in a c-axis direction of the seed fabricated in the second step is 10 mm or more.

(10d) The manufacturing method according to any one of (1d) to (9d) above, wherein the seed is an M-plane GaN substrate.

(11d) A manufacturing method of a self-standing GaN substrate, including the steps of: manufacturing a GaN crystal using the manufacturing method according to any one of (1d) to (10d) above; and cutting out a self-standing substrate from the GaN crystal.

(12d) The manufacturing method according to (11d) above, wherein an angle between a normal of a principal surface of the self-standing substrate and an m-axis is 0 degrees or more and 20 degrees or less.

(13d) The manufacturing method according to (12d) above, wherein the size of the projected image in a c-axis direction when the principal surface of the self-standing substrate is vertically projected on an M-plane is 10 mm or more.

According to preferred embodiments of the present invention, a nonpolar or semipolar GaN substrate with improved size and crystal quality is provided.

BRIEF DESCRIPTION OF THE DRAWINGS

FIGS. 10A-10C are diagrams explaining that an appearance of a stable plane that is inclined with respect to the growth direction on the surface causes a growth rate of a GaN crystal to slow down, wherein FIG. 10A illustrates a seed substrate before the GaN crystal is grown, FIG. 10B illustrates a state where a stable plane has appeared on the surface of the GaN crystal growing on the seed substrate, and FIG. 10C illustrates a state where the entire surface of the GaN crystal growing on the seed substrate is occupied by the stable plane.

BEST MODE FOR CARRYING OUT THE INVENTION

Figure 1:
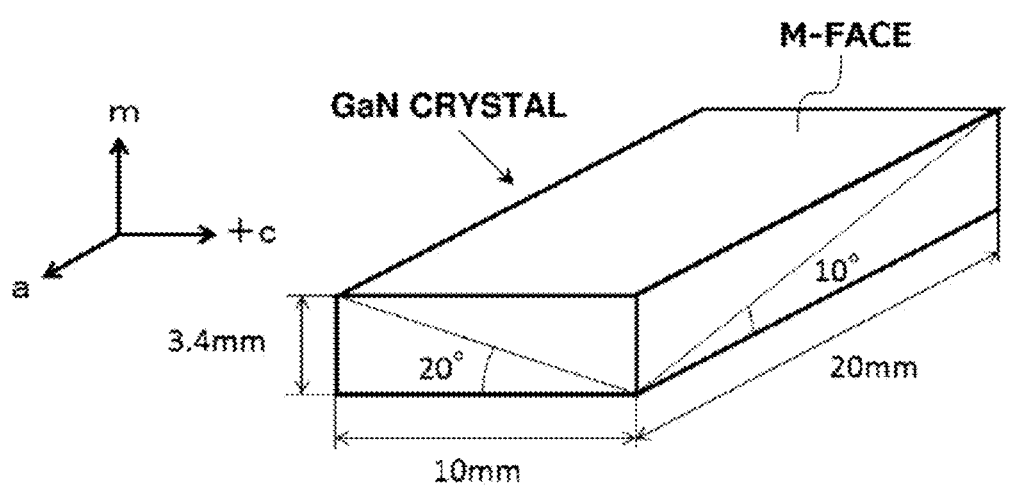
FIG. 1 is a perspective view showing a GaN crystal whose sizes in a c-axis direction, an a-axis direction, and an m-axis direction are respectively 10 mm, 20 mm, and 3.4 mm.

A GaN crystal has a wurtzite type crystal structure belonging to the hexagonal crystal system.

In a GaN crystal, a crystal axis parallel to [0001] is called a c-axis, a crystal axis parallel to [10-10] is called an m-axis, and a crystal axis parallel to [11-20] is called an a-axis. In addition, a crystal plane perpendicular to the c-axis is called a C-plane, a crystal plane perpendicular to the m-axis is called an M-plane, and a crystal plane perpendicular to the a-axis is called an A-plane.

In the present specification, unless otherwise noted, references made to a crystal axis, a crystal plane, a crystal orientation, and the like are assumed to mean a crystal axis, a crystal plane, a crystal orientation, and the like of a GaN crystal.

In the present specification, references may be made to an intersection line between a principal surface of a GaN substrate and an A-plane. The A-plane in this case is assumed to mean an A-plane perpendicular to the M-plane that is parallel to or closest to parallel to the principal surface.

A name or Miller indices of a crystal plane that is attached to a name of a GaN substrate is that of a low index plane that is parallel to or closest to parallel to a front surface of the substrate. The front surface refers to a surface intended to be used for forming a semiconductor device or epitaxially growing a crystal among the two principal surfaces of the substrate. The principal surface that is not the front surface is referred to as a back surface.

For example, a GaN substrate in which a low index plane that is parallel to or closest to parallel to a front surface thereof is an M-plane or, in other words, (10-10) is referred to as an M-plane substrate or a (10-10) substrate. Normally, a crystal plane for which absolute values of integers h, k, m, and l of Miller indices (hkml) are equal to or smaller than 3 is assumed to be a low index plane.

Hereinafter, the present invention will be described in detail in line with embodiments thereof.

1. SELF-STANDING GAN SUBSTRATE

A self-standing GaN substrate refers to a single crystal substrate consisting only of GaN crystal. In the present specification, a self-standing GaN substrate may also be simply referred to as a GaN substrate.

A self-standing GaN substrate according to the present invention need only be thick enough to allow handling as a self-standing substrate. Although the thickness varies depending on the size of the principal surface, the thickness can be empirically determined. In the case of a 2 inch-diameter disk-shaped substrate, a minimum thickness that enables the substrate to be handled as a self-standing substrate is normally 150 to 200 μm, a favorable thickness is 250 μm or more, and a further favorable thickness is 280 μm or more.

While the thickness of a self-standing GaN substrate according to the present invention does not particularly have an upper limit, normally, the thickness is 1.5 mm or less. In the case of a 2 inch-diameter disk-shaped substrate, a thickness thereof is normally 400 μm or less and favorably 350 μm or less. However, depending on use a thicker substrate may be more favorable.

In a self-standing GaN substrate according to the present invention, an angle between the normal of at least one principal surface and an m-axis is 0 degrees or more and 20 degrees or less. In other words, at least one principal surface of a GaN substrate according to the present invention is parallel to a crystal plane whose angle of inclination from an M-plane is 0 degrees or more and 20 degrees or less.

For example, [10-10], [20-21], [20-2-1], [30-31], and [30-3-1] form an angle with an m-axis that is 0 degrees or more and 20 degrees or less. Therefore, a (10-10) substrate, a (20-21) substrate, a (20-2-1) substrate, a (30-31) substrate, and a (30-3-1) substrate are included in a GaN substrate in which an angle between the normal of the principal surface and m-axis is 0 degrees or more and 20 degrees or less.

In a GaN substrate according to the present invention, the higher the parallelism between two principal surfaces, the more favorable. When the two principal surfaces are parallel to each other, an angle between the normal and an m-axis is 0 degrees or more and 20 degrees or less at each principal surface.

In a GaN substrate according to the present invention, the size of the projected image in a c-axis direction when the principal surface is vertically projected on a M-plane is 10 mm or more. The size in a c-axis direction is favorably 15 mm or more, more favorably 20 mm or more, more favorably 25 mm or more, more favorably 30 mm or more, more favorably 35 mm or more, more favorably 40 mm or more, more favorably 45 mm or more, and more favorably 50 mm or more. In addition, the size of the projected image in an a-axis direction is normally 10 mm or more, favorably 20 mm or more, more favorably 30 mm or more, more favorably 40 mm or more, and more favorably 50 mm or more.

For the purpose of illustration, FIG. 1 shows a GaN crystal whose sizes in an a-axis direction, an c-axis direction, and an m-axis direction are respectively 20 mm, 10 mm, and 3.4 mm. A person skilled in the art would understand that, by slicing this GaN crystal, a substrate can be obtained in which an angle of inclination of the principal surface with respect to an M-plane is 10 degrees or less in an a-axis direction and within ±20 degrees in a c-axis direction and in which the size of the projected image when the principal surface is vertically projected on the M-plane is 20 mm in an a-axis direction and 10 mm in a c-axis direction. The smaller the inclination angle of the principal surface with respect to the M-plane, a larger number of the substrates can be cut out.

2. PREFERRED EMBODIMENTS

Various embodiments of the present invention will be described below.

2.1. First Embodiment 2.1.1. Self-Standing GaN Substrate

With a self-standing GaN substrate according to the first embodiment, when an a-axis length is measured on an intersection line between the principal surface and an A-plane, a low distortion section with an extremely small variation in the a-axis length is observed.

The a-axis length variation in the low distortion section is favorably $10.0 \times 10^{-5}$ Å or less, more favorably $8.0 \times 10^{-5}$ Å or less, and most favorably $6.0 \times 10^{-5}$ Å or less. A section length of the low distortion section is favorably 6 mm or more, more favorably 8 mm or more, and most favorably 10 mm or more.

The a-axis length can be measured using a reflection mode X-ray diffractometer. Measurement intervals are favorably 250 μm or less. An a-axis length is calculated based on a (300) lattice spacing obtaining by performing a 2θ-ω scan of a (300) plane at each measurement point.

Figure 2:
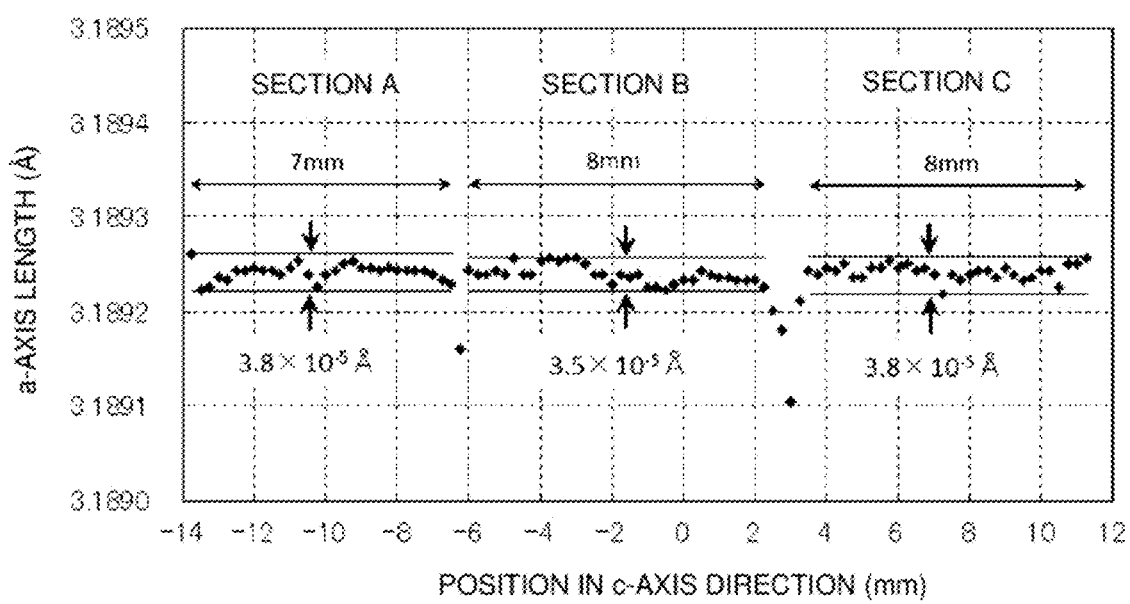
FIG. 2 is a graph showing a result of measurements of an a-axis length on a principal surface of a self-standing M-plane GaN substrate according to an embodiment taken every 250 μm on an intersection line between the principal surface and an A-plane.

FIG. 2 shows a result of measurements of an a-axis length on a principal surface of a 50 mm (a-axis direction)×25 mm (c-axis direction)×346 μm (m-axis direction) self-standing M-plane GaN substrate according to the first embodiment as taken every 250 μm on a straight line parallel to a c-axis. In the case of an M-plane substrate, an intersection line between the principal surface and an A-plane is parallel to a c-axis.

In FIG. 2, an a-axis length at each measurement point is plotted on a coordinate plane in which a horizontal axis thereof represents a position in a c-axis direction and a vertical axis thereof represents an a-axis length. The graph shown in FIG. 2 has three low distortion sections, namely, a section A, a section B, and a section C. Among the respective low distortion sections, the section A has an a-axis length variation width of $3.8 \times 10^{-5}$ Å, the section B has an a-axis length variation width of $3.5 \times 10^{-5}$ Å, and the section C has an a-axis length variation width of $3.8 \times 10^{-5}$ Å. The section A has a section length of approximately 7 mm and the sections B and C respectively have section lengths of approximately 8 mm.

When a low distortion section is observed in a measurement of a-axis lengths on one straight line, the GaN substrate may be described as including a low distortion region extending also in a direction that intersects with the straight line.

Due to having a low distortion region, a GaN substrate according to the first embodiment has an advantage in that deformation occurring when the GaN substrate is heated inside a vapor phase growth furnace is small. Vapor phase epitaxial growth of a nitride semiconductor is normally performed while heating a substrate at a high temperature of 800° C. or higher.

In the low distortion section described above, furthermore, a variation in a c-axis length is favorably $3.0 \times 10^{-4}$ Å or less and more favorably less than $2.0 \times 10^{-4}$ Å.

In the low distortion section described above, furthermore, an X-ray rocking curve full-width at half-maximum (XRC-FWHM) of a (300) plane is favorably less than 100 arcsec and more favorably less than 90 arcsec. Generally, XRC-FWHM is smaller when dislocation density of a crystal is low.

In the low distortion section described above, furthermore, a variation in the XRC-FWHM of a (300) plane is favorably less than 20 arcsec and more favorably less than 10 arcsec.

Figure 3:
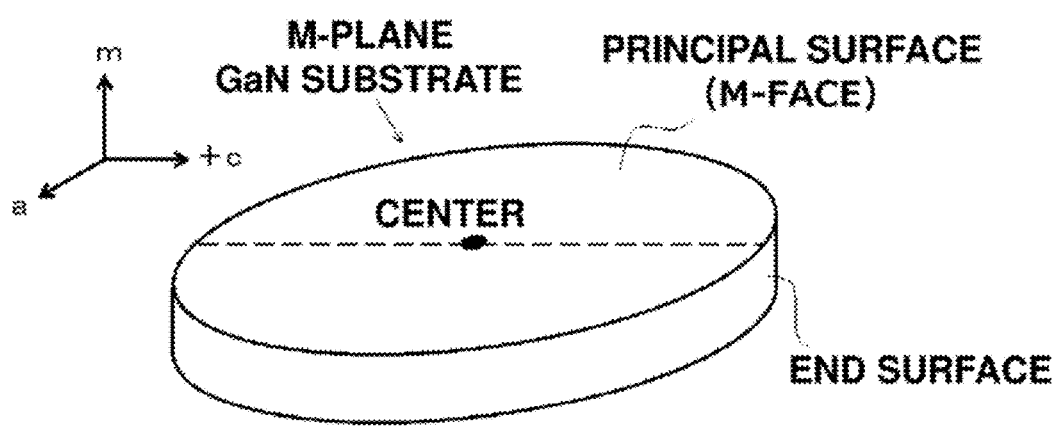
FIG. 3 is a diagram for explaining a longest intersection line between the principal surface and an A-plane in a disk-shaped M-plane GaN substrate.

When measuring an a-axis length, a c-axis length, and/or an XRC-FWHM on intersection lines between a principal surface of a substrate and an A-plane, favorably, a longest one among the intersection lines may be selected and the measurement may be performed thereon. A longest one among the intersection lines between a principal surface of a substrate and an A-plane means a longest intersection line formable by the principal surface and an A-plane. For example, in the case of a disk-shaped M-plane GaN substrate, as shown in FIG. 3, a longest intersection line between the principal surface and an A-plane is a straight line (a dashed line in FIG. 3) parallel to a c-axis and passing through the center of the principal surface (center of a circle).

When evaluating a crystal quality of a GaN substrate based on a result of an X-ray measurement, a portion at a distance of 2 mm or less from a substrate end surface may be excluded from consideration. This is because, in an outer peripheral portion of a substrate, defects attributable to mechanical processing of a crystal tend to remain and there are cases when a measurement value does not accurately reflect crystal quality.

Considering above, a region excluding portions at a distance of 2 mm or less from a substrate end surface, of a principal surface of a substrate, may be assumed to be an effective region, an a-axis length may be measured on a longest intersection line formable by the principal surface and an A-plane in the effective region, and crystal quality of the substrate may be evaluated based on a result of the measurement.

With a self-standing GaN substrate according to a preferred example, on a longest intersection line formable by the principal surface and an A-plane in the effective region, an a-axis length is within a range expressed as $L_a \pm 5.0 \times 10^{-5}$ Å (where $L_a$ is a value equal to or larger than 3.1885 and smaller than 3.1895).

The a-axis length being within a range expressed as $L_a \pm 5.0 \times 10^{-5}$ Å means that a variation width of the a-axis length on the longest intersection line is $10.0 \times 10^{-5}$ Å or less. $L_a$ (Å) denotes a center value of the a-axis length on the longest intersection line and may be 3.1885 or larger and smaller than 3.1895.

In a more favorable example, the a-axis length on the longest intersection line is within a range expressed as $L_a \pm 4.0 \times 10^{-5}$ Å and furthermore within a range expressed as $L_a \pm 3.0 \times 10^{-5}$ Å.

On the longest intersection line formable by a principal surface of a substrate and an A-plane in the effective region, furthermore, a c-axis length is favorably within a range expressed as $L_c \pm 1.5 \times 10^{-4}$ Å (where $L_c$ is a value equal to or larger than 5.1845 and smaller than 5.1865). The c-axis length being within a range expressed as $L_c \pm 1 \times 10^{-4}$ Å means that a variation width of the c-axis length on the longest intersection line is $3.0 \pm 10^{-4}$ Å or less. $L_c$ (Å) denotes a center value of the c-axis length on the longest intersection line and may be 5.1845 or larger and smaller than 5.1865.

In a more favorable example, the c-axis length on the longest intersection line is within a range expressed as $L_c \pm 1.0 \times 10^{-5}$ Å.

Otherwise, on the longest intersection line formable by a principal surface of a substrate and an A-plane in the effective region, an XRC-FWHM of a (300) plane is favorably less than 100 arcsec and more favorably less than 90 arcsec, and a variation width in the XRC-FWHM of a (300) plane is favorably less than 20 arcsec and more favorably less than 10 arcsec.

A self-standing GaN substrate according to the first embodiment may have an defect increasing zone extending in a direction intersecting an A-plane on the principal surface.

An defect increasing zone refers to a belt-like region in which density of crystal defects such as dislocations and stacking faults is locally high and is observed when a GaN crystal is grown by a method using an aggregated seed to be described later and a GaN substrate is fabricated from the GaN crystal. Specifically, in a GaN crystal grown on an aggregated seed, a portion with high defect density grown above a boundary between seed substrates constituting the aggregated seed appears as an defect increasing zone on a surface of a GaN substrate obtained by processing the GaN crystal.

Typically, when dislocation density and stacking fault density measured in an arbitrarily-selected 300 μm×400 μm area are respectively $1 \times 10^4$ to $1 \times 10^6$ cm$^{-2}$ and 0 to $5 \times 10^{-2}$ cm$^{-1}$ outside the defect increasing zone, these defect densities inside the defect increasing zone are respectively $1 \times 10^7$ to $1 \times 10^9$ cm$^{-2}$ and $1 \times 10^3$ to $1 \times 10^5$ cm$^{-1}$.

Figure 4:
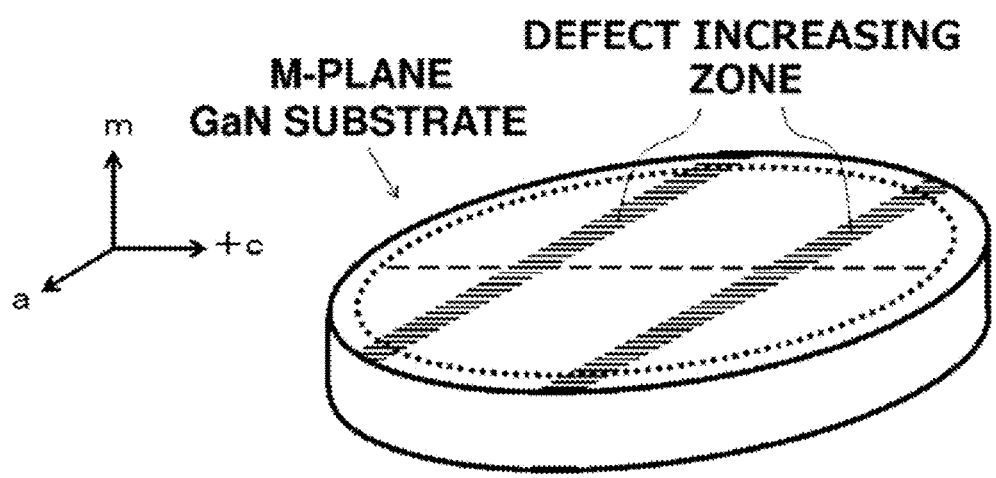
FIG. 4 is a perspective view of a disk-shaped M-plane GaN substrate having an defect increasing zone on a principal surface thereof.

FIG. 4 is a perspective view of a disk-shaped M-plane GaN substrate having an defect increasing zone on a principal surface thereof. The defect increasing zone extends along an a-axis direction. A dotted line depicts an outer edge of the effective region of the substrate and a dashed line depicts a longest intersection line formable by a principal surface of the substrate and an A-plane in the effective region.

With a GaN substrate having an defect increasing zone on a principal surface thereof, an a-axis length on a longest intersection line formable by the principal surface and a A-plane in the effective region is within a range expressed as favorably $L_a \pm 5.0 \times 10^{-5}$ Å, more favorably $L_a \pm 4.0 \times 10^{-5}$ Å, and most favorably $L_a \pm 3.0 \times 10^{-5}$ Å in a portion excluding the defect increasing zone. In this case, $L_a$ may be a value equal to or larger than 3.1885 and smaller than 3.1895.

While a section in which an a-axis length falls outside the favorable ranges described above may be formed in a portion where the longest intersection line traverses the defect increasing zone, a length of this section is favorably less than 2 mm and more favorably less than 1.5 mm.

In this section, a c-axis length may also fall outside the preferred ranges described above, and, in addition, an XRC-FWHM of a (300) plane may also increase locally.

While a self-standing GaN substrate according to the first embodiment is not limited by a manufacturing method of a GaN crystal used as a material, in a preferred example, the self-standing GaN substrate comprises a GaN crystal grown by an HVPE method.

With an HVPE method, a GaN crystal can be grown in which concentrations of undesirable impurities are kept lower than in a flux method or an ammonothermal method.

For example, with a flux method, it is difficult to obtain a GaN crystal with a combined alkali metal concentration of lithium (Li), sodium (Na), and potassium (K) that is lower than $1 \times 10^{15}$ cm$^{-3}$ (Japanese Patent Application Laid-open No. 2009-18961). The same can be said of an ammonothermal method using an alkali metal as a mineralizer (Japanese Patent Application Laid-open No. 2011-523931). In contrast, a GaN crystal grown by an HVPE method normally has an alkali metal concentration of lower than $1 \times 10^{15}$ cm$^{-3}$.

A low concentration of alkali metals in a substrate is advantageous in terms of improving reliability of a semiconductor device to be formed on the substrate.

In addition, since an HVPE method enables dopant concentration to be readily controlled, a GaN crystal can be obtained in which carrier concentration and conductivity are controlled with higher precision as compared with a flux method and an ammonothermal method.

Furthermore, a GaN crystal grown by an HVPE method has high transparency in a visible wavelength range and is suitable as a material of a GaN substrate for a light-emitting device. For example, at 450 nm that is an emission wavelength of an excitation blue LED used in a white LED, while an absorption coefficient of a GaN crystal grown by an ammonothermal method is 4 to 20 cm$^{-1}$, an absorption coefficient of a GaN crystal grown by an HVPE method is 2 cm$^{-1}$ or less (T. Hashimoto, et al., Sensors and Materials, Vol. 25, No. 3 (2013) 155-164).

From the perspective of productivity, an HVPE method has an advantage of enabling a GaN crystal to grow at a significantly higher rate than a flux method and an ammonothermal method.

2.1.2. Manufacturing Method of Self-Standing GaN Substrate

<First Method>

A self-standing GaN substrate according to the first embodiment may be manufactured according to, but not limited to, the following procedure.

(i) Growing a primary GaN crystal by an HVPE method or the like and fabricating a C-plane substrate (primary substrate) from the primary GaN crystal.
(ii) Using the primary substrate as a seed, growing a secondary GaN crystal by an ammonothermal method and fabricating an M-plane substrate (secondary substrate) from the secondary GaN crystal.
(iii) Using the secondary substrate as a seed, growing a tertiary GaN crystal by an ammonothermal method and fabricating an M-plane substrate (tertiary substrate) from the tertiary GaN crystal.
(iv) Using the tertiary substrate as a seed, growing a quaternary GaN crystal by an HVPE method and fabricating the self-standing GaN substrate according to the first embodiment by processing the quaternary GaN crystal.

There are three important points when growing the secondary GaN crystal in step (ii) above.

Firstly, the secondary GaN crystal is grown on a nitrogen polarity surface of the primary substrate.

Secondly, before growing the secondary GaN crystal, a growth mask of a specific pattern (to be described later) is formed on the nitrogen polarity surface of the primary substrate.

Thirdly, an acidic mineralizer is used.

By executing these three points, the secondary GaN crystal with small distortion in a crystal structure thereof can be grown at a high rate until a large size is attained. As a result, an area of the secondary substrate can be increased and, consequently, an area of the tertiary substrate can be increased.

It is also important that step (iii) is provided between steps (ii) and (iv). Step (iii) is necessary because the secondary substrate fabricated in step (ii) cannot withstand temperature conditions that apply when growing a GaN crystal by an HVPE method. Due to a large number of voids contained in the secondary substrate, the secondary substrate breaks or deteriorates when subjected to high temperatures near 1000° C.

In contrast, since a GaN crystal can be grown at 650° C. or lower in an ammonothermal method, the secondary substrate can be used as a seed.

The tertiary substrate fabricated from the tertiary GaN crystal grown on the secondary substrate in step (iii) is similar to the secondary substrate in that distortion of a crystal structure thereof is small, and since the tertiary substrate is significantly superior to the secondary substrate with respect to heat resistance, the tertiary substrate can be favorably used as a seed when growing a GaN crystal by an HVPE method.

There are two important points with respect to step (iv). Firstly, all of or approximately all of a carrier gas used when growing a GaN crystal by an HVPE method is constituted by nitrogen gas. Secondly, an upper surface of the seed is widened as much as possible.

In prior art, use of carrier gas with a high nitrogen gas content tended to be avoided. This is because increasing a proportion of nitrogen gas in carrier gas increases the tendency to produce polycrystalline GaN. Various problems arise under conditions where polycrystalline GaN tends to be produced including a problem of consumption of raw material gas due to growth of polycrystalline GaN on a side surface of a seed, a problem in that a seed tends to adhere to a susceptor, and a problem of deterioration of quartz members such as a growth vessel due to deposition of polycrystalline GaN on a surface thereof.

In addition, when nitrogen gas constitutes almost all of the carrier gas, stress generated by deposition of polycrystalline GaN on a side surface of a seed causes distortion of a GaN crystal epitaxially grown on an upper surface of the seed.

Therefore, the present inventors tried to use an aggregated seed in which a plurality of tertiary substrates are arranged so that respective end surfaces thereof come into close contact with each other and also tried to widen a principal surface of each tertiary substrate.

As a result, an influence of polycrystalline GaN deposited on a side surface of the aggregated seed declined and an effect of carrier gas on the quality of a GaN crystal epitaxially grown on an upper surface of the aggregated seed became apparent. In addition, it was demonstrated that, on the tertiary substrate with high crystallinity, distortion of an epitaxially grown GaN crystal is significantly reduced when all of or approximately all of the carrier gas is constituted by nitrogen gas.

Details of each step will be described below.
(i) Growth of Primary GaN Crystal and Fabrication of Primary Substrate (C-Plane GaN Substrate)

The primary GaN crystal to be used as a material of the primary substrate may be grown by any method. A case where an HVPE method is used will now be described as an example.

When growing the primary GaN crystal using an HVPE method, a C-plane GaN template can be used as a seed.

A C-plane GaN template refers to a composite substrate which uses a single crystal substrate with a different chemical composition from GaN as a base member and which comprises a single crystal GaN layer grown thereon along c-axis by an MOCVD method or the like. The surface of the single crystal GaN layer is a gallium polarity face.

The base member of the C-plane GaN template is a sapphire substrate, a GaAs substrate, a SiC substrate, a Si substrate, a $Ga_2O_3$ substrate, an AlN substrate, or the like and a diameter thereof is normally 1 to 6 inches. A thickness of the single crystal GaN layer is, for example, 0.5 to 50 µm.

A mask pattern for ELO (Epitaxial Lateral Overgrowth) may be provided on the surface of the single crystal GaN layer. The mask pattern is formed by a thin film made of a material that inhibits vapor phase growth of GaN such as silicon nitride ($SiN_x$) and silicon oxide ($SiO_2$). A preferred example of the mask pattern is a stripe pattern (line and space pattern). The direction of the stripes is set to be parallel to an m-axis of the single crystal GaN layer.

Figure 5:
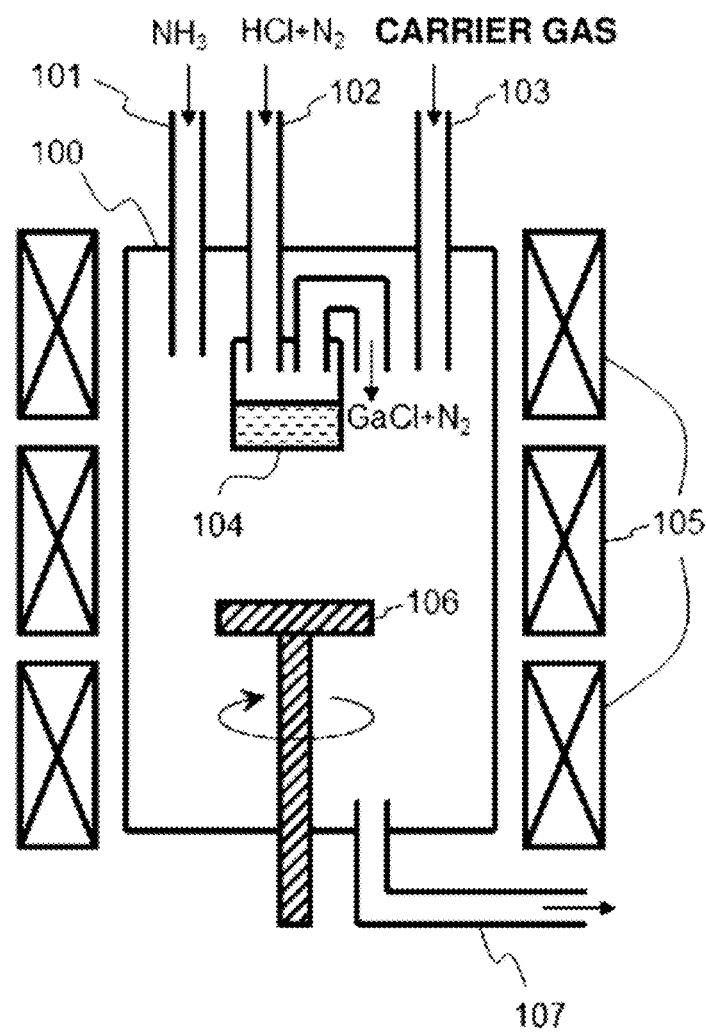
FIG. 5 is a conceptual diagram of a vapor phase growth apparatus used in an HVPE method.

Growth of a GaN crystal by an HVPE method can be performed using a vapor phase growth apparatus of which a conceptual diagram is shown in FIG. 5.

The vapor phase growth apparatus shown in FIG. 5 has a growth furnace 100, inlet pipes 101 to 103 for introducing gas into the growth furnace, a reservoir 104 that retains metallic gallium, a heater 105 arranged so as to enclose the growth furnace, a susceptor 106 for mounting a seed, and an exhaust pipe 107 for discharging gas from inside the growth furnace.

The growth furnace, the inlet pipes, the reservoir, and the exhaust pipe are formed of quartz. The susceptor 106 is formed of carbon and, favorably the surface thereof is coated by SiC.

Ammonia ($NH_3$), gallium chloride (GaCl), and a carrier gas are supplied to the growth furnace 100 through the inlet pipes 101 to 103.

Gallium chloride is created by a reaction of hydrogen chloride (HCl) supplied to the reservoir 104 through the inlet pipe 102 with metallic gallium retained in the reservoir. Since the hydrogen chloride is supplied to the reservoir after being diluted by nitrogen gas ($N_2$), the gas introduced into the growth furnace through the reservoir contains hydrogen chloride and nitrogen gas in addition to gallium chloride.

Hydrogen gas (Hr) and nitrogen gas ($N_2$) are favorably used as the carrier gas.

A susceptor temperature during crystal growth may favorably be adjusted as appropriate within a range of 900 to 1200° C.

Internal pressure of the growth furnace during crystal growth may favorably be adjusted as appropriate within a range of 50 to 120 kPa.

The susceptor 106 is rotated so that a crystal grows uniformly on the seed. The rotation rate may be adjusted as appropriate between, for example, 1 and 50 rpm.

The crystal growth rate is favorably set to a range of 80 to 300 μm/h. The growth rate may be increased by increasing partial pressure of either one or both of GaCl and ammonia in the growth furnace. The partial pressure of GaCl is favorably $2\times10^2$ to $2\times10^3$ Pa. The partial pressure of ammonia is favorably $4\times10^3$ to $1\times10^4$ Pa.

Gas partial pressure as used herein means a value (P×r) obtained by multiplying pressure (P) in a growth furnace by a ratio (r) of a volumetric flow rate of specific gas among a sum of volumetric flow rates of all gases supplied into the growth furnace.

The primary substrate (C-plane GaN substrate) is fabricated by slicing, parallel to the C-plane, the primary GaN crystal grown on the C-plane GaN template. Details of techniques necessary for planarizing the principal surface and removing a damage layer are well known to those skilled in the art and need not be particularly described. A nitrogen polarity surface of the primary substrate is subjected to a CMP (Chemical Mechanical Polishing) finish for planarization and removal of a damage layer. The nitrogen polarity surface is a [000-1] side principal surface of a C-plane GaN substrate and is also called an N polarity face, a nitrogen face, and the like.

(ii) Growth of Secondary GaN Crystal and Fabrication of Secondary Substrate (M-Plane GaN Substrate)

The secondary GaN crystal to be used as a material of the secondary substrate is grown by an ammonothermal method using the primary substrate as a seed.

Before growing the secondary GaN crystal, a growth mask for limiting a region enabling crystal growth is formed on the nitrogen polarity surface of the primary substrate.

Figure 6:
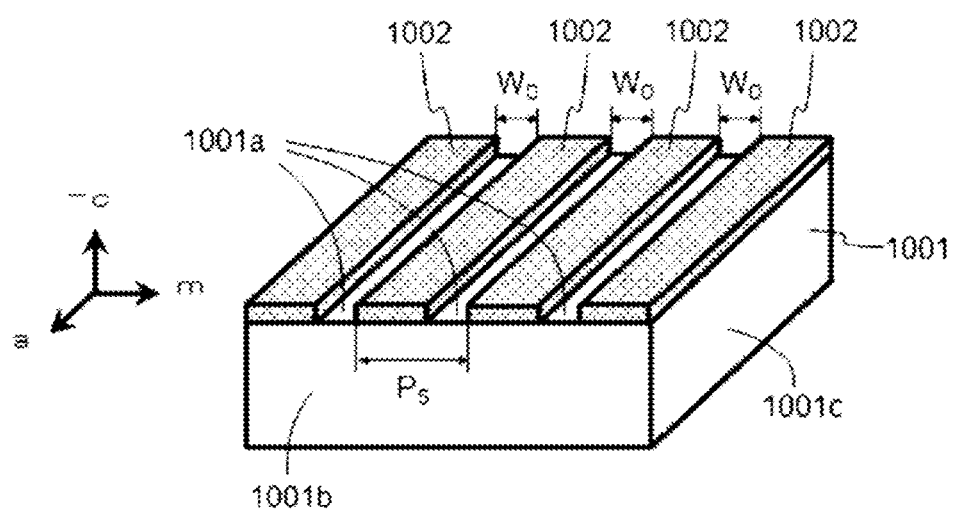
FIG. 6 is a perspective view of a C-plane GaN substrate having a growth mask with a stripe pattern formed on a nitrogen polarity surface.

FIG. 6 is a schematic diagram exemplifying the primary substrate on which a growth mask is formed. The primary substrate 1001 has a rectangular nitrogen polarity surface 1001a, and arranged thereon is a growth mask 1002 which has a linear opening with a width W, of around 50 to 100 μm and which has a stripe pattern (line and space pattern) parallel to an a-axis. A stripe period $P_a$ is favorably set larger than 1 mm and is favorably set equal to or smaller than 10 mm.

An end surface 1001b in an a-axis direction and an end surface 1001c in a m-axis direction of the primary substrate must not be covered by the growth mask. In an example, furthermore, an outer peripheral portion of the nitrogen polarity surface may be exposed within a range of several mm from a substrate end surface.

The growth mask is formed by a metal that does not dissolve or decompose during growth of a GaN crystal by an ammonothermal method such as Al, W, Mo, Ti, Pt, Ir, Ag, Au, Ta, Ru, Nb, and Pd, or an alloy thereof.

A raw material used in the ammonothermal method is favorably polycrystalline GaN. Concentration of oxygen contained as an impurity in the polycrystalline GaN is favorably $5\times10^{19}$ cm$^{-3}$ or lower.

An amount of impurities such as water and oxygen contained in ammonia used as a solvent is favorably 0.1 ppm or less.

An acidic mineralizer is used as a mineralizer. A preferred example of the acidic mineralizer is an acidic mineralizer including a halogen element such as ammonium halide, gallium halide, and hydrogen halide. A combination of ammonium fluoride and hydrogen iodide is particularly favorable.

Figure 7:
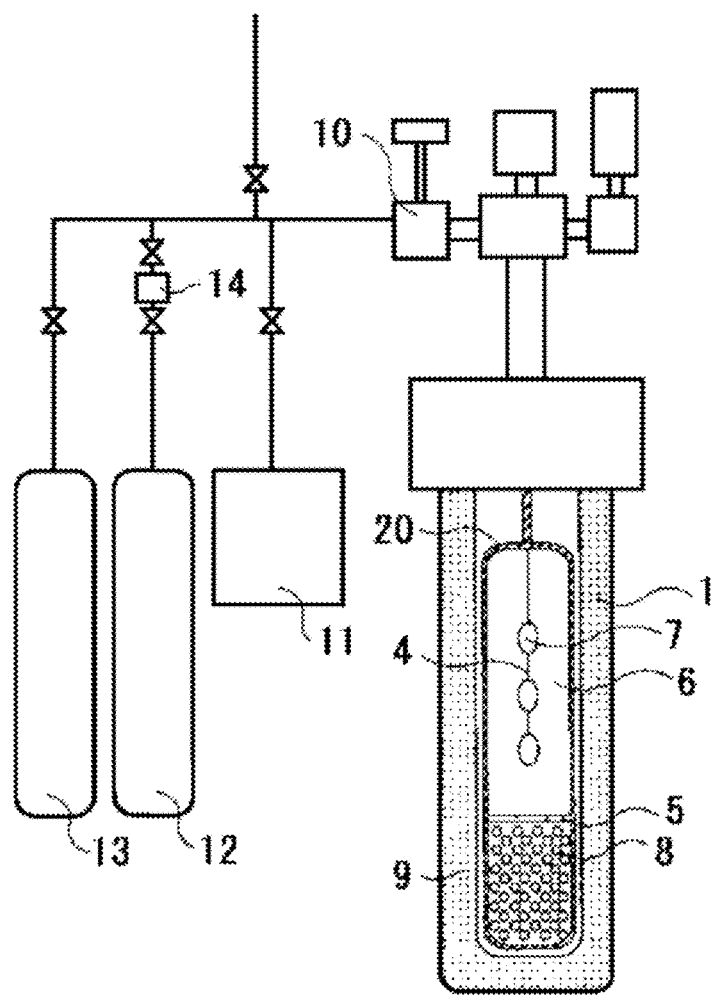
FIG. 7 is a conceptual diagram of a high-pressure growth apparatus used in an ammonothermal method.

Growth of a GaN crystal by the ammonothermal method may be performed using a high-pressure growth apparatus of which a conceptual diagram is shown in FIG. 7.

Crystal growth is carried out in a cylindrical growth vessel 20 that is loaded into a cylindrical autoclave 1.

The growth vessel 20 is internally provided with a crystal growth zone 6 and a raw material dissolving zone 9 that are partitioned from each other by a baffle 5. A seed crystal 7 suspended by a platinum wire 4 is installed in the crystal growth zone 6. The raw material dissolving zone 9 is filled with raw material 8.

A gas line to which a vacuum pump 11, an ammonia cylinder 12, and a nitrogen cylinder 13 are connected is connected to the autoclave 1 via a valve 10. When charging the growth vessel 20 with ammonia, an amount of ammonia supplied from the ammonia cylinder 12 can be checked using a mass flow meter 14.

When growing a crystal, the growth vessel 20 having a seed, the raw material, the mineralizer, and a solvent sealed therein is loaded into the autoclave 1, a space between the autoclave 1 and the growth vessel 20 is also filled with the solvent, and the autoclave 1 is hermetically sealed. Subsequently, the whole autoclave 1 is heated by a heater (not shown) to create a supercritical state or a subcritical state inside the growth vessel 20.

During crystal growth, pressure inside the growth vessel 20 is favorably set to 180 MPa or higher and 300 MPa or lower and a temperature therein is favorably set to 530° C. or higher and 650° C. or lower. The raw material dissolving zone 9 is kept at a higher temperature than the crystal growth zone 6. A difference in temperature between the two zones is favorably 80° C. or less.

Figure 8:
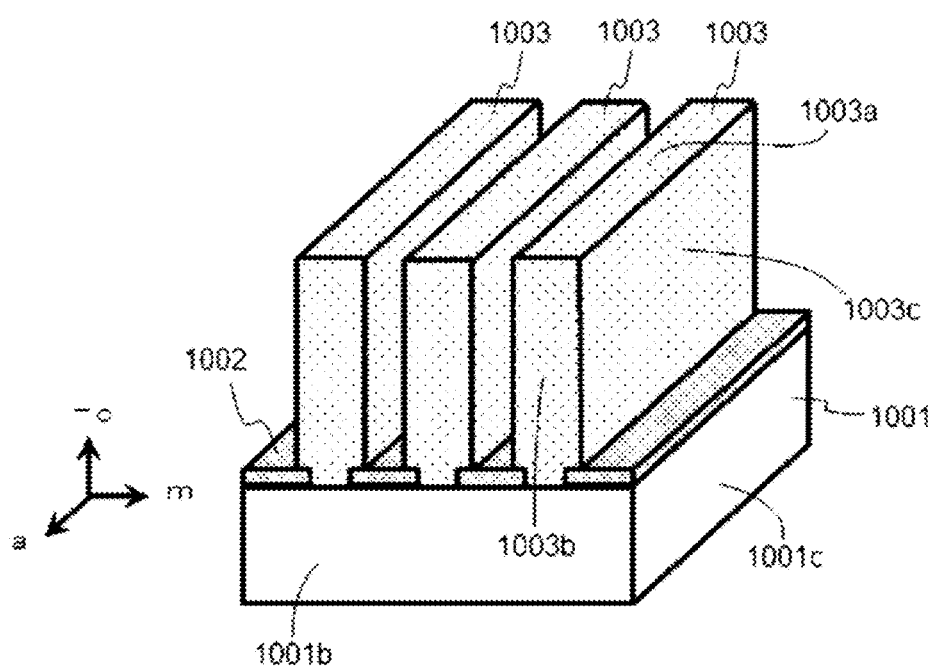
FIG. 8 is a perspective view showing how a GaN crystal grows on a C-plane GaN substrate having a growth mask with a stripe pattern formed on a nitrogen polarity surface.

FIG. 8 schematically shows how the secondary GaN crystal grows. In FIG. 8, the secondary GaN crystal 1003 is growing in a wall shape one by one above each opening of the growth mask 1002. The height direction of the walls is a [000-1] direction (−c direction) and the thickness direction of the walls is an m-axis direction. While each of the walls also grows in the thickness direction, coalescence of adjacent walls is unlikely to occur.

Since an interface between the secondary GaN crystal 1003 and the primary substrate 1001 is limited within the long and narrow opening provided to the growth mask 1002, stress generated at the interface can be prevented from affecting the growth of the secondary GaN crystal.

Figure 9:
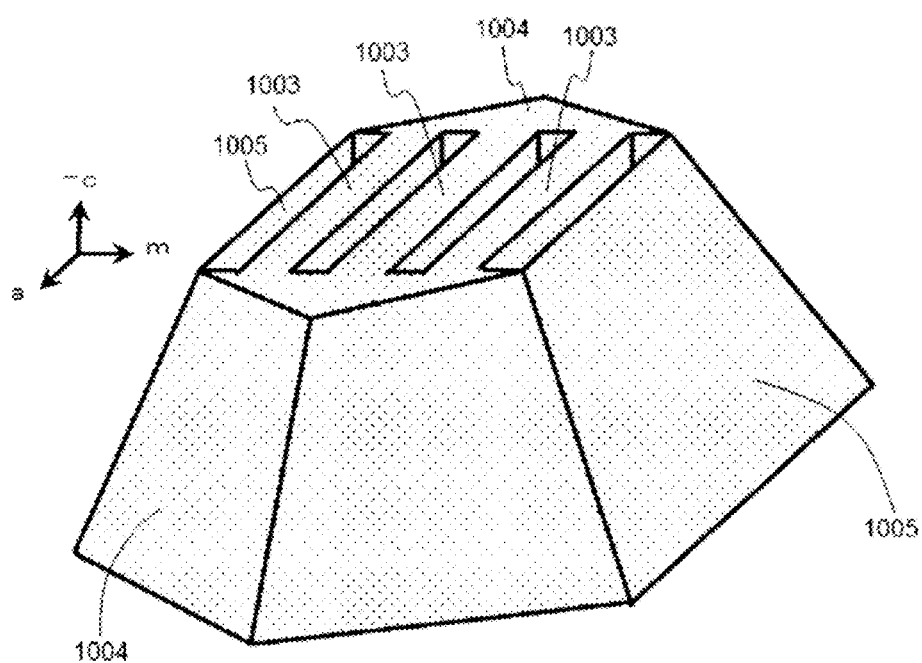
FIG. 9 is a perspective view showing a structure formed by a GaN crystal growing ammonothermally on a C-plane GaN substrate having a growth mask with a stripe pattern formed on a nitrogen polarity surface.

Although omitted in FIG. 8, since a GaN crystal also grows from end surfaces of the primary substrate, a structure schematically shown in FIG. 9 is formed as a whole. A GaN crystal that grows from an end portion 1001b in an a-axis direction of the primary substrate extends in the [000-1] direction and forms a wall 1004 having an inclined outer surface. An end portion 1003b of the secondary GaN crystal in an a-axis direction connects to the inner surface of the wall 1004. A GaN crystal that grows from an end portion 1001c in an m-axis direction of the primary substrate also extends in the [000-1] direction and forms a wall 1005 having an inclined outer surface. The wall 1004 and the wall 1005 connect to each other to form a peripheral wall structure enclosing the secondary GaN crystal 1003.

Due to the formation of the structure shown in FIG. 9, at least the three effects presented below are produced.

The first effect is an effect of holding the secondary GaN crystal on the primary substrate.

The second effect is an effect of preventing the growth rate of the secondary GaN crystal in the [000-1] direction from slowing down.

The third effect is an effect of preventing the size of the secondary GaN crystal in an a-axis direction from decreasing.

The first effect enables regrowth in a growth process of the secondary GaN crystal.

Regrowth means an operation in which, at a time when a crystal is grown to a certain degree, the seed is taken out from the growth vessel and placed in a new growth vessel, and a crystal is once again grown on the seed. Since the growth rate declines as the raw material is consumed in the growth vessel, regrowth is essential to obtaining a large-size secondary GaN crystal. The formation of the structure shown in FIG. 9 enables such regrowth.

If the structure is not formed, it is difficult to transfer the secondary GaN crystal from a used growth vessel to a new growth vessel while preventing the secondary GaN crystal from falling off from the primary substrate. This is because, as described previously, direct bonding between the secondary GaN crystal and the primary substrate is limited to inside of the long and narrow opening provided to the growth mask.

When the structure shown in FIG. 9 is formed, since the secondary GaN crystal is fastened to the primary substrate via the peripheral wall structure described above, in addition to enabling a regrowth operation, significantly reduced is the probability of detachment of the secondary GaN crystal from the primary substrate in a growth vessel due to action of convection of the solvent or the like.

Furthermore, the peripheral wall structure shown in FIG. 9 has an effect of protecting the secondary GaN crystal from suffering damage during handling.

The second effect described above may be explained by way of modeling as follows.

Figure 10A:
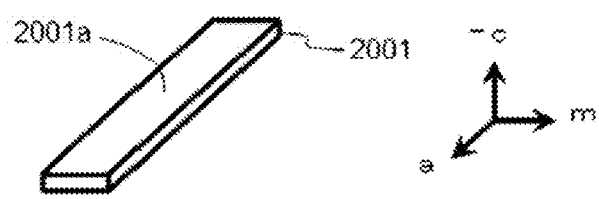

For example, a case where a GaN crystal is grown using a GaN crystal seed substrate 2001 shown in FIG. 10A will be considered. A principal surface 2001a of the seed substrate is a nitrogen polarity surface and a shape thereof is a long and narrow rectangle extending in an a-axis direction.

Figure 10B:
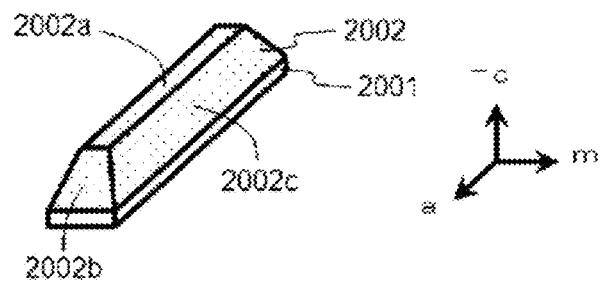

A GaN crystal grows at a high rate on the nitrogen polarity surface of the seed substrate immediately after start of growth, but, at an early stage, stable faces 2002b and 2002c appear on a surface of a GaN crystal 2002 as shown in FIG. 10B. Since the stable faces 2002b and 2002c are both inclined with respect to the [000-1] direction that is a growth direction of the GaN crystal 2002, as crystal growth progresses, the nitrogen polarity surface 2002a of the GaN crystal narrows. Eventually, as shown in FIG. 10C, when an entire surface of the GaN crystal is occupied by the stable faces 2002b and 2002c and the nitrogen polarity surface 2002a disappears, the growth rate of the GaN crystal in the [000-1] direction drops to an impractical level.

In contrast, when the structure shown in FIG. 9 is formed, since a stable face is less likely to appear on the surface of the secondary GaN crystal, slowing of the growth rate in the [000-1] direction attributable to the disappearance of a nitrogen polarity surface does not occur. Therefore, by performing regrowth, the secondary GaN crystal can be grown in the [000-1] direction to 15 mm or more, 20 mm or more, or even 25 mm or more while maintaining the growth rate in the [000-1] direction to a practical level (for example, higher than 100 μm/day). Regrowth can be repeated twice or more.

Figure 10C:
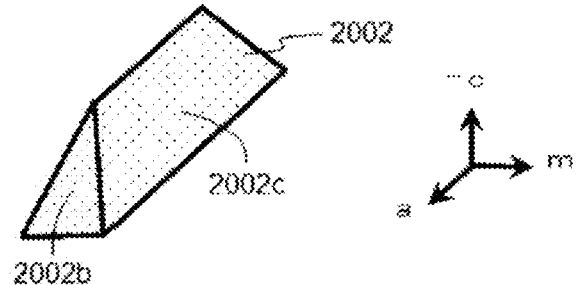

The third effect described above can also be explained by a comparison with a model shown in FIGS. 10A-10C. In the model shown in FIGS. 10A-10C, as the GaN crystal 2002 grows in the [000-1] direction, the size thereof in an a-axis direction decreases. This is because the stable face 2002b that appears at an end portion in an a-axis direction is inclined with respect to the c-axis.

In contrast, when the structure shown in FIG. 9 is formed, an end portion 1003b of the secondary GaN crystal in an a-axis direction is joined to the wall 1004. Therefore, a reduction in size of the secondary GaN crystal in an a-axis direction due to the appearance of an inclined stable face does not occur.

Accordingly, the size of the secondary GaN crystal in an a-axis direction is generally determined in accordance with the size of the primary substrate in an a-axis direction. The size of the primary substrate in an a-axis direction is dependent on the size of the C-plane GaN template that is used as a seed when growing the primary GaN crystal. Therefore, for example, by fabricating the primary substrate with a diameter exceeding 2 inches from the primary GaN crystal grown using a C-plane GaN template with a diameter of 3 inches and growing the secondary GaN crystal using the primary substrate as a seed, the secondary GaN crystal with a size in an a-axis direction of 2 inches (50 mm) or more can be obtained.

The size (thickness) of the secondary GaN crystal in an m-axis direction reaches approximately 1 mm or more (restricted by the stripe period $P_a$ of the growth mask 1002).

By cutting off outer peripheral portions for shaping and planarizing both principal surfaces by lapping and CMP, the secondary GaN crystal can be made into the secondary substrate (M-plane GaN substrate).

To fabricate the secondary substrate with a size in a c-axis direction of 10 mm or more, the secondary GaN crystal that is used as a material is desirably grown to 15 mm or more in a [000-1] direction. The present inventors have confirmed that, by growing the secondary GaN crystal according to the method described above, the secondary substrate having a 52 mm×52 mm rectangular principal surface can be fabricated. However, since the material of the secondary substrate is the secondary GaN crystal, the secondary substrate has low heat resistance and is not suitable as a substrate for epitaxially growing a nitride semiconductor by a vapor phase method such as a MOCVD method, an HVPE method, and the like.

(iii) Growth of Tertiary GaN Crystal and Fabrication of Tertiary Substrate (M-Plane GaN Substrate)

The tertiary GaN crystal to be used as a material of the tertiary substrate is grown by an ammonothermal method using the secondary substrate as a seed.

Raw material, a solvent, and a mineralizer which may be favorably used when growing the tertiary GaN crystal are the same as those used when growing the secondary GaN crystal. A usable crystal growth apparatus and favorable crystal growth conditions are also the same as those applicable to growing the secondary GaN crystal.

While a GaN crystal grows so as to cover an entire surface of the secondary substrate, the portion of the GaN crystal which can be favorably used as a material for the tertiary substrate is an M-face grown portion formed on a principal surface of the secondary substrate.

The use of an acidic mineralizer containing fluorine such as ammonium fluoride is particularly recommended when growing the tertiary GaN crystal. This mineralizer has an effect of significantly accelerating the rate of M-face growth of a GaN crystal. At present, no basic mineralizers enabling M-face growth of a GaN crystal at a practical rate have been developed.

A GaN crystal ammonothermally grown using a fluorine-contained acidic mineralizer contains fluorine and concentration thereof normally exceeds $1\times10^{15}$ cm$^3$.

The tertiary substrate (M-plane GaN substrate) is fabricated by slicing the tertiary GaN crystal parallel to an M-plane. The principal surface is planarized by lapping and/or grinding and then subjected to a CMP finish to remove a damage layer.

Figure 11A:
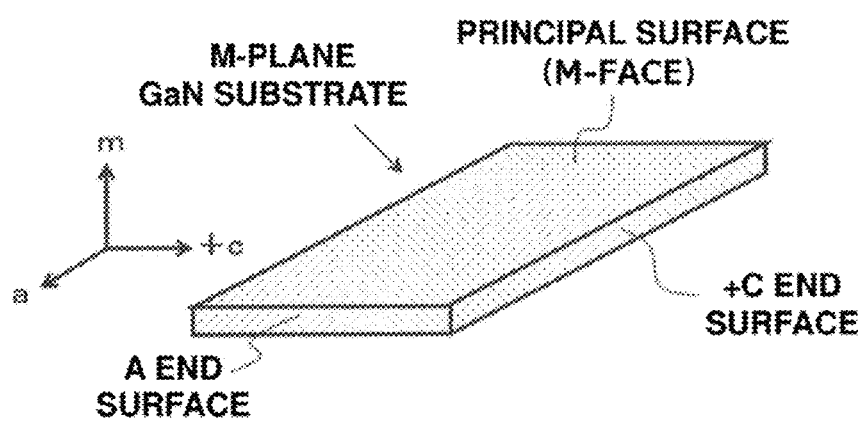
FIG. 11A is a perspective view illustrating a self-standing M-plane GaN substrate whose principal surface is rectangular and two sides among four sides constituting the rectangle are parallel to an a-axis of a GaN crystal and the other two sides are parallel to a c-axis of the GaN crystal.
Figure 11B:
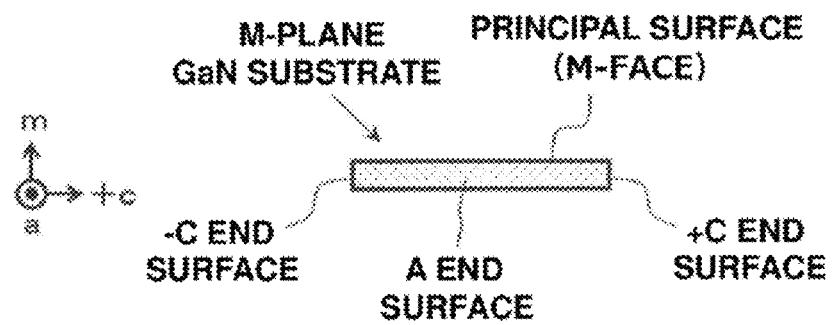
FIG. 11B is a side view of the self-standing M-plane GaN substrate as observed from the side of an A end surface.

The principal surface of the tertiary substrate is given a rectangular shape. Among four sides constituting the rectangle, two sides are arranged parallel to an a-axis and the other two sides are arranged parallel to a c-axis. Names of end surfaces of the tertiary substrate are defined as shown in FIGS. 11A and 11B. Specifically, an end surface positioned at an end portion in an a-axis direction is called an A end surface. In addition, among end surfaces positioned at end portions in a c-axis direction, an end surface on a +c side ([0001] side) is called a +C end surface and an end surface on a −c side ([000-1] side) is called a −C end surface. The +C end surface is a gallium polarity surface and the −C end surface is a nitrogen polarity surface.

Improving machining accuracy of the tertiary substrate and reducing variations of orientations of the principal surfaces and the end surfaces are extremely important for arranging a plurality of the tertiary substrates so that crystal orientations are aligned in the next step.

Specifically, regarding the principal surface of the tertiary substrate, deviations from respective design values of an a-axis direction component and a c-axis direction component of an off-angle are made to be within $10.2°$ and favorably within $\pm 0.1°$.

Similarly, regarding the orientations of the +C end surface and the −C end surface, deviations from design values with respect to an a-axis direction and a m-axis direction are respectively made to be within $\pm 0.2°$ and favorably within $\pm 0.1°$.

When necessary, deviations from design values of the orientation of the A end surface with respect to a c-axis direction and an m-axis direction are respectively made to be within $\pm 0.2°$ and favorably within $\pm 0.1°$.

(iv) Growth of Quaternary GaN Crystal and Fabrication of Self-Standing GaN Substrate The quaternary GaN crystal to be used as a material of the self-standing GaN substrate according to the first embodiment is grown by an HVPE method on an aggregated seed formed by arranging a plurality of tertiary substrates (M-plane GaN substrates).

Figure 12A:
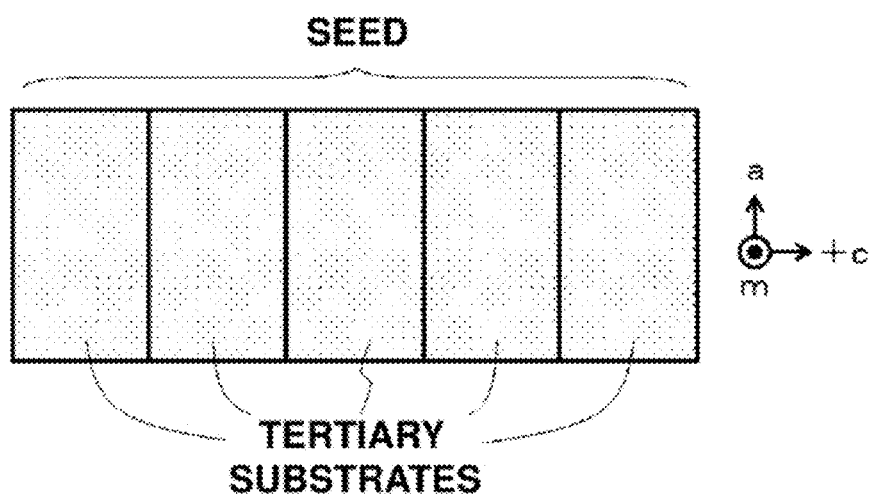
FIG. 12A is a plan view of an aggregated seed formed by arranging five M-plane GaN substrates side by side so that principal surfaces thereof face upward.

FIG. 12A is a plan view of an aggregated seed formed by arranging five tertiary substrates side by side so that principal surfaces thereof face upward. The tertiary substrates are arranged in an c-axis direction and, between adjacent tertiary substrates, the +C end surface of one tertiary substrate and the −C end surface of the other tertiary substrate are in contact with each other.

By improving orientation accuracy of the principal surface, the +C end surface, and the −C end surface of each tertiary substrate, crystal orientations of the plurality of tertiary substrates constituting the aggregated seed can be precisely matched with one another.

In an example, by arranging the tertiary substrates not only in a c-axis direction but also in an a-axis direction, an upper surface of the aggregated seed may be further expanded. In this case, favorably, orientation accuracy of the A end surface of each tertiary substrate is also improved.

Growth of a GaN crystal by an HVPE method can be performed using a vapor phase growth apparatus described previously of which a conceptual diagram is shown in FIG. 5. However, in this step, all of or approximately all of (99% or more) the carrier gas is to be constituted by nitrogen gas.

Figure 12B:
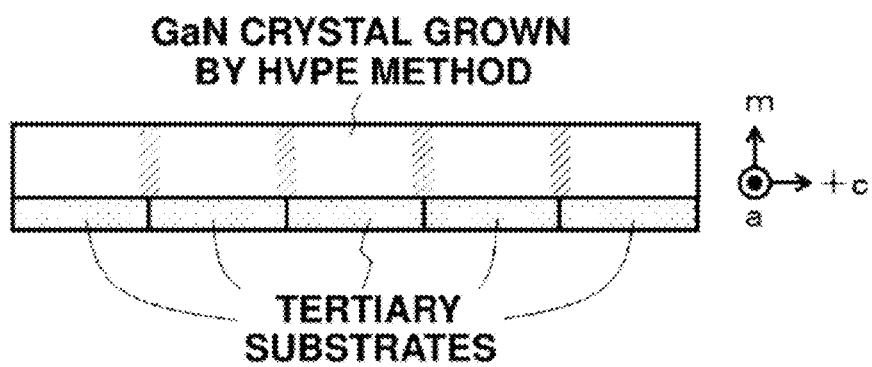
FIG. 12B is a sectional view showing a state where a GaN crystal grown by an HVPE method has covered the aggregated seed shown in FIG. 12A.

FIG. 12B is a sectional view showing a state where a GaN crystal grown by an HVPE method has covered the aggregated seed shown in FIG. 12A. As shown in FIG. 12B, a GaN crystal that collectively covers five tertiary substrates can be grown. In FIG. 12B, in a GaN crystal grown by an HVPE method, portions grown above boundaries between adjacent tertiary substrates are shown hatched. These portions tend to have a higher density of crystal defects such as dislocations and stacking faults than other portions.

When growing the quaternary GaN crystal by an HVPE method, in order that a step-flow growth mode occurs as early as possible in an initial stage, a two-step growth method including (a) a temperature-raising step, (b) a preliminary growth step, and (c) a main growth step described below in this order is favorably performed.

(a) Temperature-Raising Step

In the temperature-raising step, a susceptor temperature is raised from room temperature to $T_1$ without supplying gallium chloride to the seed. $T_1$ is favorably 830° C. or higher and 870° C. or lower. A temperature raising rate is favorably 12° C./min or higher and 30° C./min or lower. The temperature raising rate may remain constant through the duration of the temperature-raising step or be changed during the temperature-raising step.

An atmospheric gas that may be introduced into the growth furnace in the temperature-raising step is hydrogen gas, ammonia, nitrogen gas, or the like. Favorably, at least both ammonia and nitrogen gas are introduced. A volumetric flow rate of ammonia introduced into the growth furnace is favorably 15% or more of a sum of volumetric flow rates of all gases introduced into the growth furnace.

(b) Preliminary Growth Step

In the preliminary growth step, while epitaxially growing a GaN crystal by supplying gallium chloride and ammonia to the seed, the susceptor temperature is raised from $T_1$ to $T_2$. $T_2$ is favorably 940° C. or higher and 1200° C. or lower. A temperature raising rate is favorably 6° C./min or higher and 24° C./min or lower.

When the pressure in the growth furnace in the preliminary growth step is set to $1.0\times10^5$ Pa, GaCl partial pressure is favorably $2.0\times10^2$ Pa or higher and $5.0\times10^2$ Pa or lower and ammonia partial pressure is favorably $9.3\times10^3$ Pa or higher and $1.2\times10^4$ Pa or lower.

In the preliminary growth step and the next main growth step, all of or approximately all of (99% or more) the carrier gas supplied into the growth furnace is to be constituted by nitrogen gas.

(c) Main Growth Step

In the main growth step, gallium chloride and ammonia are supplied onto the seed while maintaining the susceptor temperature at $T_2$ and a GaN crystal is grown until a thick film is formed. The pressure in the growth furnace in the main growth step is favorably 50 kPa or higher and 120 kPa or lower.

When the pressure in the growth furnace in the main growth step is set to $1.0\times10^5$ Pa, GaCl partial pressure is favorably $1.5 \times 10^2$ Pa or higher and $5.0 \times 10^2$ Pa or lower and ammonia partial pressure is favorably $1.0 \times 10^3$ Pa or higher and $1.2 \times 10^4$ Pa or lower.

Figure 13:
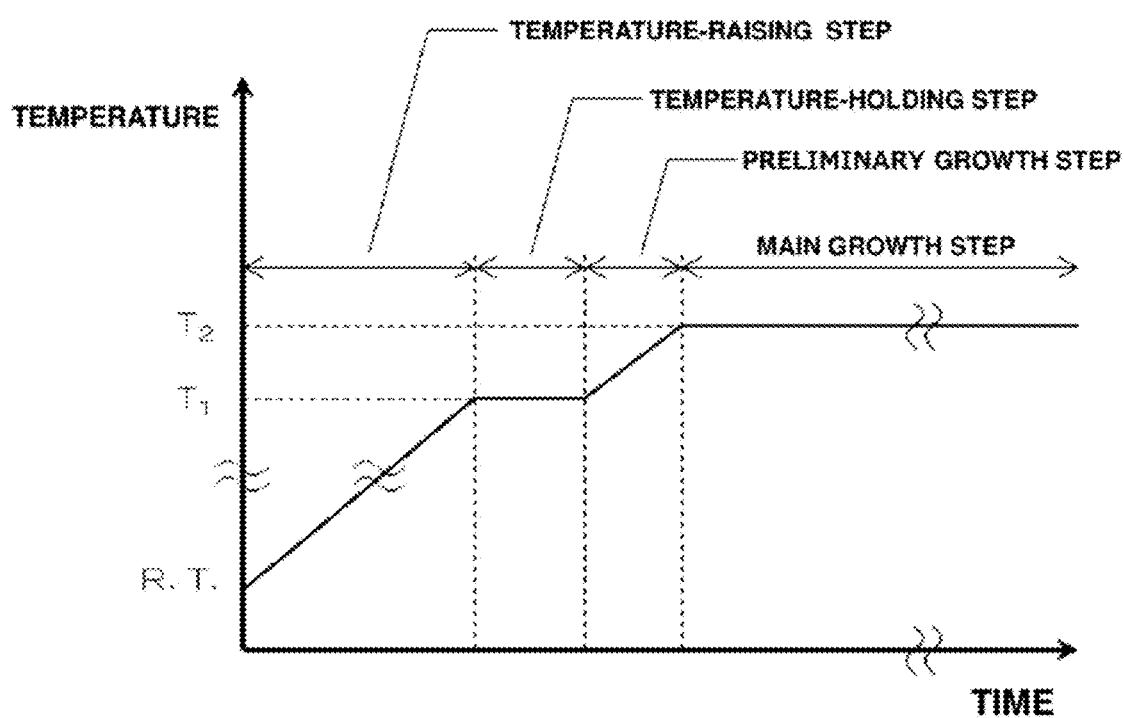
FIG. 13 shows an example of a profile of a susceptor temperature adoptable in a two-step growth method.

FIG. 13 shows an example of a profile of a susceptor temperature adoptable in the two-step growth method described above. In this example, a temperature-holding step is provided between the temperature-raising step and the preliminary growth step.

According to the two-step growth method, by starting crystal growth at the temperature $T_1$ that is lower than the susceptor temperature $T_2$ in the main growth step, a decomposition product of quartz constituting the growth furnace and the like is prevented from being adsorbed on a seed surface before the start of the main growth step. The present inventors consider that a decomposition product of quartz is adsorbed on a seed surface to reduce its wettability with GaN and delay the occurrence of a step-flow growth mode of GaN.

In the preliminary growth step and the main growth step, GaN can be grown while supplying doping gas.

As doping gas for oxygen doping, oxygen gas ($O_2$) or water ($H_2O$) can be favorably used. As doping gas for silicon doping, silane ($SiH_4$), disilane ($Si_2H_6$), chlorosilane ($SiH_3Cl$), dichlorosilane ($SiH_2Cl_2$), trichlorosilane ($SiHCl_3$), tetrachlorosilane ($SiCl_4$), tetrafluorosilane ($SiF_4$), or the like can be favorably used.

Instead of supplying doping gas, oxygen doping of a GaN crystal can also be performed using oxygen-containing gas that is generated by decomposition of quartz constituting the growth furnace and the like. As the temperature of quartz members during crystal growth rises, an amount of generated oxygen-containing gas increases and oxygen concentration in the GaN crystal rises. When the oxygen concentration in the GaN crystal must be kept low, a method described in Japanese Patent Application Laid-open No. 2012-066983 can be applied. Examples are as follows.

1) Arrange a liner tube made of high-purity pBN (pyrolytic boron nitride) inside a growth furnace, and by arranging a seed inside the liner tube, prevent oxygen-containing gas generated from the quartz growth furnace from coming to contact with the seed.

2) In 1) above, by causing high-purity nitrogen gas to flow as shielding gas between the growth furnace and the liner tube, the oxygen-containing gas generated from the quartz growth furnace can be more effectively prevented from coming to contact with the seed.

3) Provide a susceptor on which a seed is to be mounted with a local heating mechanism, and heat the seed using the local heating mechanism and heaters in combination. Accordingly, since heater power necessary to heat the susceptor to a prescribed temperature can be reduced, temperatures of the growth furnace and the like that are heated together with the seed by the heater can be lowered and, consequently, generation of oxygen-containing gas from these quartz members can be suppressed.

4) By inhibiting transmission of heat from heaters to a reservoir using means such as a thermal insulation plate, a temperature of the reservoir can be lowered and, consequently, an amount of oxygen-containing gas generated from the reservoir can be reduced.

A growth thickness of the quaternary GaN crystal is determined taking into consideration of a surface orientation of a self-standing GaN substrate to be fabricated. The thicker the quaternary GaN crystal, a GaN substrate with a larger angle between a principal surface thereof and an M-plane can be cut out.

The seed is separated from the quaternary GaN crystal by slicing or removed by grinding.

Types of processing performed when fabricating a self-standing GaN substrate from the quaternary GaN crystal are not limited. Necessary processing in accordance with required specifications of the substrate may be performed including core drilling, slicing, grinding, lapping, etching, CMP, and beveling.

Favorably, at least one of the principal surfaces of the self-standing GaN substrate is planarized so that RMS roughness is reduced to less than 1 nm to ensure that the self-standing GaN substrate can be favorably used for epitaxial growth. Planarization is favorably performed by, but not limited to, CMP.

While a damage layer is favorably removed from the principal surfaces, a method of removal is not limited and may be arbitrarily selected from known methods including CMP, dry etching, and wet etching.

<Second Method>

The self-standing GaN substrate according to the first embodiment can also be manufactured using the tertiary GaN crystal as referred to in the first method described above as a material.

Types of processing performed when fabricating the self-standing GaN substrate according to the first embodiment from the tertiary GaN crystal are not limited. Necessary processing in accordance with required specifications of the substrate may be performed including core drilling, slicing, grinding, lapping, etching, CMP, and beveling.

Because of using the tertiary GaN crystal as a material, the self-standing GaN substrate manufactured by the second method has good heat resistance and may be preferably used as a substrate for epitaxially growing a nitride semiconductor by a vapor phase method such as an MOCVD method and an HVPE method.

<Modified Method>

In the first method described above, the tertiary substrate is a M-plane GaN substrate.

In a modified method, when processing the tertiary GaN crystal to fabricate the tertiary substrate, an angle formed between a principal surface of the tertiary substrate and an m-axis is set to a relatively large angle. Simply put, a semipolar substrate such as a (30-31) substrate, a (30-3-1) substrate, a (20-21) substrate, and a (20-2-1) substrate is fabricated as the tertiary substrate.

When the tertiary substrate is a (30-31) substrate, a quaternary GaN crystal grows on the (30-31) substrate with a [30-31] direction as a thickness direction. This quaternary GaN crystal may be processed to fabricate a self-standing GaN substrate according to the first embodiment. While it is obvious that a (30-31) substrate and a (30-3-1) substrate may be fabricated, substrates that can be fabricated are not limited thereto. By changing a slicing or polishing direction, a self-standing GaN substrate with various surface orientations such as a (20-21) substrate and an M-plane substrate can be fabricated from the quaternary GaN crystal.

2.2. Second Embodiment 2.2.1. Self-Standing GaN Substrate

A feature of a self-standing GaN substrate according to the second embodiment is that an anomalous transmission image can be obtained by transmission X-ray topography.

Figure 14:
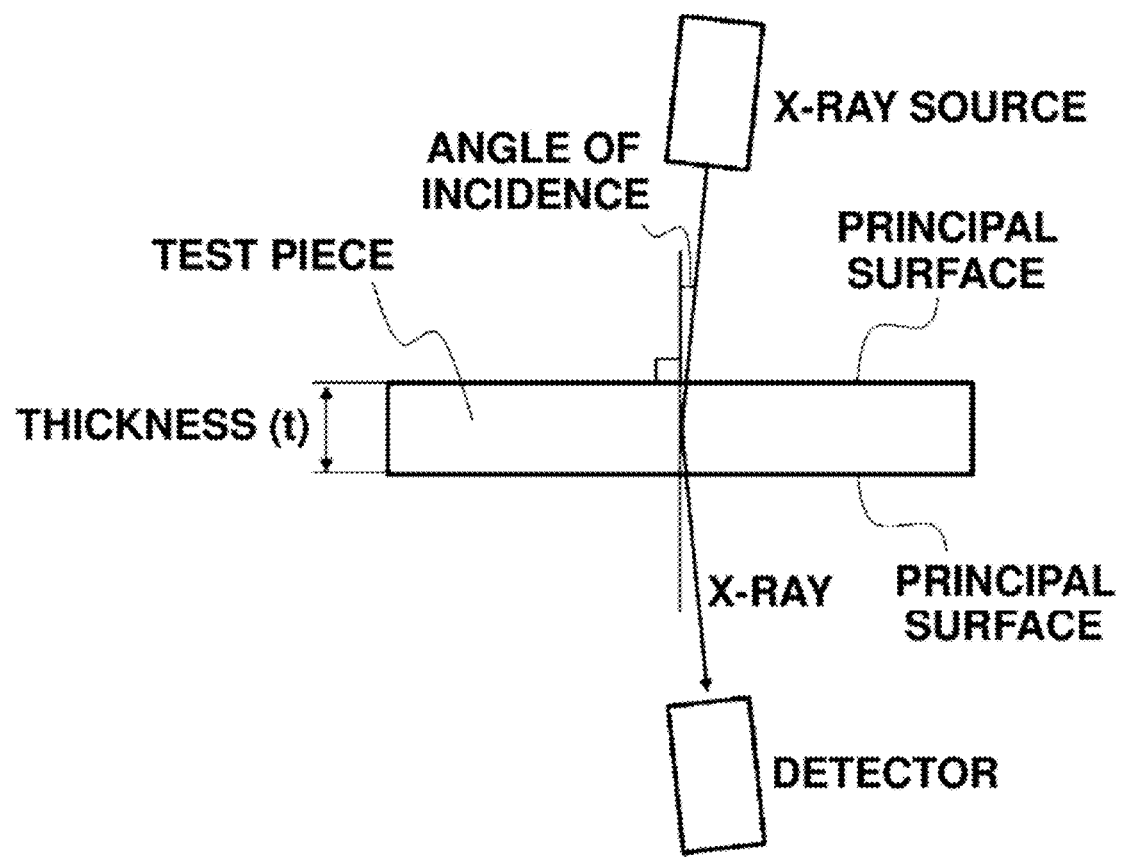
FIG. 14 is a diagram showing an arrangement of an X-ray source, a test piece, and a detector in transmission X-ray topography by Lang's method.

FIG. 14 is a diagram schematically showing an arrangement of an X-ray source, a test piece, and a detector in transmission X-ray topography by Lang's method. An X-ray source is arranged on the side of one principal surface of a plate-like test piece with a thickness of t, and an X-ray detector is arranged on the side of the other principal surface.

An anomalous transmission of an X-ray is also called a Borrmann effect and is a phenomenon where an X-ray is transmitted through a crystal that is normally too thick for the x-ray to transmit due to absorption. For example, when a transmission image is obtained from a GaN substrate with a thickness of 344 μm in X-ray topography using MoKα (wavelength 0.71073 Å) as an X-ray source, the image is an anomalous transmission image. This is because, an absorption coefficient μ of GaN is 290.40 ($cm^{-1}$) when the X-ray source is MoKα, therefore μt=10.0 when the thickness t of a GaN substrate is 344 μm, and a transmission image cannot be obtained under a condition of μt≥10.0 unless an anomalous transmission occurs.

This does not mean that transmission X-ray topography under a condition of μt≥10.0 is essential when distinguishing between a GaN substrate according to the second embodiment and other GaN substrates. A GaN substrate according to the second embodiment may be the one for which an anomalous transmission is observed in a transmission X-ray topographic image acquired under a condition of μt<10.0.

Since an anomalous transmission is not observed when the perfection of a crystal is low, the fact that an anomalous transmission image is obtained in X-ray topography proves that the quality of the crystal is extremely high. While X-ray topographic analysis using anomalous transmission is already being performed with respect to single crystals of Si and GaAs [for example, refer to J. R. Patel, Journal of Applied Physics, Vol. 44, pp. 3903-3906 (1973) or P. Mock, Journal of Crystal Growth, Vol. 224, pp. 11-20 (2001)], to the best of the knowledge of the present inventors, cases where X-ray anomalous transmission is observed have not yet been reported with respect to a GaN crystal.

Favorably, with the self-standing GaN substrate according to the second embodiment, the size of the projected image when a principal surface thereof is vertically projected on an M-plane is a 10 mm square or more.

Favorably, with the self-standing GaN substrate according to the second embodiment, when the principal surface thereof is vertically projected on the M-plane, the size of the projected image in a c-axis direction is 15 mm or more and the size of the projected image in an a-axis direction is 25 mm or more.

When producing a self-standing GaN substrate for which an anomalous transmission image is obtained by X-ray topography, it is favorable to provide an inspection process including transmission X-ray topography using anomalous transmission as a test item. By deeming a product in which an unacceptable defect is found in the inspection process a defective product, only products with particularly preferable crystal quality can be shipped.

2.2.2. Manufacturing Method of Self-Standing GaN Substrate

The present inventors have confirmed that the self-standing GaN substrate according to the second embodiment can be fabricated using the manufacturing method described previously in 2.1.2. In other words, the self-standing GaN substrate according to the second embodiment may be a self-standing GaN substrate constituted by a GaN crystal grown by an HVPE method.

Otherwise, the self-standing GaN substrate according to the second embodiment can be fabricated from the tertiary GaN crystal as referred to in the manufacturing method of a self-standing GaN substrate described previously in 2.1.2.

2.3. Third Embodiment 2.3.1. Self-Standing GaN Substrate

A feature of a self-standing GaN substrate according to the third embodiment is that a dislocation density in an effective region of the principal surface is less than $4 \times 10^5$ $cm^{-2}$. The dislocation density in an effective region of the principal surface as described herein means a dislocation density obtained by dividing a total number of dislocations existing in the effective region by an area of the effective region, the effective region being a region excluding portions at a distance of 2 mm or less from a substrate end surface, of the principal surface. The reason why portions at a distance of 2 mm or less from a substrate end surface are removed is because an outer peripheral portion of a substrate is likely to retain defects attributable to mechanical processing of a crystal. Normally, in order to eliminate the effect of remaining defects, a region excluding an outer peripheral portion is used to form a semiconductor device. It is needless to say that, preferably, the outer peripheral portion also has a low defect density.

In a self-standing GaN substrate according to the third embodiment, the dislocation density in the effective region of the principal surface is favorably less than $1 \times 10^5$ $cm^{-2}$ and more favorably less than $4 \times 10^4$ $cm^{-2}$.

Dislocations on the principal surface of a GaN substrate can be observed as dark spots by a usual cathode luminescence (CL) method. Therefore, the dislocation density as used herein can be described as a density of dark spots observed by a CL method.

With a GaN substrate having high parallelism between the principal surface and an M-plane, by etching the principal surface with heated sulfuric acid, an etch pit with a size that is even detectable by an optical microscope can be formed at locations where dislocations exist. Typical etching conditions include a sulfuric acid concentration of 85 to 90 wt %, a temperature of 265 to 275° C., and an etching time of 45 to 90 minutes. The present inventors have confirmed that a density of etch pits formed by the heated sulfuric acid etching described above has a higher degree of coincidence with a dark spot density obtained by CL measurement as compared to other methods. The number of dislocations existing on the principal surface of a substrate can also be obtained by counting the number of etch pits. In this case, using an optical microscope is convenient because a wide field of view can be observed.

Favorably, with a self-standing GaN substrate according to the third embodiment, the size of the projected image when the principal surface thereof is vertically projected on an M-plane is a 10 mm square or more.

Favorably, with a self-standing GaN substrate according to the third embodiment, when the principal surface thereof is vertically projected on an M-plane, the size of the projected image in a c-axis direction is 15 mm or more and the size of the projected image in an a-axis direction is 25 mm or more.

2.3.2. Manufacturing Method of Self-Standing GaN Substrate

A material of the self-standing GaN substrate according to the third embodiment is, for example, the tertiary GaN crystal as referred to in the manufacturing method of a self-standing GaN substrate described previously in 2.1.2.

While there are variations in dislocation density of a self-standing GaN substrate obtained by processing the tertiary GaN crystal, even when such variations are taken into consideration, the dislocation density in the effective region of the principal surface rarely equals or exceeds $4 \times 10^5$ cm$^{-2}$. Although portions with high dislocation density and portions with low dislocation density are often formed on the principal surface with the substrate whose dislocation density is high, in such a case, an average dislocation density in a 200 μm×200 μm region contained in the portion with high dislocation density is around $4 \times 10^5$ cm$^{-2}$ at the maximum.

Although high yield is yet to be achieved, the substrate with a dislocation density in the effective region of the principal surface of $1 \times 10^4$ cm$^{-2}$ has been produced. From what is known to date, for example, the smaller an off-angle of a principal surface of a seed used when growing the tertiary GaN crystal or, in other words, the higher the parallelism between the principal surface of the seed and an M-plane, the lower the dislocation density of the tertiary GaN crystal.

There are variations in crystallinity even in a single piece of the tertiary GaN crystal. For example, a portion near an outermost surface tends to have a higher dislocation density than a portion near a seed (the secondary substrate described previously). Therefore, in order to fabricate a self-standing substrate with a lower dislocation density, a portion relatively near the seed in the tertiary GaN crystal is desirably used as a material. However, there is a case where a portion adjacent to the seed has low heat resistance.

Types of processing performed when fabricating the self-standing GaN substrate according to the third embodiment from the tertiary GaN crystal are not limited. Necessary processing in accordance with required specifications of the substrate may be performed including core drilling, slicing, grinding, lapping, etching, CMP, and beveling.

2.4. Fourth Embodiment

2.4.1. Self-Standing GaN Substrate

A feature of a self-standing GaN substrate according to the fourth embodiment is that a stacking fault density in an effective region of the principal surface is less than 15 cm$^{-1}$. The stacking fault density in an effective region of the principal surface as described herein means a stacking fault density obtained by dividing a total length of stacking faults existing in an effective region by an area of the effective region, the effective region being a region excluding portions at a distance of 2 mm or less from a substrate end surface, of the principal surface.

In the self-standing GaN substrate according to the fourth embodiment, the stacking fault density in the effective region of the principal surface is favorably less than 5 cm$^{-1}$ and more favorably less than 1 cm$^{-1}$.

A total length of stacking faults on a principal surface of a GaN substrate can be obtained by growing a GaN thin film by an MOCVD method on the principal surface and observing a surface of the thin film by an optical microscope. For example, the GaN thin film may be grown to a thickness of 2 μm using nitrogen gas as carrier gas and under conditions including an ammonia flow rate of 10 slm, a trimethyl gallium supply rate of 206 μmol/min, pressure of 12.5 kPa, and a substrate temperature of 1040° C.

Since a step is formed in correspondence to a stacking fault on the surface of the GaN thin film, a length of the stacking fault can be obtained by measuring a length of the step by optical microscope observation.

Favorably, with the self-standing GaN substrate according to the fourth embodiment, the size of the projected image when the principal surface thereof is vertically projected on an M-plane is a 10 mm square or more.

Favorably, with the self-standing GaN substrate according to the fourth embodiment, when the principal surface thereof is vertically projected on an M-plane, the size of the projected image in a c-axis direction is 15 mm or more and the size of the projected image in an a-axis direction is 25 mm or more.

2.4.2. Manufacturing Method of Self-Standing GaN Substrate

A material of the self-standing GaN substrate according to the fourth embodiment is, for example, the tertiary GaN crystal as referred to in the manufacturing method of a self-standing GaN substrate described previously in 2.1.2.

With a GaN crystal, the lower the parallelism between a growth direction thereof and a c-axis, the higher the likelihood of an occurrence of a stacking fault. This tendency is not limited to vapor phase growth and similarly applies to an ammonothermal method.

However, because of being grown on a seed (secondary substrate) fabricated from the secondary GaN crystal with an extremely low level of distortion, the tertiary GaN crystal has a very low stacking fault density despite the parallelism between the growth direction and the c-axis being low.

While there are variations in stacking fault density of a self-standing GaN substrate obtained by processing the tertiary GaN crystal, even when such variations are taken into consideration, the stacking fault density in the effective region of the principal surface rarely equals or exceeds 15 cm$^{-1}$.

Although high yield is yet to be achieved, an M-plane substrate with a stacking fault density in the effective region of the principal surface of 0.05 cm$^{-1}$ has been produced.

Even a single tertiary GaN crystal has variations in crystallinity. For example, a portion near an outermost surface tends to have a higher stacking fault density than a portion near a seed (the secondary substrate described earlier). Therefore, in order to fabricate a self-standing substrate with fewer stacking faults, a portion relatively near the seed in the tertiary GaN crystal is desirably used as a material. However, there is a case where a portion adjacent to the seed has low heat resistance.

Types of processing performed when fabricating the self-standing GaN substrate according to the fourth embodiment from the tertiary GaN crystal are not limited. Necessary processing in accordance with required specifications of the substrate may be performed including core drilling, slicing, grinding, lapping, etching, CMP, and beveling.

3. Use of Self-Standing GaN Substrate

3.1. Seed Crystal

The self-standing GaN substrate according to the present invention may be used as a seed for epitaxially growing a nitride semiconductor.

In an example, a GaN single crystal may be obtained by epitaxially growing GaN by an arbitrary method on the self-standing GaN substrate according to the present invention. This GaN single crystal may be a bulk single crystal.

In another example, a first GaN single crystal may be fabricated by epitaxially growing GaN using the self-standing GaN substrate according to the present invention as a seed and, subsequently, a second GaN single crystal may be fabricated by epitaxially growing GaN using a part of or all of the first GaN single crystal as a seed. This second GaN single crystal may be a bulk single crystal.

In yet another example, by growing a bulk GaN single crystal by an ammonothermal method or the like using the self-standing GaN substrate according to the present invention as a seed and subsequently slicing the bulk GaN single crystal including the seed, a GaN substrate including a seed portion can be fabricated.

3.2. Semiconductor Device

The self-standing GaN substrate according to the present invention may also be used to manufacture a semiconductor device. Normally, one or more types of nitride semiconductors are epitaxially grown on the self-standing GaN substrate according to the present invention to form a device structure. As an epitaxial growth method, an MOVCD method, an MBE method, a pulsed deposition method, or the like suitable for forming a thin film may be favorably used.

Specific examples of a semiconductor device include a light-emitting device such as a light-emitting diode and a laser diode, an electronic device such as a rectifier, a bipolar transistor, a field effect transistor, and an HEMT (High Electron Mobility Transistor), a semiconductor sensor such as a temperature sensor, a pressure sensor, a radiation sensor, and a visible-ultraviolet light detector, and the like.

Furthermore, the self-standing GaN substrate according to the present invention may also be applied to use including a SAW (Surface Acoustic Wave) device, a vibrator, a resonator, an oscillator, a MEMS (Micro Electro Mechanical System) component, a voltage actuator, and an electrode for an artificial photosynthesis device.

3.3. GaN Layer-Bonded Substrate

A GaN layer-bonded substrate may be manufactured using the self-standing GaN substrate according to the present invention as a material.

A GaN layer-bonded substrate refers to a composite substrate in which a GaN layer is bonded to a hetero-composition substrate with a different chemical composition from GaN and can be used to manufacture a light-emitting device and other semiconductor devices.

Typically, a GaN layer-bonded substrate is manufactured by executing, in this order, the steps of: implanting ions in a vicinity of a principal surface of a GaN substrate; bonding the principal surface side of the GaN substrate to a hetero-composition substrate; and forming a GaN layer bonded to the hetero-composition substrate by separating the GaN substrate at the ion-implanted region as a boundary.

Therefore, when the self-standing GaN substrate according to the present invention is used as a material, a GaN layer-bonded substrate is obtained having a structure in which a GaN layer separated from the self-standing GaN substrate according to the present invention is bonded to a hetero-composition substrate.

When used as a material of a GaN layer-bonded substrate, an initial thickness of the self-standing GaN substrate according to the present invention may be 1 mm or more, 2 mm or more, or 4 mm or more.

Examples of hetero-composition substrates that may be used to manufacture a GaN layer-bonded substrate include a sapphire substrate, an AlN substrate, a SiC substrate, a ZnSe substrate, a Si substrate, a ZnO substrate, a ZnS substrate, a quartz substrate, a spinel substrate, a carbon substrate, a diamond substrate, a $Ga_2O_3$ substrate, a $ZrB_2$ substrate, a Mo substrate, and a W substrate.

Details of a structure, a manufacturing method, use, and the like of a GaN layer-bonded substrate are described in Japanese Patent Application Laid-open No. 2006-210660, Japanese Patent Application Laid-open No. 2011-44665, and the like.

4. Experimental Results

4.1. Experiment 1

4.1.1. Fabrication of Self-Standing GaN Substrate

[1] Growth of Primary GaN Crystal and Fabrication of Primary Substrate

A GaN crystal (primary GaN crystal) was grown by an HVPE method on a sapphire-based C-plane GaN template with a striped mask pattern for ELO formed on a principal surface thereof. Next, a C-plane GaN substrate (primary substrate) with a rectangular principal surface having vertical and horizontal sides respectively parallel to an a-axis and an m-axis was fabricated from the GaN crystal. A nitrogen polarity surface of the C-plane GaN substrate was made into a flat surface with no damage layer by performing a CMP finish.

[2] Growth of Secondary GaN Crystal and Fabrication of Secondary Substrate

A growth mask with a stripe pattern having 100 µm-wide linear openings at a period of 1100 µm was formed with a TiW alloy on the nitrogen polarity surface of the primary substrate fabricated in [1] above. A longitudinal direction of the openings or, in other words, a stripe direction was arranged parallel to the a-axis.

After forming the growth mask, a GaN crystal (secondary GaN crystal) was grown by an ammonothermal method using the primary substrate as a seed. Polycrystalline GaN manufactured by a method of causing a vapor phase reaction of $NH_3$ and GaCl was used as a raw material and ammonium fluoride ($NH_4F$) and hydrogen iodide (HI) were used as mineralizers.

Charge amounts of $NH_4F$ and HI were determined so that a molar ratio of fluorine atoms to $NH_3$ was 0.5 to 1.5%, a molar ratio of iodine atoms to $NH_3$ was 1.5 to 3.5% and, a molar ratio of fluorine atoms to iodine atoms was 0.2 to 0.5.

Growth conditions included setting an average temperature inside a growth vessel (an average value of temperatures in a crystal growth zone and a raw material dissolving zone) to 590 to 615° C., a difference in temperatures between the crystal growth zone and the raw material dissolving zone to 10 to 25° C., and pressure inside the growth vessel to 200 to 220 MPa. A growth period was set to a total of 58 days or more excluding time required for replacing growth vessels for regrowth.

A structure shown in FIG. 9 was formed by the GaN crystal ammonothermally grown on the primary substrate. From a portion grown in a wall shape on each opening of the growth mask in the grown GaN crystal (secondary GaN crystal), an M-plane GaN substrate (secondary substrate) with a length of 50 to 54 mm, a width of 8 to 11 mm, and a thickness of 280 to 320 µm and having a rectangular principal surface with a long side parallel to an a-axis and a short side parallel to a c-axis was fabricated. Both principal surfaces of the secondary substrate were subjected to a CMP finish.

[3] Growth of Tertiary GaN Crystal and Fabrication of Tertiary Substrate

A GaN crystal (tertiary GaN crystal) was further grown by an ammonothermal method using the secondary substrate fabricated in [2] above as a seed.

For this second ammonothermal growth, the charge amount of the mineralizer were set such that molar ratios of fluorine atoms and iodine atoms to $NH_3$ were respectively 0.5% and 1.5%. In addition, the average temperature inside the growth vessel was set to 600 to 611° C., the difference in temperatures between the crystal growth zone and the raw material dissolving zone was set to 9 to 13° C., and the growth period was set to 15 days or more.

From the tertiary GaN crystal obtained as a result of the second ammonothermal growth, an M-plane GaN substrate (tertiary substrate) with a length of 41 to 59 mm, a width of 5 to 11 mm, and a thickness of 330 µm and having a rectangular principal surface with a long side parallel to an a-axis and a short side parallel to a c-axis was fabricated.

Among the two principal surfaces of the tertiary substrate, a side to be used for epitaxial growth of a quaternary GaN crystal in a next step (front surface) was given an off-angle of −2° in a [0001] direction. The accuracies of a [0001] direction component and a [11-20] direction component of the off-angle were respectively set to 10.1°.

Furthermore, four end surfaces of the tertiary substrate were also formed at similar accuracy. In other words, a +C end surface and a −C end surface were arranged parallel to a C-plane and respectively given inclinations within ±0.1° in a [10-10] direction and a [11-20] direction. A end surfaces were arranged parallel to an A-plane and respectively given inclinations within ±0.1° in a [0001] direction and a [10-10] direction.

In order to ensure the accuracies described above, for each end surface, a procedure was performed involving confirming an orientation using an X-ray diffractometer every time the GaN crystal was cut by a dicing saw for forming an end surface, and when a deviation from a design orientation was outside a permissible range, adjusting a direction of the work and once again cutting the work.

The principal surfaces of the tertiary substrate were finished by a CMP process.

With respect to the front surface of the tertiary substrate, observation of basal plane dislocations by a normal temperature cathode luminescence method (SEM-CL method: an acceleration voltage of 3 kV, a beam current of 100 pA, and an observation area of 0.09 mm×0.12 mm) and observation of stacking faults by a low temperature cathode luminescence method (SEM-CL method: an acceleration voltage of 10 kV, a beam current of 4 nA, an observation area of 0.45 mm×0.59 mm, and a sample temperature of 82 K) were performed. For both measurements, 7 to 10 points (5 mm intervals) on a straight line parallel to the a-axis were selected as measurement points. However, neither basal plane dislocations nor stacking faults were detected.

[4] Growth of Quaternary GaN Crystal and Fabrication of Self-Standing M-Plane GaN Substrate A GaN crystal was grown by an HVPE method using an aggregated seed prepared by aligning seven tertiary substrates fabricated in [3] above side by side in a c-axis direction with their front surfaces facing upward. The seven tertiary substrates were closely aligned so that, between two adjacent substrates, the +C end surface of one substrate came into contact with the −C end surface of the other substrate.

When growing the GaN crystal, the two-step growth method described earlier was used. In other words, at first, while only supplying nitrogen gas and ammonia to the seed, a susceptor temperature was raised to 850° C. (temperature-raising step) and the temperature was maintained for 5 seconds (temperature-holding step).

Next, by supplying hydrogen chloride diluted by nitrogen gas to a reservoir holding metallic gallium and heated to 800° C., supply of gallium chloride to the seed was started and, at the same time, the susceptor temperature was raised at a rate of 6.5° C./minute (preliminary growth step).

After the susceptor temperature had reached 1060° C., gallium chloride and ammonia were supplied onto the seed while keeping the temperature constant to grow GaN for 97 hours (main growth step).

After the start of the temperature-raising step until the end of the main growth step, pressure inside the growth furnace was controlled at $1.0×10^5$ Pa, GaCl partial pressure was controlled at $2.1×10^2$ Pa, and ammonia partial pressure was controlled at $5.7×10^3$ Pa. Carrier gas supplied into the growth furnace was entirely constituted by nitrogen gas.

The grown GaN crystal collectively covered the seven tertiary substrates and the thickness thereof was 6.8 mm at a central portion of the seed. The thickness of the GaN crystal decreased from the central portion toward an outer peripheral portion of the aggregated seed and was 4.5 mm at the portion near the +c side ([0001] side) end and 5.5 to 6.2 mm at the portion near the −c side ([000-1] side) end.

From a portion of the GaN crystal at a distance of approximately 1 mm from a seed surface, a self-standing M-plane GaN substrate with a length of 50 mm, a width of 25 mm, and a thickness of 346 µm and having a rectangular principal surface with a long side parallel to an a-axis and a short side parallel to a c-axis was cut out. The principal surface on the X-ray incident side in the X-ray analysis performed later was given an off-angle of −2.0°±0.1° in a [0001] direction and 0.00° 0.1° in a [−12-10] direction. The principal surface was first planarized by lapping and then subjected to a CMP finish for further planarization and removal of a damage layer.

4.1.2. Evaluation of Self-Standing GaN Substrate

[1] a-Axis Length and c-Axis Length

In order to study a distortion distribution in the self-standing GaN substrate fabricated in 4.1.1 [4] above, an lattice spacing measurement was performed using a high-resolution X-ray diffractometer [PANalytical X'Pert Pro MRD manufactured by Spectris Co., Ltd.].

In the X-ray diffraction measurement, using an optical system including a divergence slit, a mirror for increasing beam parallelism, and a Ge (220) asymmetric 2-bounce monochromator, only a CuKα1 line was extracted and used from a line-focused X-ray beam emitted by an X-ray tube. A beam shape was adjusted using a pinhole collimator so that a full-width at half-maximum of a Gaussian function approximation on a sample surface was 100 µm in a horizontal direction and 400 µm in a vertical direction.

The M-plane GaN substrate was fixed to a sample stage so that the c-axis direction was horizontal and the a-axis direction was vertical. Then, X-rays were made incident to the principal surface of the sample to perform a 2θ-ω scan of a (300) plane and a (20-3) plane every 250 µm on a straight line parallel to a c-axis direction.

When performing the 2θ-ω scan, a Ge (220) 3-bounce monochromator (a so-called analyzer) and a proportional counter detector were used on a light-receiving side. To prevent temperature fluctuations from affecting the measurements, the temperature inside a housing of the X-ray diffractometer was controlled within 24.5 t 1° C. The origin of 2θ was calibrated upon start of measurement and checked for deviations at the end of the measurement.

With respect to lattice spacing, XRD analysis software [PANalytical X'Pert Epitaxy] manufactured by Spectris Co., Ltd. was used to fit a spectrum of the 2θ-ω scan by a Gaussian function to obtain a peak, and the lattice spacing was derived by a calculation based on dynamical theory from the value of the peak.

Measurements of lattice spacing were performed with respect to the (300) plane and the (20-3) plane. The (300) plane was selected because, compared to a (100) plane, 2θ is measured at a higher angle side and, consequently, a measurement with higher angular resolution can be performed.

An a-axis length was obtained from the (300) lattice spacing and a c-axis length was calculated based on the (300) lattice spacing and the (20-3) lattice spacing.

The a-axis length was obtained by expression (1) below from the (300) lattice spacing.

$$a = 2\sqrt{3} \times d_{(300)} \times (1+\alpha_1) \tag{1}$$

The respective symbols used in expression (1) signify the following:
a: a-axis length [Å]
$\alpha_1$: $2.52724 \times 10^{-5}$ (correction coefficient)
$d_{(300)}$: (300) lattice spacing (measured value) [Å]

The c-axis length was obtained by expressions (2) and (3) below from the (300) lattice spacing and the (20-3) lattice spacing.

$$c = \frac{3}{\sqrt{\left(\frac{1}{M}\right)^2 - \left(\frac{4}{\sqrt{3} \times a}\right)^2}} \tag{2}$$

$$M = d_{(20\text{-}3)} \times (1+\alpha_2) \tag{3}$$

The respective symbols used in expressions (2) and (3) signify the following:
c: c-axis length [Å]
$\alpha_2$: $1.10357 \times 10^{-4}$ (correction coefficient)
$d_{(20\text{-}3)}$: (20-3) lattice spacing (measured value) [Å]

$\alpha_1$ in expression (1) and $\alpha_2$ in expression (3) are, respectively, correction coefficients for refraction correction of the values of the a-axis length and the c-axis length. The correction coefficients were calculated by referring to "The Study of Imperfections in Semiconductor Single Crystals by Precise Measurements of Lattice Parameters" by Yasumasa Okada in "Researches of Electrotechnical Laboratory" Volume 913 (June 1990) (ISSN: 0366-9106) and using expression (4) below.

$$\alpha = \frac{(4.48 \times 10^{-7}) \times n_0 \lambda^2 \cos\mu}{\sin(\theta+\mu) \cdot \sin(\theta-\mu)} \tag{4}$$

The respective symbols used in expression (4) signify the following:
$n_0$: the number of electrons per 1 $nm^3$ of crystal
$\lambda$: wavelength of X-ray
$\theta$: angle of incidence
$\mu$: angle between crystal surface and diffraction plane Results of measurements of the a-axis length and the c-axis length on the principal surface of the M-plane GaN substrate fabricated in 4.1.1 [4] above taken every 250 μm on a straight line along a c-axis direction are respectively shown in FIGS. 15 and 16.

Figure 15:
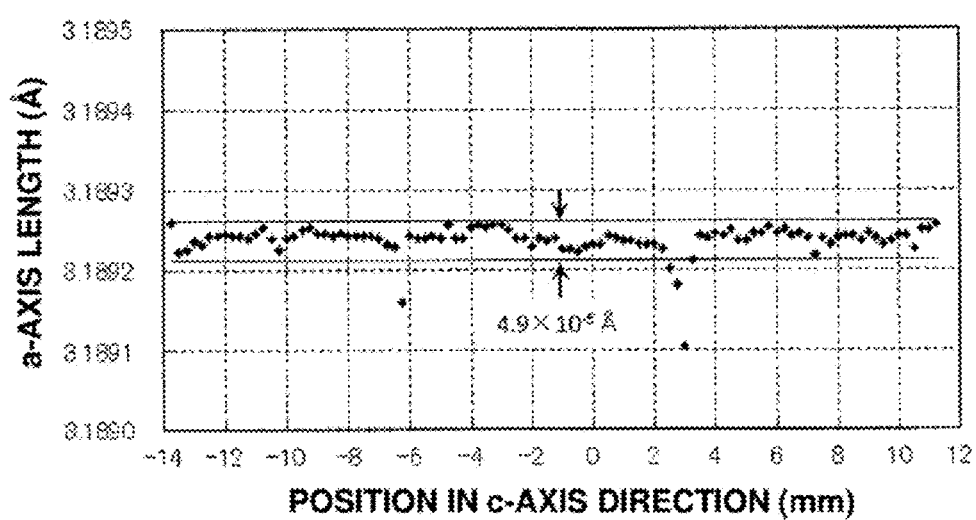
FIG. 15 is a graph showing a result of measurements of an a-axis length on a principal surface of an M-plane GaN substrate taken every 250 μm on a straight line parallel to a c-axis.

As shown in FIG. 15, a variation width of the a-axis length was $4.9 \times 10^{-5}$ Å in all sections excluding two exceptional sections. The exceptional sections were a section with a c-axis direction position of −6.5 mm to −6 mm and a section with a c-axis direction position of 2.25 mm to 3.5 mm. The exceptional sections corresponded to portions constituted by GaN crystals having grown above boundaries between adjacent tertiary substrates and exhibited a large local variation in the a-axis length. Lengths of both exceptional sections were less than 1.5 mm.

Figure 16:
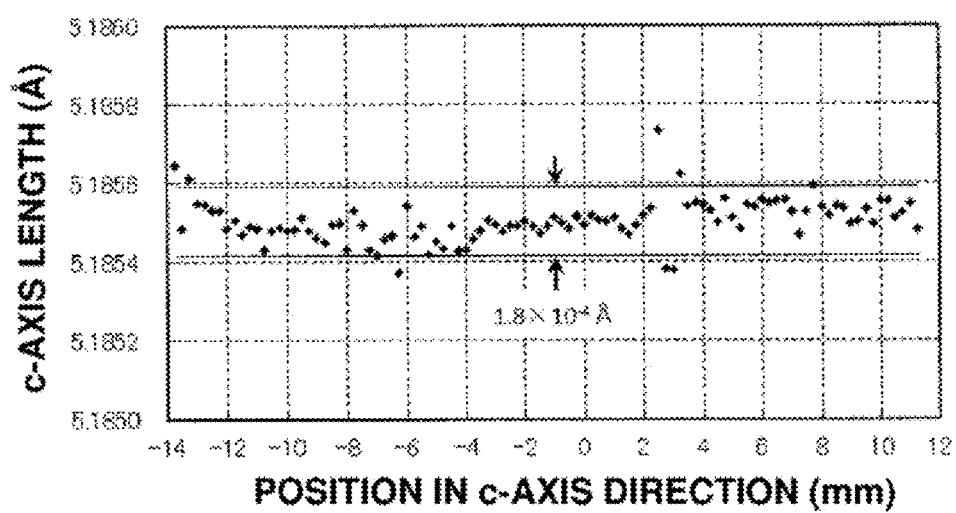
FIG. 16 is a graph showing a result of measurements of a c-axis length on a principal surface of an M-plane GaN substrate taken every 250 μm on a straight line parallel to a c-axis.

As shown in FIG. 16, a variation width of the c-axis length was $1.8 \times 10^{-4}$ Å in all sections excluding end portions and two exceptional sections. The exceptional sections were a section with a c-axis direction position of −6.5 mm to −6 mm and a section with a c-axis direction position of 2.25 mm to 3.5 mm. The exceptional sections corresponded to portions constituted by GaN crystals having grown above boundaries between adjacent tertiary substrates and exhibited a large local variation in the c-axis length. Lengths of both exceptional sections were less than 2 mm.

A relationship between a variation width of the a-axis length and a variation width of (300) lattice spacing will now be described. Since the relationship between the a-axis length (after refraction correction) and (300) lattice spacing (measured value) is as represented by expression (1) above, a variation in the a-axis length of $10.0 \times 10^{-5}$ Å or less means that a variation width of (300) lattice spacing is less than $2.9 \times 10^{-5}$ Å.

[2] X-Ray Rocking Curve

With respect to the M-plane GaN substrate used in the lattice spacing measurement of 4.1.2. [1] above (the M-plane GaN substrate fabricated in 4.1.1. [4] above), X-ray rocking curves of a (300) plane and a (030) plane were measured every 250 μm on a straight line parallel to the c-axis using the same high-resolution X-ray diffractometer as used in the lattice spacing measurement.

While the result of the measurement of X-ray rocking curve of the (300) plane showed that w was discontinuous between GaN crystals respectively grown on two adjacent tertiary substrates, discontinuity Δω was only around 0.01°.

In addition, while the result of the measurement of X-ray rocking curve of the (030) plane also showed that w was discontinuous between GaN crystals respectively grown on two adjacent tertiary substrates, discontinuity Δω was only 0.015°.

These results signify that, when observed from a GaN crystal grown on a given tertiary substrate, an orientation of a GaN crystal formed on an adjacent tertiary substrate is only inclined by about 0.01° around the c-axis as a center of rotation and only inclined by about 0.015° around the m-axis as a center of rotation.

This is conceivably a manifestation of the effect of improving orientation accuracies of the principal surface, the +C end surface, and the −C end surface of the tertiary substrates.

[3] X-ray rocking curve full-width at half-maximum (XRC-FWHM)

With respect to the M-plane GaN substrate used in the lattice spacing measurement of 4.1.2. [1] above (the M-plane GaN substrate fabricated in 4.1.1. [4] above), an X-ray rocking curve full-width at half-maximum (XRC-FWHM) of a (300) plane on the principal surface was measured every 250 μm on a straight line parallel to the c-axis using the same high-resolution X-ray diffractometer as used in the lattice spacing measurement. Results thereof are shown in FIG. 17.

Figure 17:
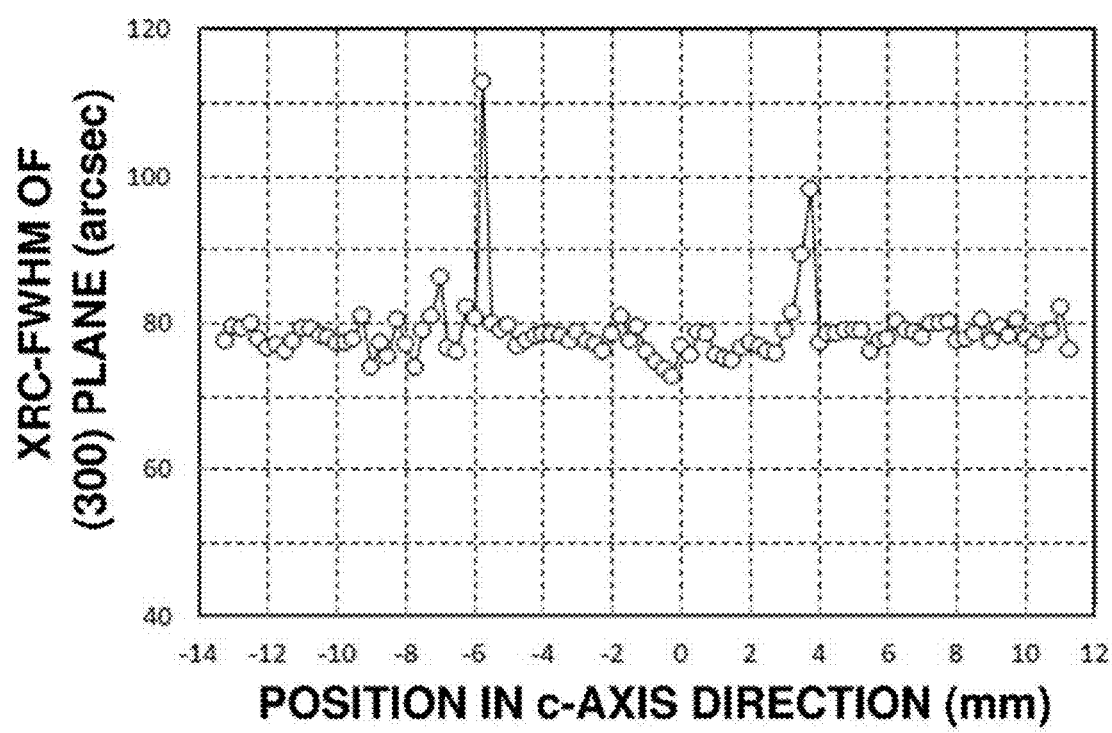
FIG. 17 is a graph showing a result of measurements of an X-ray rocking curve full-width at half-maximum (XRC-FWHM) of a (300) plane on a principal surface of an M-plane GaN substrate taken every 250 μm on a straight line parallel to a c-axis.

As shown in FIG. 17, the XRC-FWHM was less than 85 arcsec excluding two exceptional sections. The exceptional sections were a section with a c-axis direction position of −7.25 mm to −5.5 mm and a section with a c-axis direction position of 3.25 mm to 4 mm. In these exceptional sections, a variation in the XRC-FWHM increased and spots where the value of the XRC-FWHM was prominently high were observed. These exceptional sections corresponded to portions constituted by GaN crystals having grown above boundaries between adjacent tertiary substrates.

A variation width of the XRC-FWHM was less than 10 arcsec excluding the two exceptional sections.

[4] Reflection X-Ray Topography

Using the high-resolution X-ray diffractometer described above, a reflection X-ray topographic image of the M-plane GaN substrate used in the lattice spacing measurement of 4.1.2. [1]above (the M-plane GaN substrate fabricated in 4.1.1. [4] above) was acquired.

For the X-ray topography, a long line-focus tube with a Cu target was used in a line focus mode, and an incident optical system including a divergence slit, a 50 μm mask, and a mirror for increasing beam parallelism was used. In a light-receiving system, a semiconductor two-dimensional detector with an element size of 55 μm×55 μm and a detector size of 14 mm×14 mm was used.

Figure 18:
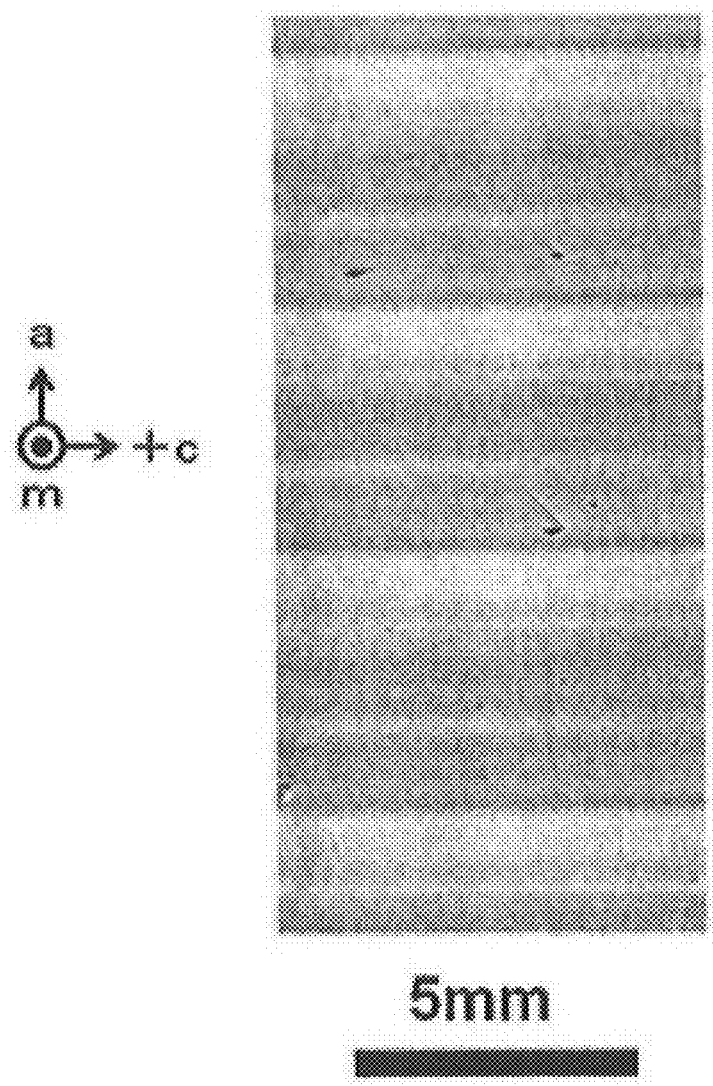
FIG. 18 shows a reflection X-ray topographic image of an M-plane GaN substrate obtained using (203) diffraction.

FIG. 18 shows a reflection X-ray topographic image obtained using (203) diffraction of a portion (a portion not including a crystal grown above a boundary between adjacent tertiary substrates) of the M-plane GaN substrate.

A striped pattern in a horizontal direction (c-axis direction) is seen in the image shown in FIG. 18. This striped pattern does not represent a distortion of the crystal. Instead, since there is periodicity in the a-axis direction, it is understood that the striped pattern represents an intensity variation of diffraction rays appeared due to an intensity variation in incident X-rays.

A noteworthy point is that, across a wide range of approximately 20 mm in an a-axis direction and 6 mm or more in a c-axis direction, the density of the striped pattern is uniform or, in other words, the intensity variation of diffraction rays reflects only the intensity variation of the incident X-rays. This means that a crystal lattice structure of the GaN crystal constituting the substrate is uniform not only in a c-axis direction but also in an a-axis direction. Based on the X-ray topograph, it was presumed that the measurements of lattice spacing and rocking curves described above will produce approximately the same result even when carried out at different positions.

In order to substantiate the presumption, with respect to an M-plane GaN substrate separately fabricated by the same method as Experiment 1, the present inventors measured an a-axis length on the principal surface on two parallel straight lines. The two straight lines were respectively parallel to the c-axis and spacing (a distance in an a-axis direction) between the two straight lines was 5 mm. The measurement was performed every 250 μm on each straight line. As a result, a low distortion section with an a-axis length variation of less than $5 \times 10^{-5}$ Å was observed over 10 to 11 mm on both straight lines.

4.2. Experiment 2

An M-plane GaN substrate was fabricated by the same procedure as Experiment 1 above with the exception of changing the carrier gas used when growing a GaN crystal by an HVPE method on a seed constituted by tertiary substrates.

More specifically, compared to all of the carrier gas being constituted by nitrogen gas when growing a GaN crystal by the HVPE method in 4.1.1. [4] above, in Experiment 2, 44% of a volumetric flow rate of the carrier gas was constituted by hydrogen gas and the remainder by nitrogen gas.

Figure 19:
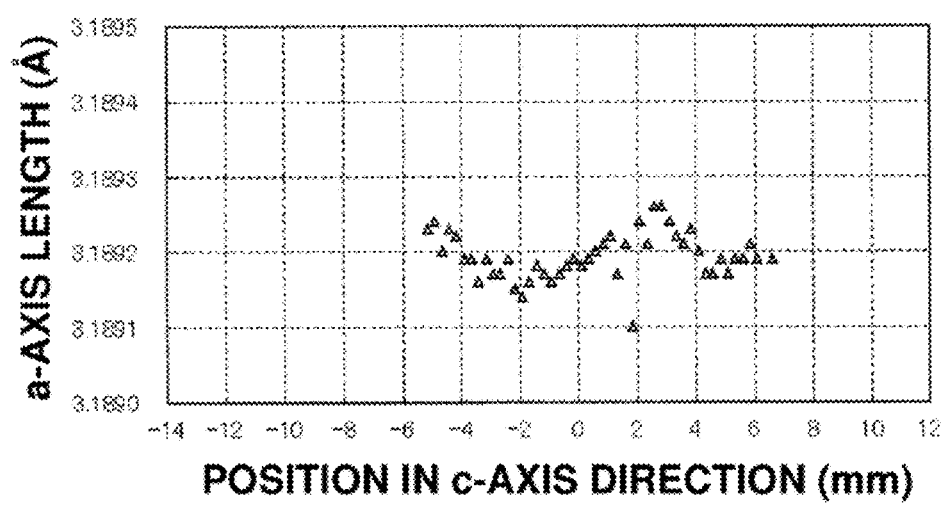
FIG. 19 is a graph showing a result of measurements of an a-axis length on a principal surface of an M-plane GaN substrate taken every 250 μm on a straight line parallel to a c-axis.
Figure 20:
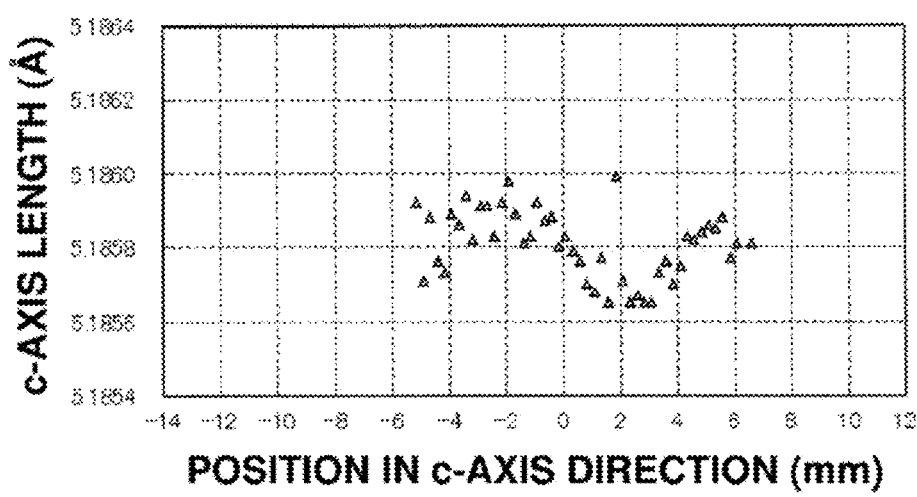
FIG. 20 is a graph showing a result of measurements of a c-axis length on a principal surface of an M-plane GaN substrate taken every 250 μm on a straight line parallel to a c-axis.

Results of measurements of an a-axis length and a c-axis length taken every 250 μm along a c-axis direction using the high-resolution X-ray diffractometer described above with respect to the fabricated M-plane GaN substrate are shown in FIGS. 19 and 20.

Figure 21:
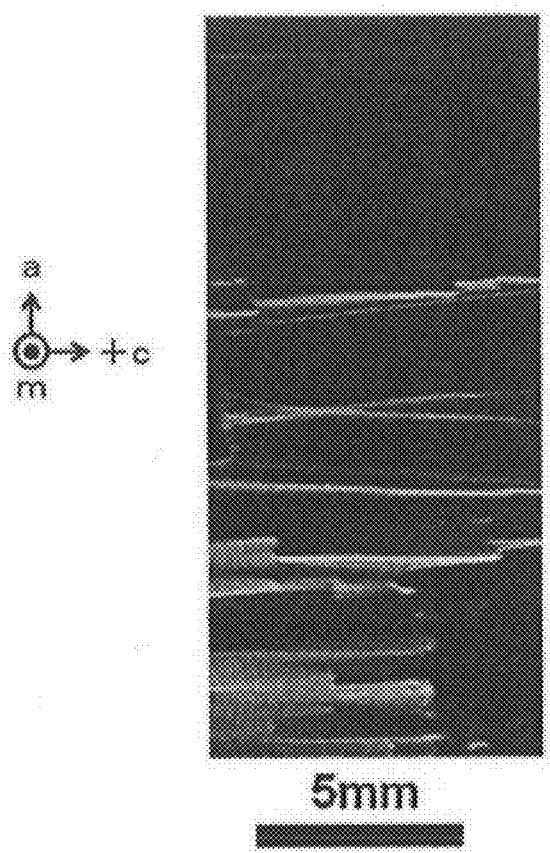
FIG. 21 shows a reflection X-ray topographic image of an M-plane GaN substrate obtained using (203) diffraction.

In addition, FIG. 21 shows a reflection X-ray topographic image obtained using (203) diffraction of a portion (a portion not including a crystal grown above a boundary between adjacent tertiary substrates) of a GaN substrate of a comparative example fabricated in Experiment 2.

It is understood from FIGS. 19 and 20 that, despite grown using seeds of similar quality, the M-plane GaN substrate according to Experiment 2 has larger variations in the a-axis length and the c-axis length and greater disturbance of crystal as compared to the M-plane GaN substrate according to Experiment 1 described previously.

A reflection X-ray topographic image shown in FIG. 21 exhibits extremely sharp contrast between light and dark portions and has extremely low uniformity of diffraction intensity. This indicates that the crystal is significantly distorted.

4.3. Experiment 3

[1] Experiment 3-1

A self-standing M-plane GaN substrate was fabricated in a similar manner to Experiment 1 described earlier. However, in Experiment 3-1, the size in a c-axis direction of the secondary GaN crystal fabricated by the first ammonothermal growth was enlarged and, accordingly, sizes of the secondary substrate and the tertiary substrate in a c-axis direction were enlarged.

Figure 22:
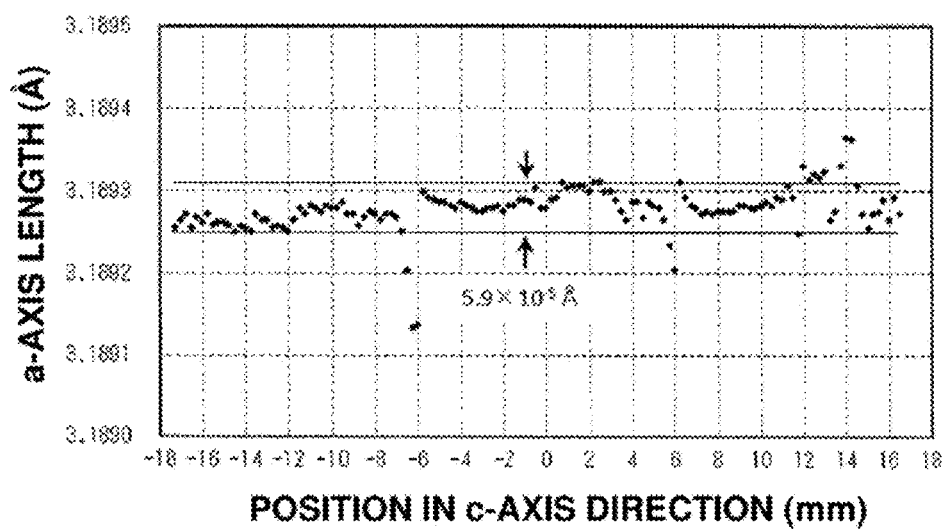
FIG. 22 is a graph showing a result of measurements of an a-axis length on a principal surface of an M-plane GaN substrate taken every 250 μm on a straight line parallel to a c-axis.
Figure 23:
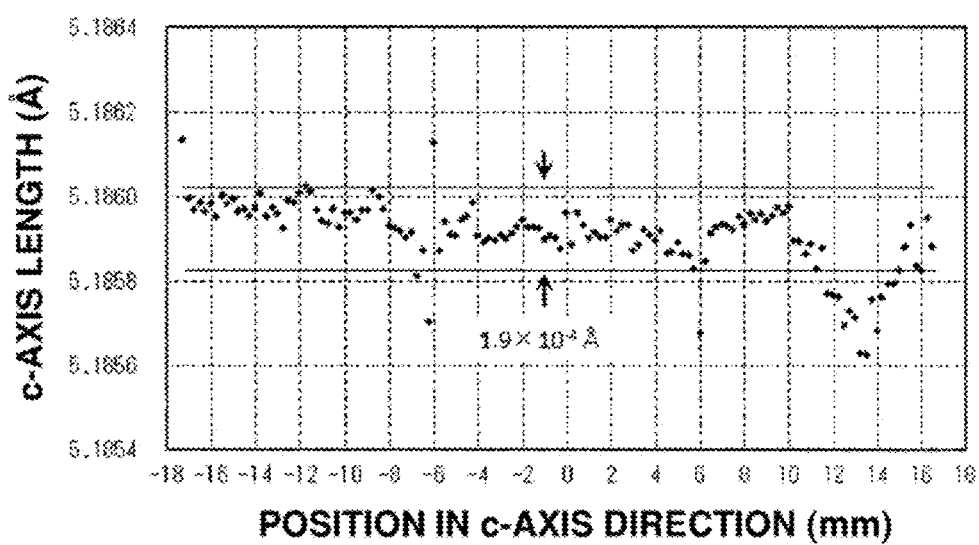
FIG. 23 is a graph showing a result of measurements of a c-axis length on a principal surface of an M-plane GaN substrate taken every 250 μm on a straight line parallel to a c-axis.

Results of measurements of an a-axis length and a c-axis length taken every 250 μm along a c-axis direction using the high-resolution X-ray diffractometer described above with respect to the obtained M-plane self-standing GaN substrate are shown in FIGS. 22 and 23.

From FIGS. 22 and 23, it is understood that the M-plane GaN substrate according to Experiment 3-1 has a large crystal disturbance at an end portion whose c-axis direction position exceeds 11 mm. Upon use, this portion is favorably removed.

Other than the end portion whose c-axis direction position exceeds 11 mm, variation widths of the a-axis length and the c-axis length were respectively $5.9 \times 10^{-5}$ Å and $1.9 \times 10^{-4}$ Å excluding two exceptional sections.

The exceptional sections were a section with a c-axis direction position of −6.75 mm to −5.75 mm and a section with a c-axis direction position of 5.5 mm to 6.25 mm. These sections corresponded to portions constituted by GaN crystals having grown above boundaries between adjacent tertiary substrates and exhibited large local variations in the a-axis length and the c-axis length. Lengths of both exceptional sections were less than 1.5 mm.

[2] Experiment 3-2

A self-standing M-plane GaN substrate was fabricated in a similar manner to Experiment 1 described previously. An external view photograph of the self-standing GaN substrate is shown in FIG. 24A.

Although the substrate is shown to be cracked in the external view photograph, this was due to inappropriate handling. The substrate had a thickness of 240 μm and did not crack when handled appropriately.

Figure 24A:
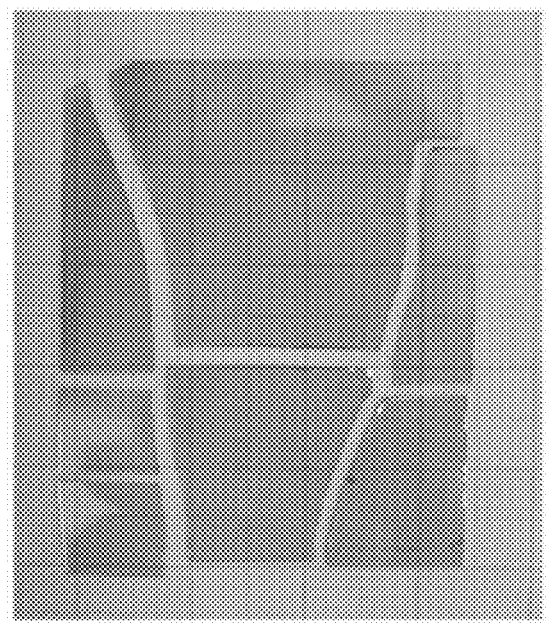
FIG. 24A is an external view photograph of an M-plane GaN substrate.
Figure 24B:
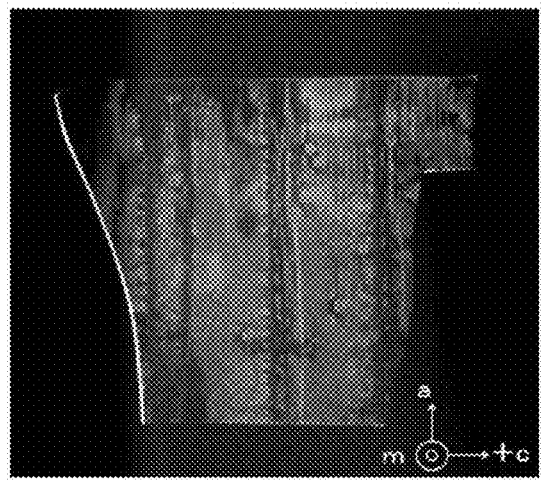
FIG. 24B is a transmission X-ray topographic image of a part of the M-plane GaN substrate obtained using (002) diffraction.

A transmission X-ray topographic image was acquired using one of the pieces of the self-standing M-plane GaN substrate shown in FIG. 24A as a sample. The X-RAY Topographic Imaging System XRT-300 by Rigaku Corporation was used for X-ray topography. MoKα was used as an X-ray source and an imaging plate with a pixel size of 50 μm was used as a detector. As result, a transmission X-ray topograph shown in FIG. 24B was obtained using (002) diffraction.

Due to the fact that a transmission topographic image was obtained under a condition of μt=7 where transmission of X-rays is difficult to occur without contribution of anomalous transmission, it was found that not only the surface but the entire self-standing M-plane GaN substrate consisted of GaN crystal with exceptionally high quality.

4.4. Experiment 4

A self-standing M-plane GaN substrate was fabricated in a similar manner to Experiment 1 above with the exception of changing the carrier gas used when growing a GaN crystal by an HVPE method on a seed constituted by the tertiary substrate.

Specifically, in Experiment 4, when growing a GaN crystal by the HVPE method, 92% of a volumetric flow rate of the carrier gas was constituted by nitrogen gas and 8% by hydrogen gas.

Figure 25:
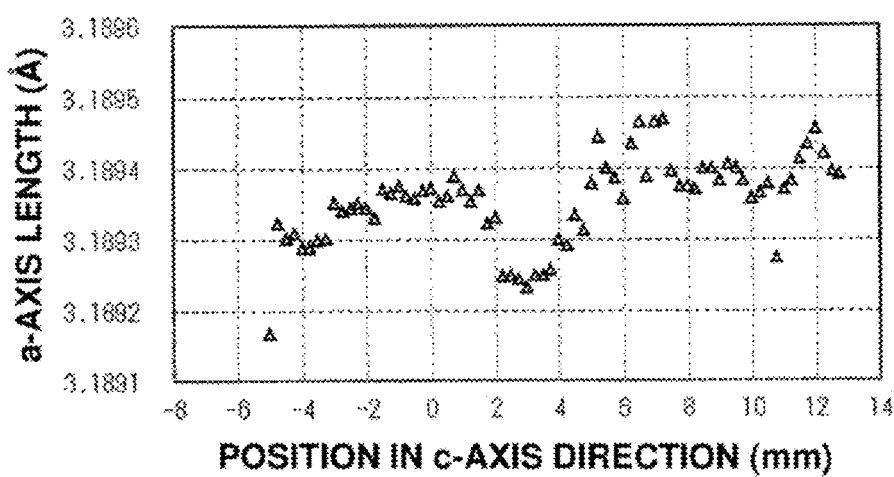
FIG. 25 is a graph showing a result of measurements of an a-axis length on a principal surface of an M-plane GaN substrate taken every 250 μm on a straight line parallel to a c-axis.
Figure 26:
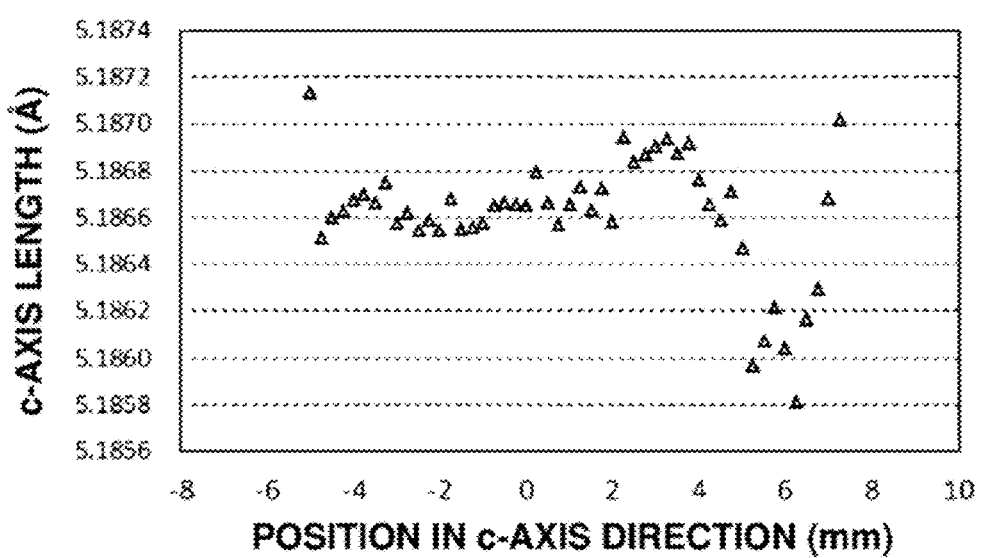
FIG. 26 is a graph showing a result of measurements of a c-axis length on a principal surface of an M-plane GaN substrate taken every 250 μm on a straight line parallel to a c-axis.

Results of measurements of an a-axis length and a c-axis length taken every 250 μm along a c-axis direction using the high-resolution X-ray diffractometer described above with respect to the obtained M-plane GaN substrate are shown in FIGS. 25 and 26.

FIGS. 25 and 26 show that variations in the a-axis length and the c-axis length are relatively large on a straight line parallel to the c-axis on the principal surface of the M-plane GaN substrate of Experiment 4.

4.5. Experiment 5

[1] Experiment 5-1

A self-standing M-plane GaN substrate with a length of 26 mm, a width of 17 mm, and a thickness of 470 μm and having a rectangular principal surface with a long side parallel to an a-axis and a short side parallel to a c-axis was fabricated by a method substantially the same as that used for the tertiary substrate fabricated in 4.1.1. [3] above.

The M-plane GaN substrate was annealed by placing in an atmosphere containing nitrogen gas and ammonia at a volumetric ratio of 9:1 at 1000° C. for 50 hours.

After the annealing, oxides adhered to the surface were removed and, furthermore, both principal surfaces were subjected to lapping and CMP. The size of the substrate after these processings was 26 mm in an a-axis direction, 16 mm in a c-axis direction, and 350 μm in an m-axis direction.

Figure 27A:
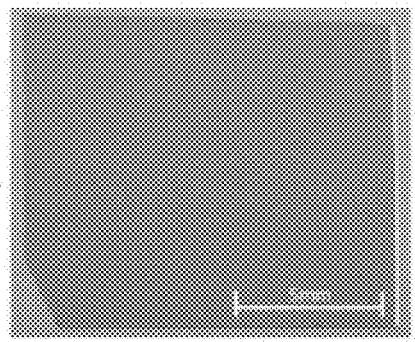
FIG. 27A is an external view photograph of a test piece cut out from an M-plane GaN substrate.

Next, the M-plane GaN substrate was further cut to obtain a principal surface size of 12 mm×12 mm to fabricate a test piece for X-ray topography. FIG. 27A shows an external view photograph of the test piece.

Figure 27B:
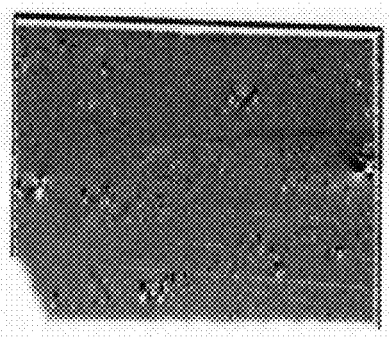
FIG. 27B is a transmission X-ray topographic image of the test piece obtained using (002) diffraction.
Figure 27C:
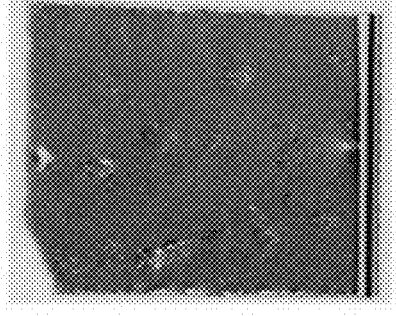
FIG. 27C is a transmission X-ray topographic image of the test piece obtained using (110) diffraction.
Figure 27D:
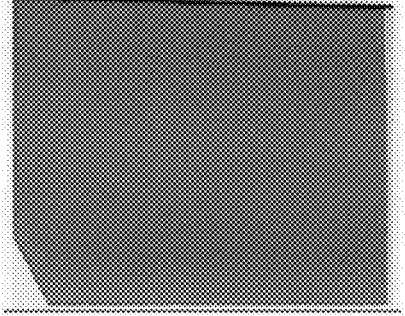
FIG. 27D is a reflection X-ray topographic image of the test piece obtained using (203) diffraction.

Results of X-ray topography of the test piece are shown in FIGS. 27B-27D.

An X-ray topography apparatus (product name: XRT micron) by Rigaku Corporation was used for X-ray topography. MoKα was used as an X-ray source and an X-ray CCD camera with a pixel size of 5.4 μm was used as a detector.

FIG. 27B is a transmission X-ray topograph of the test piece obtained using (002) diffraction. In addition, FIG. 27C is a transmission X-ray topograph of the test piece obtained using (110) diffraction. Since μt=10.2, it is understood that these images were formed by anomalous transmission.

FIG. 27D is a reflection X-ray topograph of the same test piece obtained using (203) diffraction. As shown in the diagram, the reflection topograph exhibited extremely high uniformity over the entire 12 mm×12 mm region. Accordingly, it is conceivable that the light and shade observed in the anomalous transmission X-ray topograph reflect distortion or defects existing inside the substrate.

Experiment 5-2

A 350 μm-thick self-standing M-plane GaN substrate with a longitudinal direction parallel to an a-axis was fabricated by a method substantially the same as that used for the tertiary substrate fabricated in 4.1.1. [3] above. Annealing was not performed in Experiment 5-2.

Figure 28A:
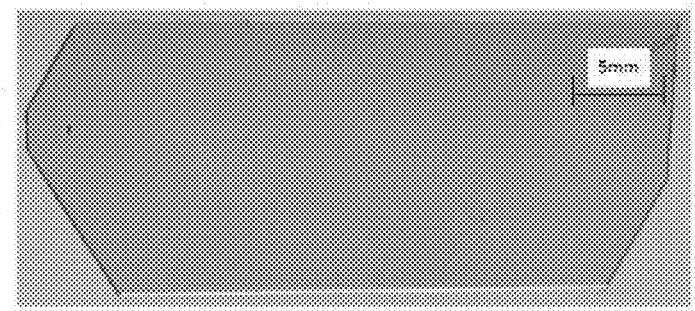
FIG. 28A is an external view photograph of an M-plane GaN substrate.

FIG. 28A shows an external view photograph of the fabricated substrate. The size of the principal surface was 35 mm (total length) in an a-axis direction and 15 mm in a c-axis direction.

Figure 28B:
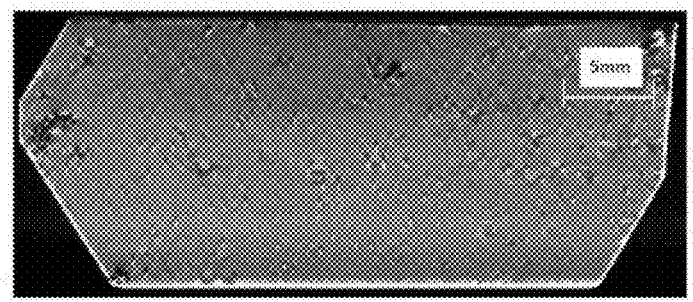
FIG. 28B is a transmission X-ray topographic image of the M-plane GaN substrate obtained using (002) diffraction.

FIG. 28B is a transmission X-ray topograph of the self-standing M-plane GaN substrate obtained using (002) diffraction. The X-RAY Topographic Imaging System XRT-300 by Rigaku Corporation was used for the measurement. MoKα was used as an X-ray source and an imaging plate with a pixel size of 50 μm was used as a detector.

Since μt=10.2, it is understood that this transmission X-ray topographic image was formed by anomalous transmission.

[3] Experiment 5-3

Figure 29:
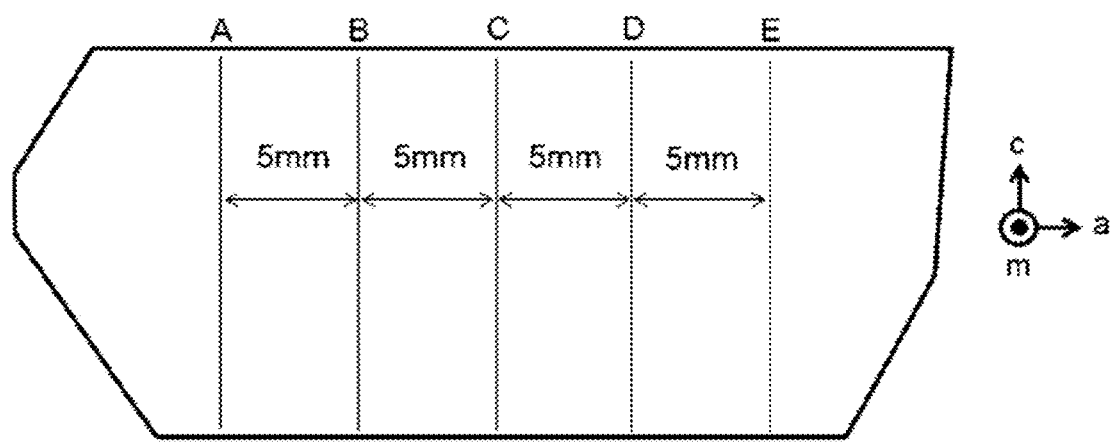
FIG. 29 is a plan view showing five straight lines arranged at 5 mm intervals in an a-axis direction on a principal surface of an M-plane GaN substrate.
Figure 30:
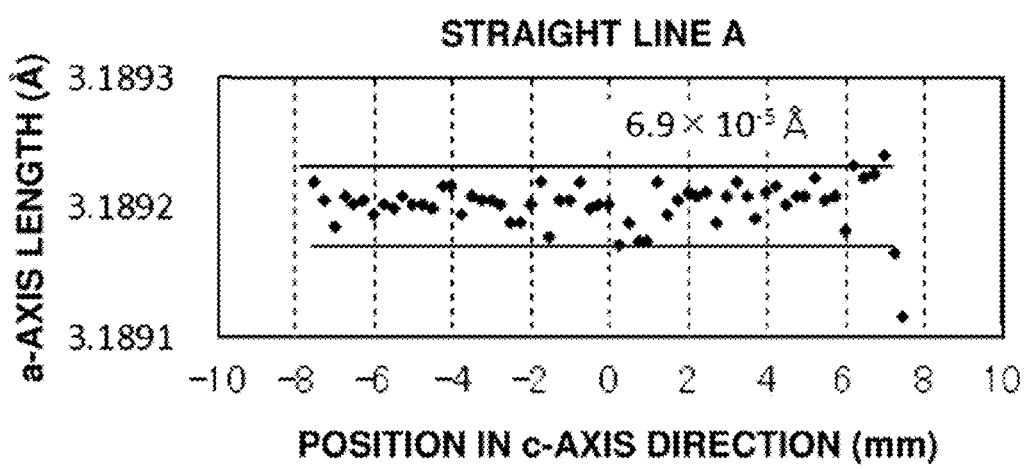
FIG. 30 is a graph showing a result of measurements of an a-axis length on a principal surface of an M-plane GaN substrate taken every 250 μm on a straight line parallel to a c-axis.
Figure 31:
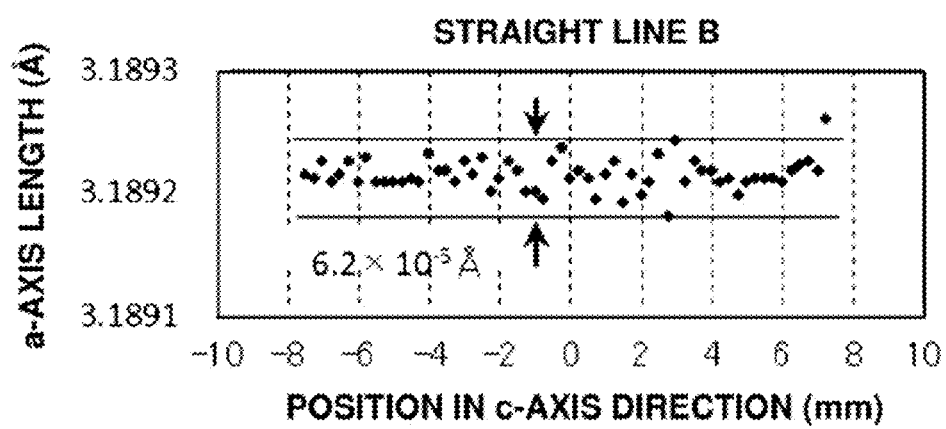
FIG. 31 is a graph showing a result of measurements of an a-axis length on a principal surface of an M-plane GaN substrate taken every 250 μm on a straight line parallel to a c-axis.
Figure 32:
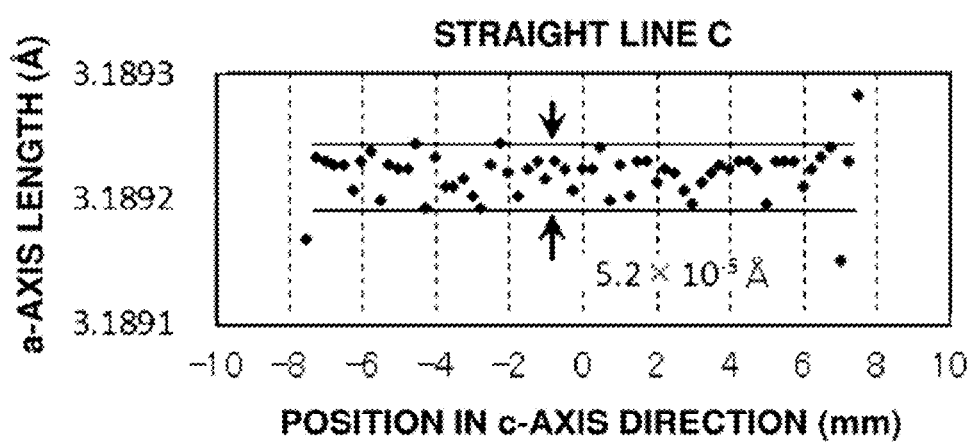
FIG. 32 is a graph showing a result of measurements of an a-axis length on a principal surface of an M-plane GaN substrate taken every 250 μm on a straight line parallel to a c-axis.
Figure 33:
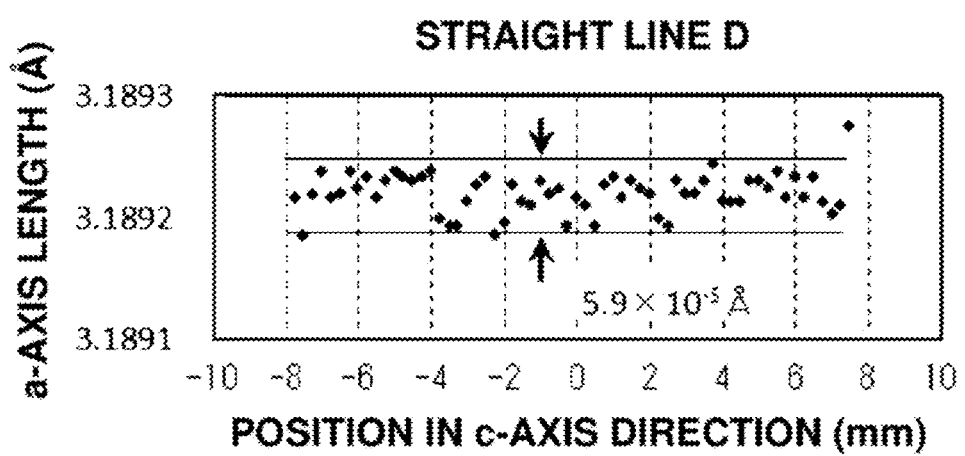
FIG. 33 is a graph showing a result of measurements of an a-axis length on a principal surface of an M-plane GaN substrate taken every 250 μm on a straight line parallel to a c-axis.
Figure 34:
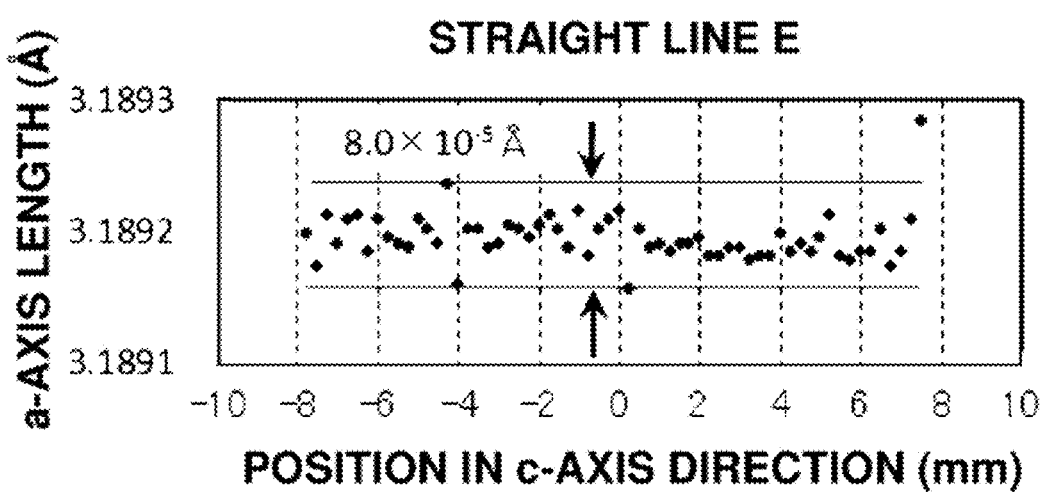
FIG. 34 is a graph showing a result of measurements of an a-axis length on a principal surface of an M-plane GaN substrate taken every 250 μm on a straight line parallel to a c-axis.

The a-axis length on a principal surface of the self-standing M-plane GaN substrate of Experiment 5-2 was measured every 250 μm on straight lines parallel to the c-axis using the high-resolution X-ray diffractometer described previously. As schematically shown in FIG. 29, measurements were respectively performed on five straight lines A to E arranged at 5 mm intervals in an a-axis direction.

Measurement results on the straight lines A to E are shown in FIGS. 30 to 34 in an order from A to E. On all of the straight lines, a variation width of the a-axis length was $8.0 \times 10^{-5}$ Å or less with the exception of end portions.

Figure 35:
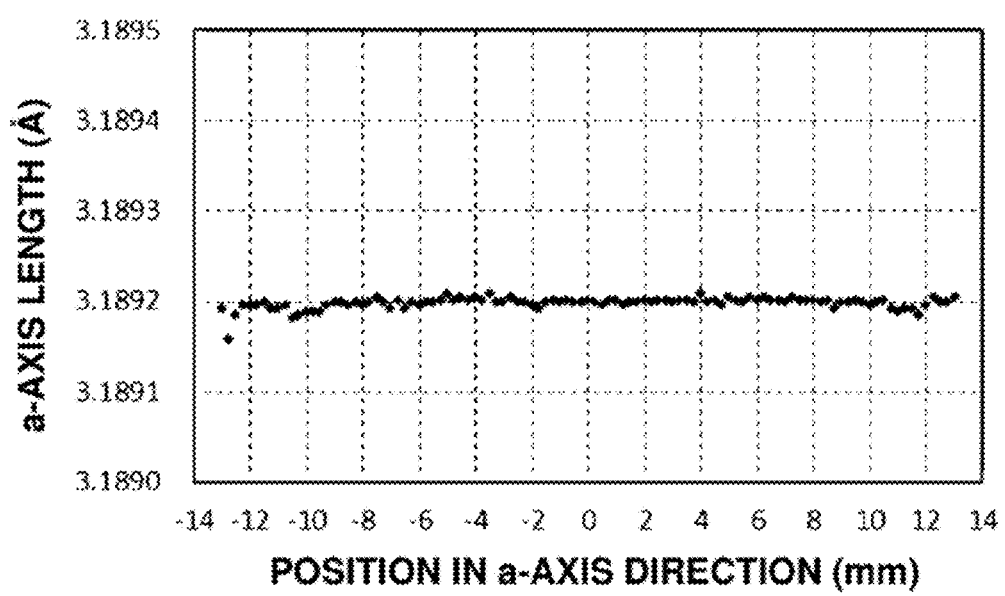
FIG. 35 is a graph showing a result of measurements of an a-axis length on a principal surface of an M-plane GaN substrate taken every 250 μm on a straight line parallel to an a-axis.

Furthermore, the a-axis length on the principal surface of the self-standing M-plane GaN substrate of Experiment 5-2 was measured every 250 μm on a straight line parallel to the a-axis using the high-resolution X-ray diffractometer described previously. Results thereof are shown in FIG. 35.

[4] Experiment 5-4

A self-standing M-plane GaN substrate having a rectangular principal surface was fabricated using, as a material, a GaN crystal fabricated by a method substantially the same as that used for the tertiary GaN crystal fabricated in 4.1.1. [3] above. The principal surface had a size of 26 mm in an a-axis direction and 15 mm in a c-axis direction.

Figure 36:
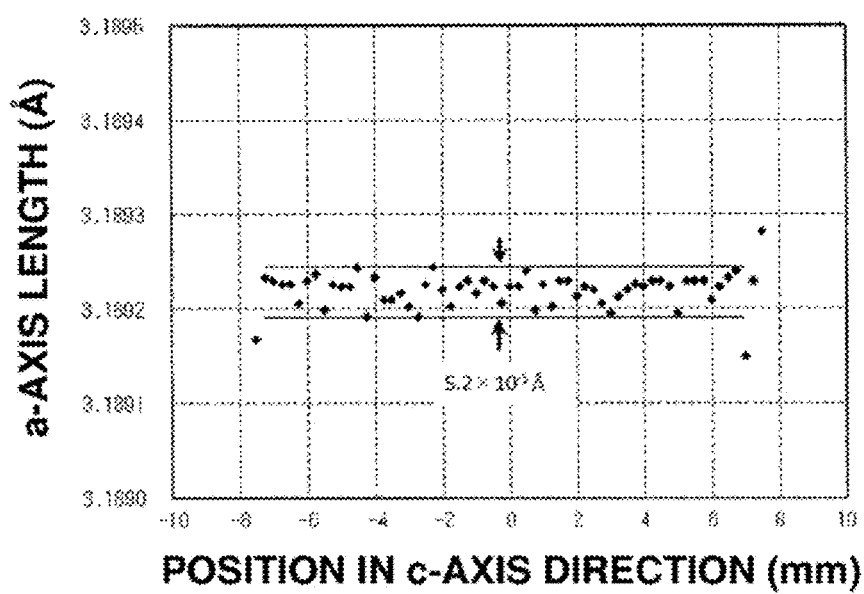
FIG. 36 is a graph showing a result of measurements of an a-axis length on a principal surface of an M-plane GaN substrate taken every 250 μm on a straight line parallel to a c-axis.
Figure 37:
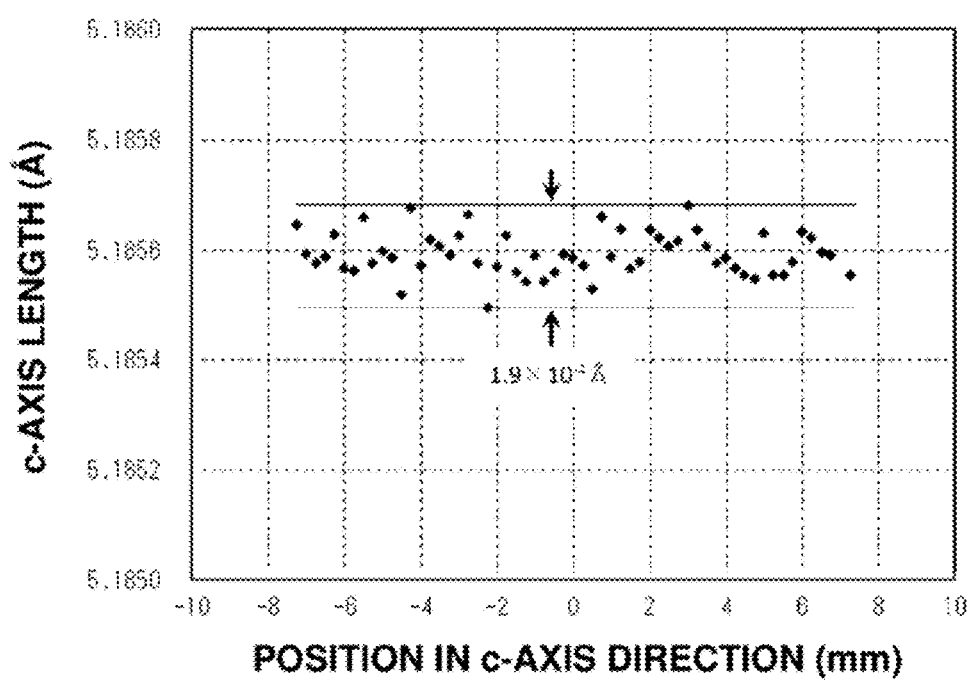
FIG. 37 is a graph showing a result of measurements of a c-axis length on a principal surface of an M-plane GaN substrate taken every 250 μm on a straight line parallel to a c-axis.

On the principal surface of the M-plane GaN substrate, an a-axis length and a c-axis length were measured every 250 μm along a c-axis direction using the high-resolution X-ray diffractometer described previously. As a result, as shown in FIG. 36, the a-axis length had a variation width of $5.2 \times 10^{-5}$ Å with the exception of end portions. The c-axis length had a variation width of $1.9 \times 10^{-4}$ Å as shown in FIG. 37.

[5] Experiment 5-5

A self-standing M-plane GaN substrate having a rectangular principal surface was fabricated by a method substantially the same as that used for the tertiary substrate fabricated in 4.1.1. [3] above. The principal surface had a size of 16 mm in an a-axis direction and 10 mm in a c-axis direction. A region excluding portions at a distance of 2 mm or less from a substrate end surface, of the principal surface, was assumed to be an effective region, and the total number of dislocations existing in the effective region was measured. Then, the total number of dislocations was divided by an area of the effective region to obtain a dislocation density of $1.3 \times 10^4$ cm$^{-2}$. In addition, a stacking fault density obtained by dividing a total length of stacking faults existing in the effective region by the area of the effective region was 0.05 cm$^{-1}$.

4.6. Experiment 6

A GaN crystal fabricated by a method substantially the same as that used for the tertiary GaN crystal fabricated in 4.1.1. [3] above was sliced parallel to (30-31) to fabricate a self-standing GaN substrate with both principal surfaces parallel to (30-31).

A GaN crystal was further grown by an ammonothermal method using the self-standing GaN substrate as a seed.

Using the GaN crystal obtained by this third ammonothermal growth as a material, a self-standing GaN (30-3-1) substrate with a rectangular principal surface was fabricated. The principal surface had a size of 21 to 29 mm in an a-axis direction and a size of 10 to 18 mm in a direction perpendicular to the a-axis.

With respect to a plurality of the fabricated GaN (30-3-1) substrates, a region excluding portions at a distance of 2 mm or less from a substrate end surface, of the principal surface, was assumed to be an effective region and the total number of dislocations existing in the effective region was measured. Then, the total number of dislocations was divided by an area of the effective region to obtain a dislocation density. As a result, the dislocation density of the substrate with a lowest dislocation density was $9.0 \times 10^2$ cm$^{-2}$ and the dislocation density of the substrate with a highest dislocation density was $6.3 \times 10^4$ cm$^{-2}$. In addition, a GaN thin film was grown on the principal surface by an MOCVD method and a surface of the thin film was observed by an optical microscope to investigate lengths of stacking faults existing in the effective region. Subsequently, the total value of the lengths of the stacking faults was divided by an area of the effective region to obtain a stacking fault density. As a result, the stacking fault density of the substrate with a lowest stacking fault density was 0 cm$^{-1}$ and the stacking fault density of the substrate with a highest stacking fault density was 1 cm$^{-1}$.

Figure 38:
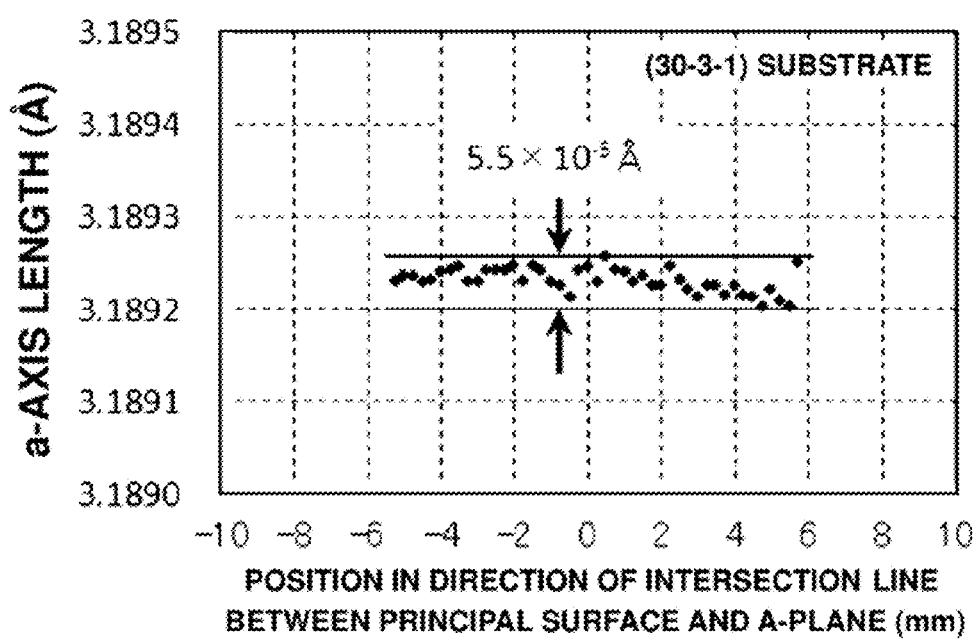
FIG. 38 is a graph showing a result of measurements of an a-axis length on a principal surface of a GaN (30-3-1) substrate taken every 250 μm on an intersection line between the principal surface and an A-plane.
Figure 39:
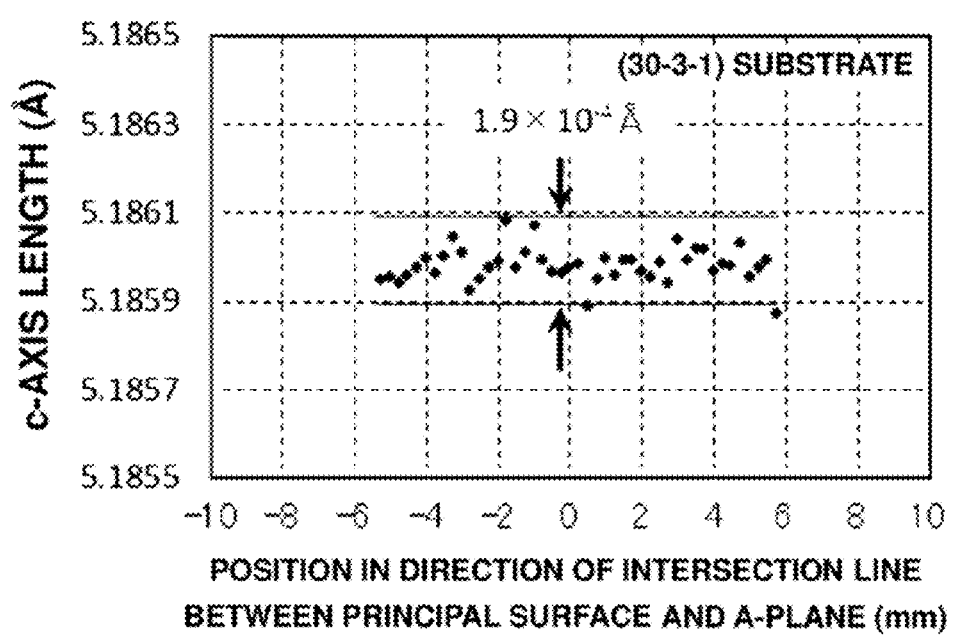
FIG. 39 is a graph showing a result of measurements of a c-axis length on a principal surface of a GaN (30-3-1) substrate taken every 250 μm on an intersection line between the principal surface and an A-plane.

An a-axis length and a c-axis length on the principal surface of the self-standing GaN (30-3-1) substrate were measured every 250 μm on an intersection line between the principal surface and an A-plane using the high-resolution X-ray diffractometer described previously. Results are respectively shown in FIGS. 38 and 39. The a-axis length had a variation width of $5.5 \times 10^{-5}$ Å. The c-axis length had a variation width of $1.9 \times 10^4$ Å with the exception of end portions.

4.7. Experiment 7

A GaN crystal fabricated by a method substantially the same as that used for the tertiary GaN crystal fabricated in 4.1.1. [3] above was sliced parallel to (20-21) to fabricate a self-standing GaN substrate with both principal surfaces parallel to (20-21).

A GaN crystal was further grown by an ammonothermal method using the self-standing GaN substrate as a seed.

Using the GaN crystal obtained by this third ammonothermal growth as a material, a self-standing GaN (20-21) substrate with a rectangular principal surface was fabricated. The principal surface had a size of 23 to 26 mm in an a-axis direction and a size of 9 to 12 mm in a direction perpendicular to the a-axis.

With respect to a plurality of the fabricated GaN (20-21) substrates, a region excluding portions at a distance of 2 mm or less from a substrate end surface, of the principal surface, was assumed to be an effective region and the total number of dislocations existing in the effective region was measured. Then, the total number of dislocations was divided by an area of the effective region to obtain a dislocation density. As a result, the dislocation density of the substrate with a lowest dislocation density was $4.0 \times 10^4$ cm$^{-2}$ and the dislocation density of the substrate with a highest dislocation density was $1.6 \times 10^5$ cm$^{-2}$. In addition, a GaN thin film was grown on the principal surface by an MOCVD method and a surface of the thin film was observed by an optical microscope to investigate lengths of stacking faults existing in the effective region. Subsequently, the total value of the lengths of the stacking faults was divided by an area of the effective region to obtain a stacking fault density. As a result, the stacking fault density of the substrate with a lowest stacking fault density was 0 cm$^{-1}$ and the stacking fault density of the substrate with a highest stacking fault density was 1 cm$^{-1}$.

An a-axis length and a c-axis length on the principal surface of the self-standing (20-21) GaN substrate were measured every 250 μm on an intersection line between the principal surface and an A-plane using the high-resolution X-ray diffractometer described previously. Results are respectively shown in FIGS. 40 and 41.

Figure 40:
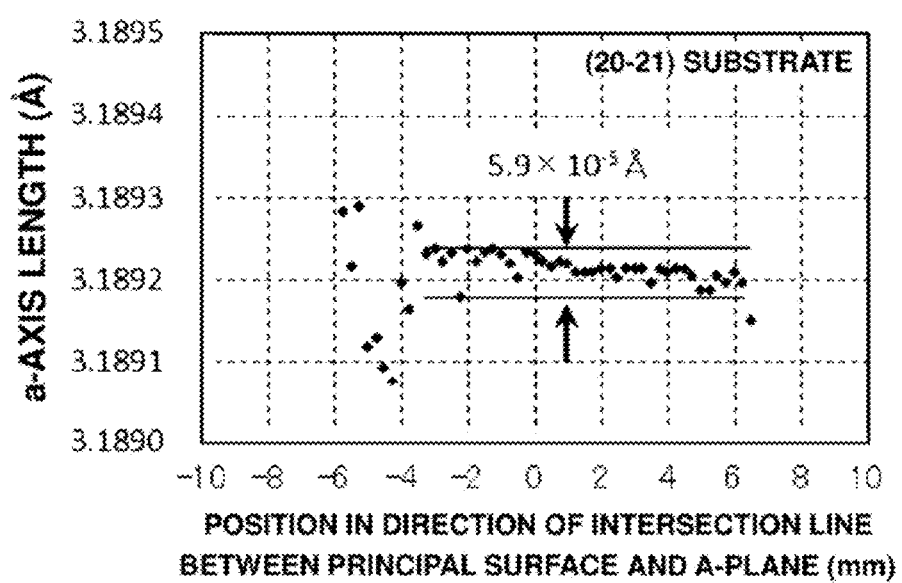
FIG. 40 is a graph showing a result of measurements of an a-axis length on a principal surface of a GaN (20-21) substrate taken every 250 μm on an intersection line between the principal surface and an A-plane.
Figure 41:
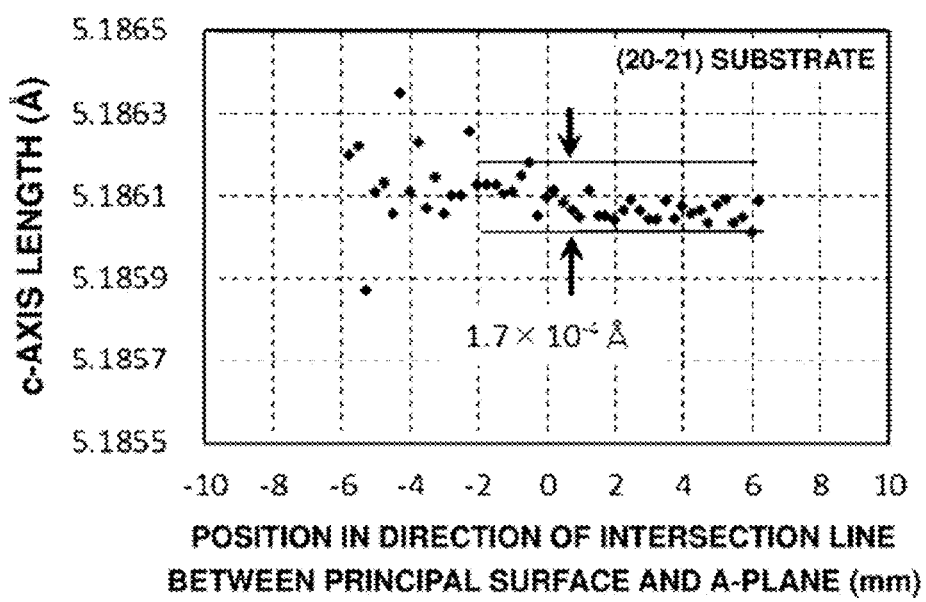
FIG. 41 is a graph showing a result of measurements of a c-axis length on a principal surface of a GaN (20-21) substrate taken every 250 μm on an intersection line between the principal surface and an A-plane.

From FIGS. 40 and 41, it is understood that the (20-21) GaN substrate of Experiment 7 has a large crystal disturbance at an end portion whose position in a c-axis direction is less than −2 mm.

Other than this portion, the a-axis length had a variation width of $5.9 \times 10^{-5}$ Å and the c-axis length had a variation width of $1.7 \times 10^{-4}$ Å.

This suggests that, in order to grow a GaN crystal with small crystal disturbance by an ammonothermal method, a seed substrate with a small angle between the normal of the principal surface and an m-axis may be advantageously used.

While the present invention has been described in its embodiments, such description is for illustrative purposes only and is not intended to limit the present invention.

APPENDIX

Inventions derived from the inventions described above will now be appended.

(1e) A GaN single crystal product, wherein an anomalous transmission image is obtained by transmission X-ray topography. Examples include a wafer product and an X-ray optical element product.

(2e) The GaN single crystal product according to (1e) above, wherein the GaN single crystal product is a wafer product.

(3e) The GaN single crystal product according to (1e) or (2e) above, wherein the GaN single crystal product comprises a GaN crystal grown by an HVPE method.

(4e) The GaN single crystal product according to any one of (1e) to (3e) above, wherein an absorption coefficient at a wavelength of 450 nm is 2 cm$^{-1}$ or less.

(5e) The GaN single crystal product according to any one of (1e) to (4e) above, wherein the GaN single crystal product contains fluorine.
(6e) The GaN single crystal product according to any one of (1e) to (5e) above, wherein alkali metal concentration is lower than $1\times10^{15}$ cm$^{-3}$.
(7e) The GaN single crystal product according to any one of (1e) to (6e) above, wherein the GaN single crystal product contains a stacking fault.
(8e) A crystal comprising GaN, processing of which enables fabrication of the GaN single crystal product according to any one of (1e) to (7e) above.
(9e) A method of producing the GaN single crystal product according to any one of (1e) to (7e) above, the method having an inspection step including transmission X-ray topography using anomalous transmission as a test item, wherein a product in which an unacceptable defect is found in the inspection step is deemed a defective product.
(10e) A manufacturing method of a GaN single crystal, including preparing the GaN single crystal product according to (2e) above and epitaxially growing GaN on the GaN single crystal product.
(11e) A manufacturing method of a GaN single crystal, including growing a first GaN crystal using the GaN single crystal product according to (2e) above as a seed, and subsequently growing a second GaN crystal using a part of or all of the first GaN crystal as a seed.
(12e) The manufacturing method according to (10e) or (11e), wherein the manufacturing method is a manufacturing method of a bulk GaN single crystal.
(13e) A manufacturing method of a semiconductor device, including preparing the GaN single crystal product according to (2e) above and forming a device structure by epitaxially growing one or more types of nitride semiconductors on the GaN single crystal product.

CLAIM SCOPE AND INCORPORATED BY REFERENCE

While the present invention has been described with reference to specific embodiments thereof, it will be understood by those skilled in the art that various changes and modifications may be made without departing from the spirit and scope of the invention. In addition, it is to be understood that the entire contents of the specification, claims, and drawings of the basic application are incorporated by reference into the present specification.

EXPLANATION OF REFERENCE NUMERALS

1 Autoclave
4 Platinum wire
5 Baffle
6 Crystal growth zone
7 Seed crystal
8 Raw material
9 Raw material dissolving zone
10 Valve
11 Vacuum pump
12 Ammonia cylinder
13 Nitrogen cylinder
14 Mass flow meter
20 Growth vessel
100 Growth furnace
101 to 103 Inlet pipe
104 Reservoir
105 Heater
106 Susceptor
107 Exhaust pipe
1001 Primary substrate
1002 Growth mask
1003 Secondary GaN crystal

The invention claimed is:
1. A self-standing GaN substrate with an angle between the normal of the principal surface and an m-axis of 0 degrees or more and 20 degrees or less, having a defect increasing zone extending in a direction intersecting an A-plane on the principal surface, wherein:
the size of the projected image in a c-axis direction when the principal surface is vertically projected on an M-plane is 10 mm or more;
when a region excluding a portion at a distance of 2 mm or less from a substrate end surface, of the principal surface, is assumed to be an effective region, an X-ray rocking curve full-width at half-maximum of a (300) plane on a longest intersection line formable by the principal surface and the A-plane in the effective region is less than 100 arcsec in a portion excluding the defect increasing zone; and
a variation width of the X-ray rocking curve full-width at half-maximum of a (300) plane on the longest intersection line is less than 20 arcsee in a portion excluding the defect increasing zone.
2. The self-standing GaN substrate of claim 1, wherein a spot where the X-ray rocking curve full-width at half-maximum of the (300) plane exhibits a prominently high value is comprised in a portion where the longest intersection line traverses the defect increasing zone.
3. A self-standing GaN substrate with an angle between the normal of the principal surface and an m-axis of 0 degrees or more and 20 degrees or less,
wherein:
the size of the projected image in a c-axis direction when the principal surface is vertically projected on an M-plane is 10 mm or more;
when a region excluding a portion at a distance of 2 mm or less from a substrate end surface, of the principal surface, is assumed to be an effective region, an X-ray rocking curve full-width at half-maximum of a (300) plane on a longest intersection line formable by the principal surface and an A-plane in the effective region is less than 100 aresec; and
a variation width of the X-ray rocking curve full-width at half-maximum of a (300) plane on the longest intersection line is less than 20 arcsec.
4. The self-standing GaN substrate of claim 1, wherein the size of the projected image in an a-axis direction when the principal surface is vertically projected on an M-plane is 30 mm or more.
5. The self-standing GaN substrate of claim 4, wherein the size of the projected image in an a-axis direction is 40 mm or more.
6. The self-standing GaN substrate of claim 1, wherein the self-standing GaN substrate comprises a GaN crystal grown by an HVPE method.
7. The self-standing GaN substrate of claim 1, wherein an absorption coefficient at a wavelength of 450 nm is 2 cm 1 or less.
8. The self-standing GaN substrate of claim 1, wherein the self-standing GaN substrate contains fluorine.
9. The self-standing GaN substrate of claim 1, wherein alkali metal concentration is lower than $1\times10^{15}$ cm$^{-3}$.
10. The self-standing GaN substrate of claim 1, wherein the self-standing GaN substrate contains a stacking fault.

11. A crystal comprising GaN, processing of which enables fabrication of the self-standing GaN substrate of claim 1.

12. A manufacturing method of a GaN single crystal, the manufacturing method comprising:
    preparing the self-standing GaN substrate of claim 1; and
    epitaxially growing GaN on the self-standing GaN substrate.

13. A manufacturing method of a GaN single crystal, the manufacturing method comprising:
    growing a first GaN crystal using the self-standing GaN substrate of claim 1 as a seed; and
    subsequently growing a second GaN crystal using a part of or all of the first GaN crystal as a seed.

14. The manufacturing method of claim 12, wherein the manufacturing method is a manufacturing method of a bulk GaN single crystal.

15. A manufacturing method of a semiconductor device, the manufacturing method comprising:
    preparing the self-standing GaN substrate of claim 1; and
    forming a device structure by epitaxially growing one or more types of nitride semiconductors on the self-standing GaN substrate.

16. A manufacturing method of a GaN layer-bonded substrate, the manufacturing method comprising:
    implanting ions in a vicinity of the principal surface of the self-standing GaN substrate of claim 1;
    bonding the principal surface side of the self-standing GaN substrate to a hetero-composition substrate; and
    forming a GaN layer bonded to the hetero-composition substrate by separating the self-standing GaN substrate at the ion-implanted region as a boundary.

17. A GaN layer-bonded substrate with a structure in which a GaN layer separated from the self-standing GaN substrate of claim 1 is bonded to a hetero-composition substrate.

18. A manufacturing method of a GaN single crystal, the manufacturing method comprising:
    preparing the self-standing GaN substrate of claim 3; and
    epitaxially growing GaN on the self-standing GaN substrate.

19. A manufacturing method of a GaN single crystal, the manufacturing method comprising:
    growing a first GaN crystal using the self-standing GaN substrate of claim 3 as a seed; and
    subsequently growing a second GaN crystal using a part of or all of the first GaN crystal as a seed.

20. The manufacturing method of claim 18, wherein the manufacturing method is a manufacturing method of a bulk GaN single crystal.

21. A manufacturing method of a semiconductor device, the manufacturing method comprising:
    preparing the self-standing GaN substrate of claim 3; and
    forming a device structure by epitaxially growing one or more types of nitride semiconductors on the self-standing GaN substrate.

* * * * *